US006432835B1

United States Patent
Yunogami et al.

(10) Patent No.: US 6,432,835 B1
(45) Date of Patent: Aug. 13, 2002

(54) PROCESS FOR FABRICATING AN INTEGRATED CIRCUIT DEVICE HAVING A CAPACITOR WITH AN ELECTRODE FORMED AT A HIGH ASPECT RATIO

(75) Inventors: Takashi Yunogami, Niiza; Kazuo Nojiri, Higashimurayama, both of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/411,643

(22) Filed: Oct. 4, 1999

(30) Foreign Application Priority Data

Oct. 5, 1998 (JP) .......................................... 10-282581

(51) Int. Cl.[7] .................. H01L 21/461; H01L 29/8242; H01L 21/20
(52) U.S. Cl. ...................... 438/720; 438/253; 438/396; 438/722
(58) Field of Search ............................... 438/686, 720, 438/722, 689, 253, 238, 396, 398, 580, 582

(56) References Cited

U.S. PATENT DOCUMENTS

| 5,242,539 A | 9/1993 | Kumihashi et al. ......... 156/643 |
| 5,318,667 A | 6/1994 | Kumihashi et al. ......... 156/643 |
| 5,368,685 A | 11/1994 | Kumihashi et al. ......... 156/643 |
| 5,423,936 A | 6/1995 | Tomita et al. .............. 156/345 |
| 5,474,650 A | 12/1995 | Kumihashi et al. ...... 156/643.1 |
| 5,515,984 A | * 5/1996 | Yokoyama et al. ........... 216/41 |
| 5,593,540 A | 1/1997 | Tomita et al. ........... 156/643.1 |
| 5,624,583 A | * 4/1997 | Tokashiki et al. ........... 438/720 |
| 5,650,038 A | 7/1997 | Kumihashi et al. ...... 156/626.1 |
| 5,795,832 A | 8/1998 | Kumihashi et al. ......... 438/714 |
| 5,883,781 A | * 3/1999 | Yamamichi et al. ...... 361/321.4 |
| 6,008,135 A | * 12/1999 | Oh et al. .................... 438/720 |
| 6,057,081 A | * 5/2000 | Yunogami et al. .......... 430/313 |

FOREIGN PATENT DOCUMENTS

| JP | 5-267226 | 10/1993 |
| JP | 5-267259 | 10/1993 |
| JP | 7-7001 | 1/1995 |
| JP | 7-221197 | 8/1995 |
| JP | 8-107105 | 4/1996 |
| JP | 8-153707 | 6/1996 |
| JP | 9-205183 | 8/1997 |
| JP | 10-98162 | 4/1998 |

* cited by examiner

*Primary Examiner*—Wael Fahmy
*Assistant Examiner*—Brook Kebede
(74) *Attorney, Agent, or Firm*—Mattingly, Stanger & Malur, P.C.

(57) ABSTRACT

Fine etching of ruthenium or ruthenium oxide is suited for a ferroelectric and high dielectric film such as BST. Over a silicon oxide film 46 and a plug 49, a titanium nitride film 50, ruthenium film 51, ruthenium dioxide film 52 and silicon oxide film 53 are stacked successively. After patterning the silicon oxide film 53 with a resist film, the resist film is removed. In the presence of the patterned silicon oxide film 53, the ruthenium dioxide film 52 and ruthenium film 51 are etched under processing pressure of 15 mTorr, plasma source power of 500 W, RF bias power of 200 W, oxygen flow of 715 sccm, chlorine flow of 80 sccm, total flow of about 800 sccm, gas residence time of 49.3 msec, and over etching of 100%.

20 Claims, 43 Drawing Sheets

| CONDITIONS | CROSS-SECTIONAL VIEW | ETCHING CHARACTERISTICS |
|---|---|---|
| 15mT<br>TCP500W<br>RF200W<br>O2/Cl2=<br>90/10sccm<br>20%O.E. | 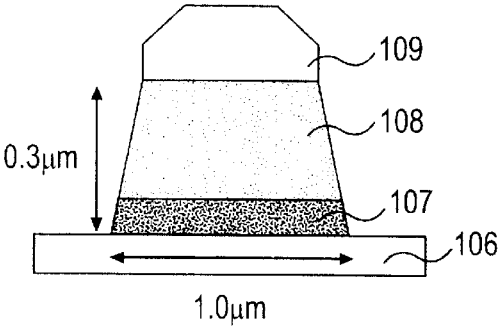<br>0.3μm, 1.0μm, 109, 108, 107, 106 | RATE: 82nm/min<br><br>SELECTION RATIO OF LAMINATED FILM TO SiO2: 14.6<br><br>ANISOTROPY: 78°<br><br>FACET: 80nm |
| 15mT<br>TCP500W<br>RF200W<br>O2/Cl2=<br>320/36sccm<br>20%O.E. | 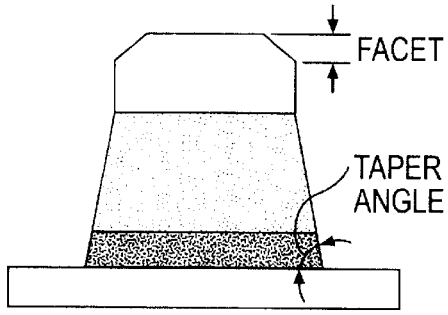<br>FACET, TAPER ANGLE | RATE: 107nm/min<br><br>SELECTION RATIO OF LAMINATED FILM TO SiO2: 17<br><br>ANISOTROPY: 80°<br><br>FACET: 63nm |
| 15mT<br>TCP500W<br>RF200W<br>O2/Cl2=<br>715/80sccm<br>20%O.E. | 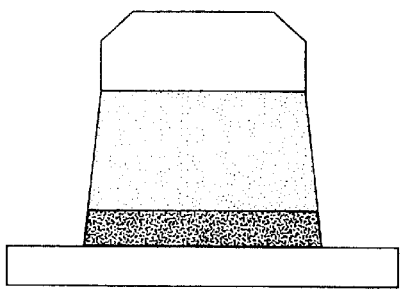 | RATE: 128nm/min<br><br>SELECTION RATIO OF LAMINATED FILM TO SiO2: 20<br><br>ANISOTROPY: 84°<br><br>FACET: 60nm |

*FIG. 2*

THE REASON WHY A PATTERN HAS A TAPER

THE REASON WHY ANISOTROPY IS IMPROVED BY A HIGH FLOW-RATE AND HIGH-SPEED PUMPING.

| CONDITION | CROSS-SECTIONAL VIEW | ETCHING CHARACTERISTICS |
|---|---|---|
| 30% O.E. | SiO2 / RuO2 / Ru / TiN | ANISOTROPY: 83°<br>FACET: 60nm |
| 50% O.E. | | ANISOTROPY: 85°<br>FACET: 110nm |
| 100% O.E. | 0.45 μm; 0.13 μm  0.13 μm | ANISOTROPY: 89°<br>FACET: 180nm |

FIG. 5

THE REASON WHY THE ANISOTROPY IS IMPROVED
BY OVER ETCHING

| | Ru | $RuO_2$ |
|---|---|---|
| CRYSTAL | HEXAGONAL, LOW DENSITY | RUTILE, HIGH DENSITY |
| CHEMICAL ETCHING | $Ru + O \rightarrow RuO\ (s)$<br>$\phantom{Ru + O} \rightarrow RuO_2\ (s)$<br>$RuO_2\ (g) \rightarrow RuO_2\ (g)$<br>$RuO_2\ (s) \rightarrow RuO_3\ (g),\ RuO_4\ (g)$<br>FIRST, Ru, $RuO_2$, MAINLY $RuO_2$ ARE GENERATED. $RuO_2$ REACTS WITH OXYGEN AND GENERATES $RuO_3$, $RuO_4$ IN THE GASEOUS FORM. | $RuO_2 + O \rightarrow RuO_3\ (g)$<br>$\phantom{RuO_2 + O} \rightarrow RuO_4\ (g)$<br>$RuO_3$ AND $RuO_4$ IN THE GASEOUS FORM ARE GENERATED. WHAT IS GENERATED MAINLY IS PRESUMED TO BE $RuO_4$. |
| PHYSICAL SPUTTERING | $Ru + O^+ = \rightarrow Ru\ (s)$ | $RuO_2 + O^+ \rightarrow Ru\ (g)$<br>$\phantom{RuO_2 + O^+ \rightarrow} RuO_2\ (g)$ |
| CONCLUSION | 1. Ru AND $RuO_2$ IN THE SOLID FORM APPEAR BY CHEMICAL ETCHING AND SPUTTERING.<br>2. $RuO_3$ AND $RuO_4$ IN THE GASEOUS FORM APPEAR OWING TO THE REACTION BETWEEN OXYGEN AND $RuO_2$ EXISTING ON THE ETCHED BOTTOM SURFACE.<br>3. Ru AND $RuO_2$ WHICH COME FLYING TO THE ETCHED SIDEWALL AND BECOME SIDEWALL FENCES INHIBIT ANISOTROPIC ETCHING. | 1: $RuO_3$ AND $RuO_4$ IN THE GASEOUS FORM APPEAR BY THE CHEMICAL ETCHING.<br>2: Ru AND $RuO_2$ IN THE SOLID FORM ARE GENERATED BY THE SPUTTERING.<br>3: Ru AND $RuO_2$ WHICH COME FLYING TO THE ETCHED SIDE SURFACE BECOME SIDEWALL FENCES AND INHIBIT THE ANISOTROPY. |

FIG. 8

PROCESS FOR FABRICATING AN INTEGRATED CIRCUIT DEVICE HAVING A CAPACITOR WITH AN ELECTRODE FORMED AT A HIGH ASPECT RATIO

BACKGROUND OF THE INVENTION

The present invention relates to a semiconductor integrated circuit device with a ferroelectric (high dielectric) capacitor and a fabrication process thereof, particularly, a process for forming a conductive material, which constitutes a lower electrode of the capacitor, at a high aspect ratio or high anisotropy.

Japanese Patent Application, Laid-Open No. HEI 10-98162 (Yunogami, et al.), described a technique developed with a view to forming a minute pattern with high dimensional accuracy without leaving a byproduct of low vapor pressure on the sidewall. Patterning a thin film such as Pt is by dry etching through a resist mask to form, on a sidewall of a thin film pattern, a positive taper reaching its lower end, with a photoresist of a predetermined pattern as a mask. The photoresist has a substantially vertical sidewall at least at the lower half and a positive taper or rounding at the outer periphery of the top portion.

Japanese Patent Application, Laid-Open No. Hei 9-205183 (Shibano), described a technique developed with a view to reducing generation of irregularities on the surface or sidewall of the ruthenium film after etching or etching residues and making the taper shape of the etching as vertical as possible, thereby forming a fine pattern. Etching a ruthenium film is by a mixed gas plasma containing chorine and oxygen, while regulating the total flow of the mixed gas so that a gas residence time in an etching chamber becomes 45 msec or less.

Japanese Patent Application, Laid-Open No. Hei 7-221197 (Kajiyana), described a technique developed with a view to preventing the use of a resist film as a mask. A ruthenium dioxide film is subjected to RIE (Reactive Ion Etching) by using an oxygen plasma and an oxygen plasma resistant film (SOG film, TiN film, TiSi film, polysilicon film, amorphous Si film, plasma SiN film, Al film or Cr film) as a mask.

Japanese Patent Application, Laid-Open No. 153707 (Tokashiki), described a technique developed with a view to removing, during the formation of fine patterns from platinum or a conductive oxide, the contamination on the surface of the patterns with carbon, a halogen member or the like. At the same time, the surface condition of an electrode is improved to equal or be much similar to the condition at the formation time of an electrode material. An electrode containing ruthenium, ruthenium oxide or the like is dry etched and then followed by treating the electrode surface with ozone, water vapor or nitrogen oxide gas.

Japanese Patent Application, Laid-Open No. Hei 5-267226 (Kumihashi, et al.), described a technique developed with a view toward improving the throughput upon time modulation etching. The residence time of a processing gas in a vacuum processing chamber is improved to 100 msec or less by using an evacuation pump having an effective exhaust speed of at least 1300 liter/s.

Japanese Patent Application, Laid-Open No. Hei 8-107105 (Tatsumi), described a technique developed with a view to preventing the generation of a residue upon patterning of a film including a of a silicone material such as polycrystalline silicone. A high selection ratio to an underlying insulation film is obtained by patterning the silicone material film on the insulation film through a first etching step of a high etching rate and a second etching step of a high selection ratio. An evacuation rate of an etching gas in the second etching step is set larger than in the first etching step, more specifically, at 1000 liter/sec.

Japanese Patent Application, Laid-Open No. Hei 7-7001 (Tomita, et al.), described a technique developed with a view to providing a plasma etching system or device permitting stable and continuous use for long hours by suppressing generation of a polymer of a processing gas stuck onto the peripheral wall of a gas exhaust nozzle. A gas supply is controlled so that the mass flow of a gas passing through a thin hole of a shower electrode becomes at least 620 $kg/m^2/hour$.

Japanese Patent Application, Laid-Open No. Hei 5-267249 (Kumihashi, et al.), described a technique developed with a view to facilitating anisotropic etching and over etching. An effective exhaust speed in a vacuum processing chamber and/or a flow of a processing gas is changed from one condition forming a deposition film on the sidewall of the etching pattern of a sample to the condition of not forming or forming in the opposite order.

SUMMARY OF THE INVENTION

As a part of the present invention, the inventor has investigated a large capacity DRAM (Dynamic Random Access Memory) of at least 1 G bit, as a countermeasure to make up for a decrease of an accumulated charge amount occurring with the miniaturization of a memory cell. The capacitor insulating film of a capacitor for information storage was made from a high dielectric material such as $Ta_2O_5$ having a relative dielectric constant of about 20 and having a non-Perovskite structure or BST ($(Ba, Sr)TiO_3$) having a relative dielectric constant of at least 100 and being an $ABO_3$ type complex oxide, that is, a Perovskite type complex oxide, or a ferroelectric material, such as PZT ($PbZr_xTi_{1-x}O_3$), PLT($PbLa_xTi_{1-x}O_3$), PLZT, $PbTiO_3$, $SrTiO_3$ or $BaTiO_3$, having a crystalline structure such as a Perovskite structure. Also in the field of a non-volatile memory, a ferro-electric memory making use of polarization inversion of the above-described ferro-electric material for the retention of memory is under development.

When the capacitor insulating film of a capacitor is formed of a ferro-electric material as exemplified above or where a ferro-electric material as exemplified above is employed as the polarization inversion film of a nonvolatile memory, electrode conductive films are formed having therebetween a ferroelectric material film. For example, they are formed from a metal including a platinum group member (ruthenium (Ru), rhodium (Rh), palladium (Pd), osmium (Os), iridium (Ir) and platinum (Pt)) or an oxide thereof having high affinity with the above-described ferro-electric material, as described in the above literature.

In general, however, the above-exemplified platinum metal or oxide thereof cannot be etched with good anisotropy and there is a potential danger that inferior, short-circuits occur owing to an etching residue. For example, the formation of a capacitor by using Pt is accompanied with the problem that: upon dry etching of a Pt thin film deposited on a substrate, a large amount of a low vapor pressure byproduct sticks to a sidewall of the pattern, which becomes a cause of a short circuit between capacitors. The existence of such a byproduct sticking to the sidewall of a pattern also becomes a cause for deteriorating the anisotropy of the pattern.

According to the investigation by the present inventors, when a high dielectric BST is employed for a capacitor insulating film of a 1 G bit DRAM, a lower electrode desirably has a minimum width of 0.13 um and a height of 0.45 um, because a space of 0.13 um between adjacent lower electrodes is required. In order to form such a fine pattern while imparting it with sufficient reliability in practical use, a taper angle of at least 80 degrees, preferably at least 85 degrees, is preferred. The term taper angle as used herein means an angle formed between a sidewall of a lower electrode and the surface of a material below the lower electrode.

FIG. 42 is a cross-sectional view schematically illustrating the relation between a taper angle and a fine pattern shape. As illustrated in FIG. 42, a taper angle of 90 degrees is ideal. Supposing that a width of the bottom surface of the pattern is 0.13 um and a pattern height is 0.45 um, such a pattern height cannot be obtained at a taper angle of 80 degrees (FIG. 42(f)). Such a pattern height is attained for the first time when the taper angle becomes 82 degrees (FIG. 42(e)) which however does not secure an area on the upper surface of the pattern. When the taper angle is 85 degrees (FIG. 42(d)), an area on the upper surface of the pattern is secured to some extent and when the taper angle is 87 degrees (FIG. 42(c)), an area on the upper surface of the pattern is secured sufficiently. When the taper angle is 89 degrees (FIG. 42(b), the pattern is able to have an almost ideal shape.

An object of the present invention is to obtain fine etching of ruthenium, ruthenium oxide or the like which is a material suited for a ferro-electric and high dielectric film such as BST.

Another object of the present invention is to improve the etching anisotropy of such ruthenium or ruthenium oxide and, desirably, to obtain high anisotropic etching that attains a taper angle of at least 87 degree.

A further object of the present invention is to obtain a large-scale integrated circuit, such as 1 G bit DRAM, by carrying out high anisotropic etching to form a fine lower electrode with minimum width of 0.13 um and a height of 0.45 um from ruthenium or ruthenium oxide, by using a ferro-electric and high dielectric film, such as BST as a capacitor insulating film.

BRIEF DESCRIPTION OF THE DRAWING

The above-described and further objects and novel features of the present invention will be apparent from the description herein and accompanying drawing, wherein:

FIG. 2 is a chart of experimental results showing conditions, cross-sectional view and characteristics of the etching method according to the present invention.

FIG. 5 is a chart of experimental results showing the cross-sectional view and etching characteristics, when over etching amount is changed.

FIG. 8 is a chart illustrating the difference of the etching mechanism between ruthenium and ruthenium dioxide.

DETAILED DESCRIPTION

In the following embodiments, unless otherwise particularly required, common or same descriptions of like or similar portions of the invention will not be repeated. If necessary, the following embodiments will be described after being classified into plural sections or plural embodiments. Unless otherwise particularly specified, they have some relation to each other and each section or embodiment is a modification example, details, complementary explanation or the like of one portion or whole portion of another section or embodiment.

The term semiconductor integrated circuit device as used herein does not only mean that fabricated on a silicon wafer but also that fabricated on another substrate such as TFT (Thin Film Transistor) for liquid crystal display device, unless otherwise specified. The term a principal surface of a wafer or over a principal surface of a wafer as used herein means a principal surface of a substrate itself or an upper surface having a single or multi-layer thin film formed on a substrate.

When a reference is made to the number of members (including the piece number, numeral, amount, range or the like), it is not limited to this number but may be above or below the specified number, unless otherwise particularly specified or unless otherwise limited to a specific number.

In the description, the components (including steps) are not always essential unless otherwise particularly specified or considered essential or apparently essential.

In the description, when reference is made to the shape or positional relation of the components, it includes the shape or relation substantially close or equivalent unless otherwise particularly specified or considered to be principally and apparently different, which will also apply to the above-described numeral, range or the like.

Embodiments of the present invention will be described in detail based on the accompanying drawing. In all the figures, components having the same function will be indicated by the same symbols and overlapping descriptions will be omitted.

(Embodiment 1)

Figure 1:
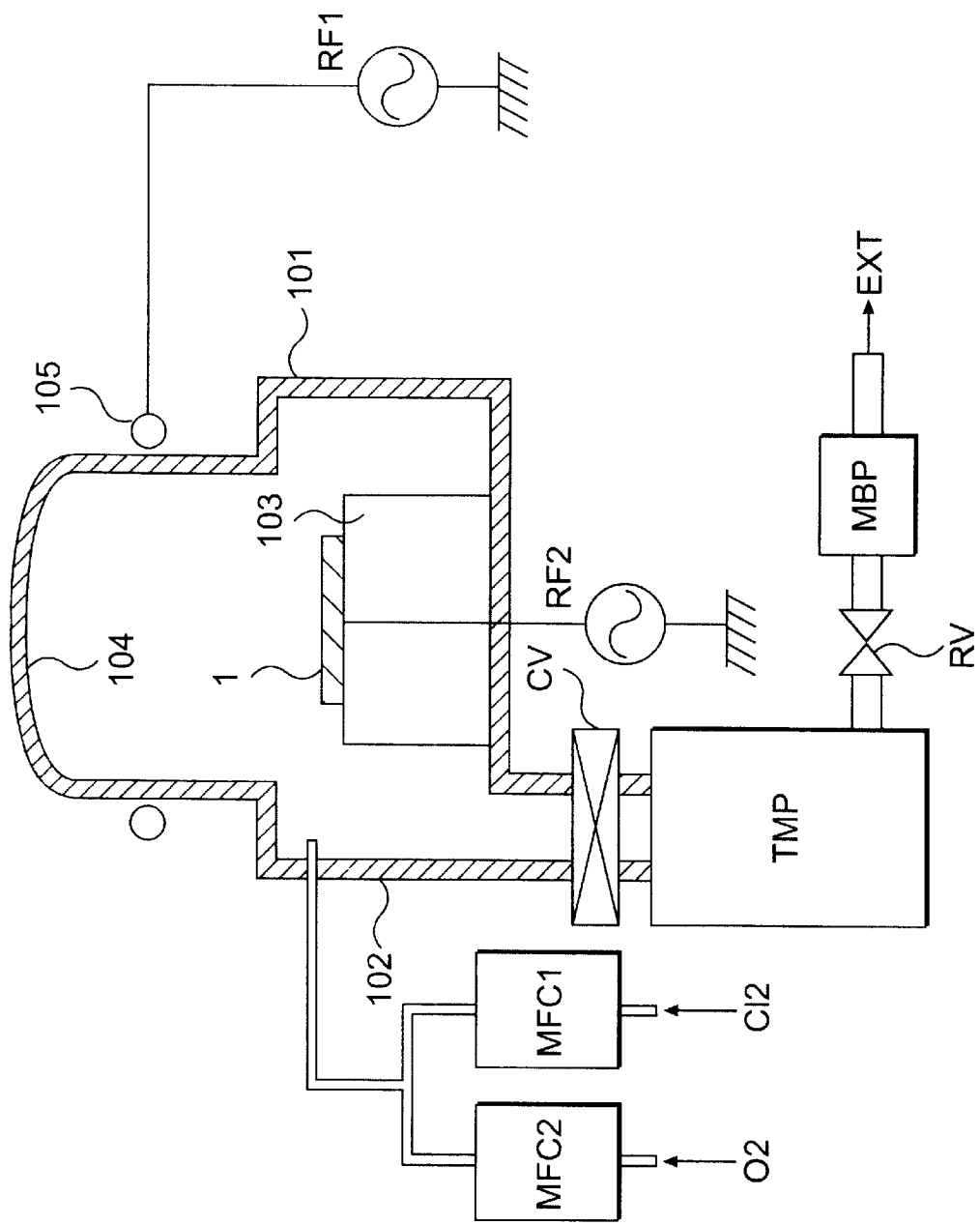
FIG. 1 is a cross-sectional schematic view illustrating one example of an etching device used to fabricate the semiconductor integrated circuit device according to all of the embodiments of the present invention.
Figure 3B:
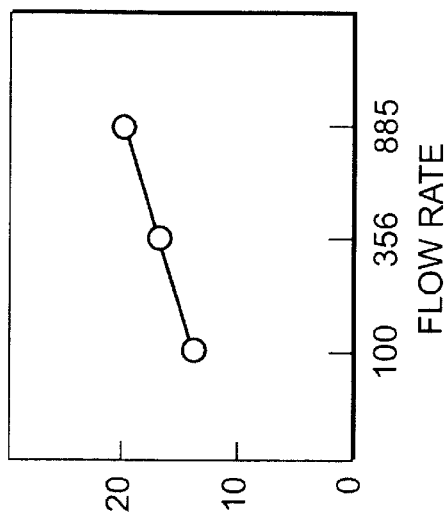
FIG. 3 is a graph illustrating the experimental results of Embodiment 1.
Figure 3D:
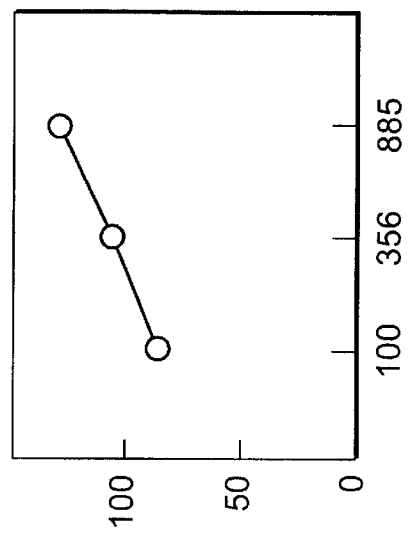
Figure 3A:
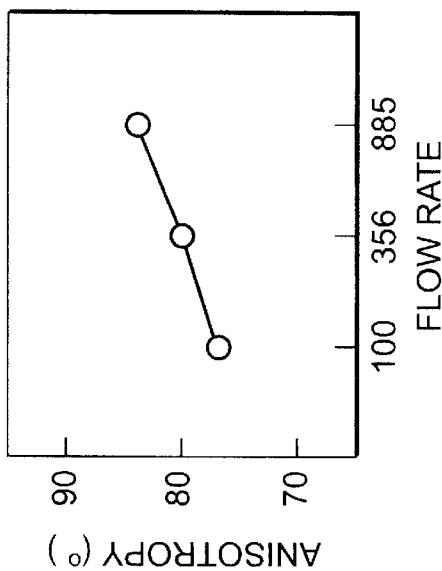
Figure 3C:
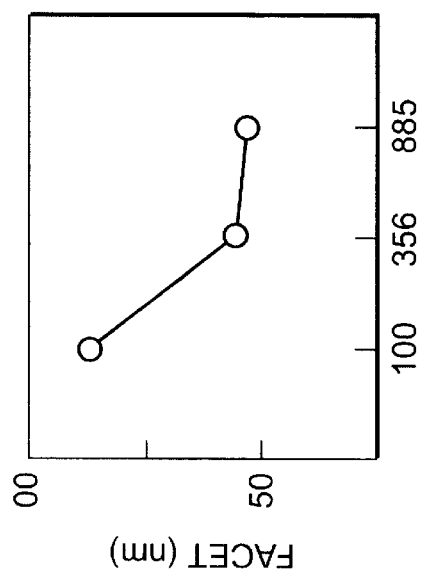

FIG. 1 is a cross-sectional schematic view illustrating one example of an etching apparatus used for the fabrication process of a semiconductor integrated circuit device according to the present invention.

The etching device has an oil-free exhaust system for a process chamber 101 having a volume of about 33.3 liter. A vacuum piping 102 is connected with an exhaust port of the process chamber 101. A control valve CV is disposed on the way to the vacuum piping 102. A turbo molecular pump TMP is connected with the other side of the vacuum piping 102. A mechanical booster pump (positive displacement roughing dry pump) MBP is connected with the turbo molecular pump TMP through a roughing valve RV disposed on the exhaust port side of the turbo molecular pump. The process chamber 101 has mechanical strength sufficient to maintain the inside pressure at a highly vacuum condition through the exhaust system. Inside pressure of the process chamber 101 is adjusted to a desired value by controlling the conductance through the control valve CV upon exhausting from the exhaust system.

It is contemplated to use a roughing vacuum system, which draws the process chamber 101 from atmospheric pressure to a low vacuum, but illustration of such a system is omitted. In the roughing exhaust gas system, the mechanical booster pump MBP may be replaced by a turbo type dry pump or oil-sealed rotary vacuum pump.

This etching device is equipped with a gas supply system, by which a chlorine gas ($Cl_2$) and an oxygen gas ($O_2$) are introduced into the process chamber 101 through a mass flow controller MFC1 and a mass flow controller MFC2, respectively. A stop valve is in the input and output side of each of the mass flow controllers or right before the gas introduction portion of the process chamber 101, but illustration of it is omitted. In the gas supply system, an appropriate purge system may be used, but the illustration of it is also omitted. At the mixing point of the chlorine gas and oxygen gas, a manifold may be disposed, but it is not illustrated. Another gas system, for example, a fluorine gas supply system for etching of a silicon oxide film or a gas system for resist etching may be used.

In the process chamber 101, a susceptor 103 was used. As illustrated in the drawing, a semiconductor substrate (wafer for the fabrication of a semiconductor integrated circuit device) 1 is placed on the susceptor 103 with the face up. The term wafer for the fabrication of a semiconductor integrated circuit device or simply the term semiconductor wafer or semiconductor substrate broadly includes an insulation substrate such as SOS (Silicon On Sapphire), SOI (Silicon On Insulator), or single crystal silicon substrate or TFT.

The semiconductor substrate 1 is, for example, a silicon wafer having a diameter of 6 inches and it is supported by an electrostatic chuck. As illustrated in the drawing, this etching device is a single wafer etching device wherein a single wafer is introduced into the process chamber 1. As illustrated in the drawing, a gas is supplied from a gas supply nozzle 110. The susceptor 103 is electrically isolated from the process chamber 101 and is designed so that a high frequency power R172 for bias may be applied thereto, whereby a high frequency bias may be applied to the semiconductor substrate 1.

The upper part of the process chamber is vacuum sealed with a quartz cylinder 104 and an inductive coupling coil 105 disposed around the quartz cylinder 104. The inductive coupling coil 105 is connected, for example, to a high frequency power source RF1 of 13.56 MHz. The power from the high frequency power source RF1 generates plasma in the quartz cylinder 104 and process chamber 101 by the inductive coupling through the inductive coupling coil 105. By using inductive coupling plasma as described above, high density plasma is generated under a low operating pressure (a high vacuum). This invention is not limited to the inductive coupling plasma but any plasma generating mechanism may be used insofar as it is a plasma generating mechanism under low pressure. For example, ECR (Electron Cycrotoron Resonance) plasma, ICP (inductively Coupled Plasma), magnetron RIE plasma or helicon wave plasma may be employed.

The outline of the etching device to be used in this embodiment is as described above. Next, a description will be of characteristics of the etching device, wherein an etching gas is supplied at a high flow and is pumped at high speed.

This etching device employs a turbo molecular pump TMP having the maximum exhaust capacity of 2000 liter/sec, because it supplies total gas flow of oxygen and chlorine gas as high as 2000 sccm. Even if the gas is supplied at such a high flow, the operating pressure remains sufficiently low (for example, 15 mTorr ). The exhaust capacity of the roughing system (pumping speed of the mechanical booster pump MBP including the conductance of the roughing valve RV and piping) is enough for lowering its backing pressure sufficiently in order to secure the maximum exhaust capacity (compression ratio) of the turbo molecular pump TMP.

The turbo molecular pump TMP having an exhaust speed of 2000 liter/sec, for example, under the conditions of a total gas flow of oxygen and chlorine mixed gas as high as 800 sccm, obtains the effective exhaust speed of 600 liter/s. The effective exhaust speed of the exhaust system means the exhaust speed relating to the whole exhaust system including vacuum piping 102, the control valve CV, the turbo molecular pump TMP, and the roughing system (the mechanical booster pump MBP, the roughing valve RV and piping).

A description will next be made of the etching process of a laminated film of ruthenium dioxide ($RuO_2$) and ruthenium (Ru) having a total film thickness of 0.3 um. This etching is carried out with a view to applying the laminated film to the lower electrode of a DRAM capacitor. Application to a case other than the lower electrode of a DRAM capacitor is not excluded and this etching process may be applied to another system of ruthenium dioxide or the like which needs fine processing.

Over a silicon wafer substrate of 6 inches in diameter, a titanium nitride film 106 is deposited, for example, by the CVD method, followed by successive deposition of a ruthenium film 107 and a ruthenium dioxide film 108 by the sputtering method. The total film thickness of the ruthenium film 107 and ruthenium dioxide film is 0.3 um. Then, a silicon oxide film 109 is deposited, for example, by the CVD method. A photoresist film is applied to the silicon oxide film, followed by patterning of the photoresist film by photolithography to form a resist mask. The pattern width of the resist mask after patterning is about 1 um.

The resulting substrate is then introduced into the etching device and it is placed on the susceptor 103. After vacuum drawing of the process chamber 101 to a high vacuum, for example $1 \times 10^{-6}$ Torr, plasma treatment is carried out while supplying a fluorine gas from an unillustrated gas system, whereby the silicon oxide film 109 is etched. An oxygen gas is then supplied for the plasma treatment and a resist mask is removed by ashing. In this manner, the silicon oxide film 109 patterned to about 1 um width is obtained.

With the patterned silicon oxide film 109 as a mask, the ruthenium dioxide film 108 and ruthenium film 107 are etched. Chlorine and oxygen gases are supplied into the process chamber 101 at a predetermined flow by regulating the mass flow controllers MFC 1 and 2. The pressure is then adjusted to a predetermined pressure by regulating the control valve CV. Plasma is generated by applying a predetermined high frequency power to the inductive coupling coil 105 and substrate from the high frequency power sources RF1 and RF2. Etching is effected by the reaction of the oxygen ions or oxygen radicals produced by this plasma with the ruthenium dioxide film 108 and ruthenium film 107.

The ruthenium dioxide film 108 and ruthenium film 107 form sidewalls. Since they belong to a platinum group, byproducts stick to the etched sidewalls during the etching, which inhibits the anisotropy of etching and brings about a taper shape. In this embodiment, however, etching anisotropy is improved by enlarging the taper angle as described below. The term sidewall-fence forming member as used herein means a member adhered to the sidewall owing to the low vapor pressure of the byproduct upon dry etching and which cannot be subjected to fine etching easily. More specifically, it means platinum group members, oxides or double oxides containing them (platinum group members or the like) and $ABO_3$ type transition metal oxides such as Perovskite. Platinum group or the like means platinum group members and oxides containing them, including platinum group members, oxides containing the components of the platinum group members, double oxides containing a plurality of the components of the platinum group or a member of another group and a platinum group member, and solid solutions thereof.

Etching conditions, a cross-sectional view after etching and etching characteristics are shown in FIG. 2, as a chart of experiment conditions employed for the etching process of this embodiment.

As indicated in the left column of FIG. 2, the fundamental conditions for this etching process are: processing pressure inside the process chamber 101 is 15 mTorr, high frequency power supplied from the RF1 to the inductive coupling coil 105 is 500 W, high frequency bias power applied from the RF2 to the substrate 1 is 200 W, and an over etching amount is 20%.

Figure 43:
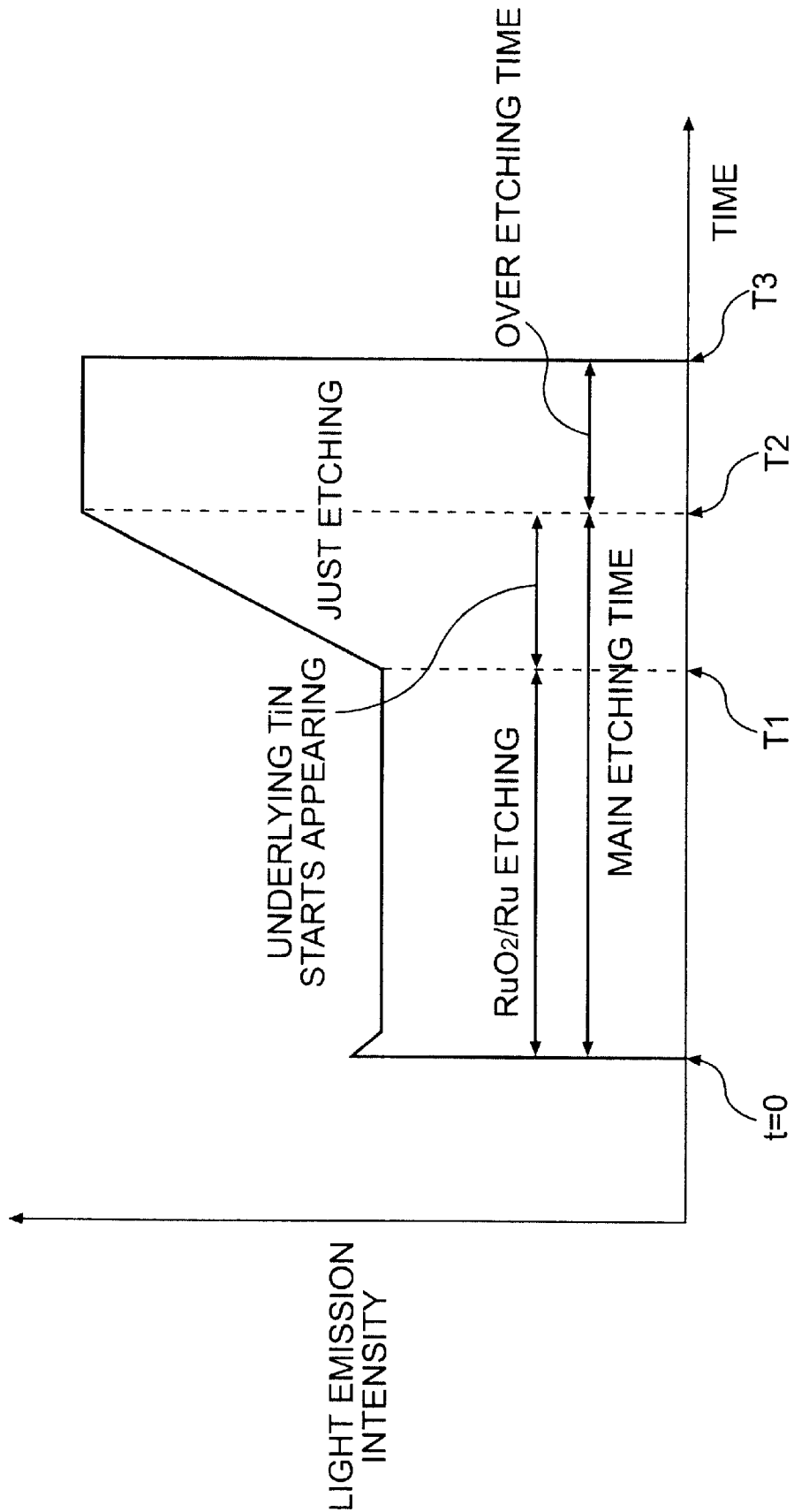
FIG. 43 is a graph of plasma light emission intensity plotted along processing time.

The over etching amount as used herein will be described with reference to FIG. 43. FIG. 43 is a graph of plasma light emission intensity plotted along the processing time when a laminated film ($RuO_2$/Ru film) of a ruthenium dioxide film and ruthenium film over a titanium-containing underlying film (for example, titanium nitride film (TiN film)) is etched. In the plasma light emission, for example, a light having a wavelength of 406 nm, which is an emission peak of titanium, is monitored. Etching is started at time t=O. During the etching of the $RUO_2$/Ru film (time t=O to T1), the TiN film has not appeared so that the light emission intensity at 406 nm is maintained at a low level. When the time reaches T1 (t=T1), etching of the $RuO_2$/Ru film is completed at the portion of the wafer center wherein the etching rate is relatively high and the underlying TiN film starts to appear. As a result, the light emission intensity at 406 nm starts increasing and with the passage of time, that is, with an increase in the exposed area of the underlying TiN film, the light emission intensity at 406 nm increases. When the time reaches T2 (t=T2), etching of the $RuO_2$/Ru film is completed even in the portion of the wafer center wherein the etching rate is relatively, slow and the whole surface of the underlying TiN film appears. As a result, the light emission intensity at 406 nm is maintained constantly at a high level. This time, t=T2, is defined as an just etching time, while the time from t=O to T2 is defined as a main etching time. Etching is continued further and then terminated at t=T3. The time t=T2 to T3 is defined as an over etching time. Accordingly, the over etching amount is defined as (T3−T2)/(T2−0)×100(%).

In this embodiment, processing pressure is set at 15 mTorr, but any processing pressure permitting the stable production of plasma may be used. It may be selected from a range of from 100 mTorr to 0.1 mTorr, more preferably from a range of 30 mTorr to 0.1 mTorr.

The variable in this etching process is, as shown in the left column of FIG. 2, a total flow of oxygen and chlorine. The flow ratio of oxygen to chlorine is about 9:1. In other words, about 10% of chlorine is added based on the total flow. Chlorine is added in an amount of about 10%, because the generation probability of oxygen radicals increases with an increase in the amount of chlorine and reaches a peak when the amount of chlorine is about 16%. The additive is not limited to chlorine insofar as it promotes the generation of oxygen radicals and another additive such as nitrogen or carbon tetrafluoride may be employed.

In FIG. 2, the upper row shows the case where the flow of oxygen is 90 sccm and that of chlorine is 10 sccm (total flow: 100 sccm), with the cross-sectional view shown in the middle column and etching characteristics shown in the right column. The etching rate is 82 nm/min, a selectivity of the laminated film to the silicon oxide film 109 is 4.6, a taper angle which indicates anisotropy of etching is 78 degrees and a facet is 80 nm. The term facet as used herein means the upper corneal part of the silicon oxide film 109, which serves as an etching mask. As illustrated in FIG. 2, the corneal part of the silicon oxide film 109 is formed almost vertically before etching; but by etching, it is rounded or chamfered. The facet indicates the length of the etched region in the vertical direction. The smaller the facet, the better the film functions as an etching mask.

In FIG. 2, the middle row shows the case where the flow of oxygen is 320 sccm and the flow of chlorine is 36 sccm (total flow: 356 sccm). The etching rate increases to 107 nm/sec and the selectivity of the laminated film to the silicon oxide film 109 increases to 17. The taper angle increases to 80 degree, while the facet decreases to 63 nm. In short, all the etching characteristics are improved by an increase in the total flow.

In FIG. 2, the bottom row shows the case where the flow of oxygen is 715 sccm and the flow of chlorine is 80 sccm (total flow: 795 sccm). The etching rate increases further to 128 nmsec and the selectivity of the laminated film to the silicon oxide film 109 increases to 20. The taper angle increases to 84 degree, while the facet decreases to 60 nm. In short, all the etching characteristics are improved further by an increase in the total flow.

The above-described etching characteristics are shown in FIG. 3. With an increase in the gas flow, the anisotropy (taper angle) is improved (FIG. 3(a)) and selection ratio to the silicon oxide film is improved (FIG. 3(b)). In addition, the facet decreases (FIG. 3(c)) and etching rate increases (FIG. 3(d)). Thus, by increasing the total flow of the etching gas (in this case, oxygen and chlorine), all the etching characteristics as described above are heightened or improved. Under the above-described fundamental conditions, the anisotropy of etching is improved to show a taper angle of even 84 degrees by increasing the flow of oxygen gas, chorine gas and total gas to 715 scm, 80 sccm and about 800 sccm, respectively.

Figure 4A:
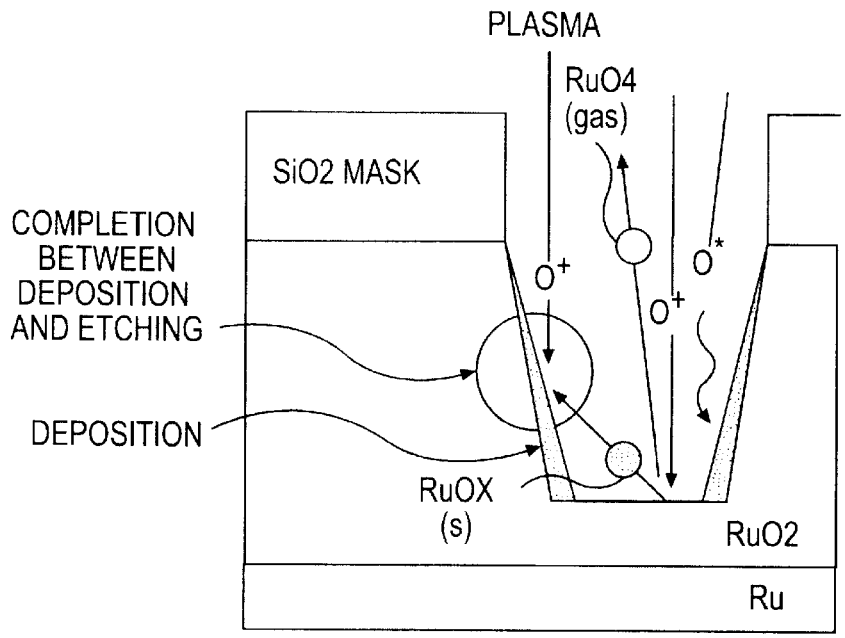
FIG. 4 is a cross-sectional of the etching mechanism of ruthenium dioxide.
Figure 4B:
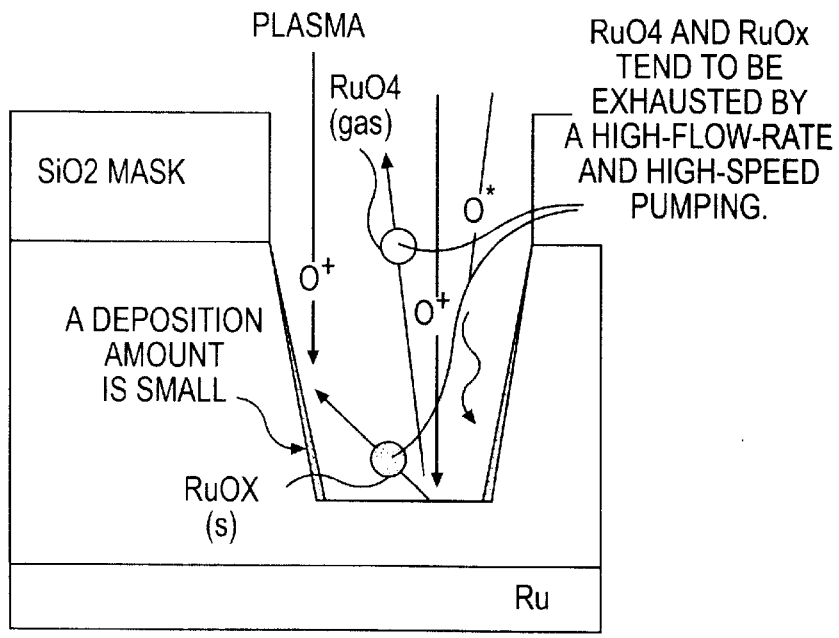

The reason for such an improvement in etching characteristics will be described with reference to FIG. 4. FIG. 4 is a schematic cross-sectional view illustrating an etching mechanism of ruthenium dioxide, wherein FIG. 4(a) illustrates the case where high flow and high-speed pumping is not carried out. FIG. 4(b) illustrates the case where high flow and high-speed pumping is carried out. By the chemical reaction or physical reaction between ruthenium dioxide and oxygen ions ($O^+$) or oxygen radicals ($O^*$) in the particulate form which comes flying from the plasma and has etching or sputtering reaction, byproducts ($RUO_4$, $RuO_x$) are formed. Among the resulting byproducts, the particles (for example, $RuO_4$ which may exist as a stable gas are exhausted as gas, while fine solid particles (for example, $RuO_x$) which cannot exist as a stable gas stick to the etched sidewall and form a sidewall fence. The oxygen ions ($O^+$) or oxygen radicals ($O^*$) react on the sidewall, whereby the sidewall is etched similarly to the bottom surface. When the high flow and high-speed pumping is not carried out (FIG. 4(a)), deposition wins the competition between the above-described sidewall-fence forming action and etching (competition between deposition and etching) and a taper is formed on the sidewall. When the high flow and high-speed pumping is carried out (FIG. 4(b)), the particles (for example $RUO_4$) that may exist as a stable gas and fine solid particles (for example, $RuO_x$)that cannot exist as a stable gas are apt to be exhausted, leading to a decrease in the probability of sidewall fence formation. As a result, deposition decreases in the competition between the deposition and etching, whereby a large taper angle is formed.

In this manner, by increasing the total flow of oxygen and chlorine to about 800 sccm under the abovedescribed fundamental conditions, the etching anisotropy of the laminate film of ruthenium dioxide and ruthenium are improved even to 84 degrees in terms of a taper degree.

The residence time of the etching gas in the process chamber 101 under these conditions may be determined by the calculation as described below. When the residence time, pressure, volume of the process chamber 101 and flow rate are t (sec), P (Torr), V (liter) and Q (sccm), respectively: $t=P \times V/Q$. When the effective exhaust speed of the exhaust system is S, $t=P \times S$. From this and the definition of the residence time $t=V/S$, the above-described expression is obtained By using a conversion constant 1 Torr×liter/s= 79.05 sccm, the residence time is:

t=15 (mtorr)×33.3 (liter)/800 (sccm), t=49.3 (msec).

By adjusting the gas residence time to 49.3 (msec), the etching anisotropy of the laminated film of ruthenium dioxide and ruthenium, under the above-described conditions, may be improved to 84 degrees in terms of the taper angle.

Here, the gas residence time is adjusted to about 49 msec in this embodiment, but any time not greater than 100 msec, preferably not greater than 60 msec, may be adopted.

As seen from the above expression, when the total flow rate Q and pressure P are fixed, the smaller the volume V of the process chamber 101, the shorter the residence time t. Excessive reduction in the volume V is not preferred, because it causes lowering in the area to be etched. The process chamber volume that permits the processing of a wafer having a diameter of 6 inches is 33.3 liter. Under the same conditions, the volume V of at least 10 liter(at least 15 liter if possible) is preferred, but if t is short, the volume may be decreased.

Here, the concept of a normalization volume is introduced. The term normalization volume as used herein means the volume indicated by the unit of the cube of a wafer diameter. In this embodiment, the diameter of the wafer is 6 inches (15.24 cm) so that about 3.4 liters is the normalization volume. The volume of the process chamber is 33.3 liter in this embodiment, so that it is about 9 in terms of the normalization volume. When the conditions other than the volume of the process chamber are the same, the normalization volume is desirably at least 3 and at least 5 if possible.

A description will be made of the experimental results when the over etching amount is changed. FIG. 5 is a chart of experiment showing the cross-sectional view and etching characteristics when the over etching amount is changed.

The fundamental conditions in this etching process are: the processing pressure inside the process chamber 101 is 15 mTorr, high frequency power supplied from RF1 to the inductive coupling coil 105 is 500 W, high frequency bias power applied from RF2 to the substrate is 200 W, and the flow of oxygen and total flow of about 800 sccm shows a marked improvement in the anisotropy in the previous experimental.

Under these fundamental conditions, however, as shown in the previous experimental results, the anisotropy (taper angle) was improved to 84 degrees even if the etching amount was 20% so that the pattern width and pattern space of the silicon oxide film 109 which serves as a mask are therefore reduced much to 0.13 um and the total film thickness of the laminate film of ruthenium dioxide and ruthenium is adjusted to 0.45 um. In the application to a lower electrode of a capacitor of a 1 G bit DRAM, the experiment is carried out at the processing size required in practice. The deposition of the laminate film of ruthenium dioxide and ruthenium and deposition and patterning of the silicon oxide film are carried out as described before.

In FIG. 5, the upper row shows the over etching amount is 30%. The cross-sectional view is indicated in the middle column and the etching characteristics are indicated in the right column, each in the upper row. The taper angle is 83 degree, while the facet is 60 nm.

In FIG. 5, the middle row shows the over etching is 50%. The cross-sectional view is in the middle column and the etching characteristics are in the right column, each of the middle row. The taper angle increases to 85 degrees and the facet increases to 110 nm. With the increase in the over etching, the anisotropy is improved in spite of the deterioration in the facet.

In FIG. 5, the lower column shows the over etching is 100%. The cross-sectional view is in the middle column and etching characteristics are in the right column, each of the lower row. Although the facet shows an increase to 180 nm, the taper angle increases to 89 degrees and is almost ideal.

Figure 6A:
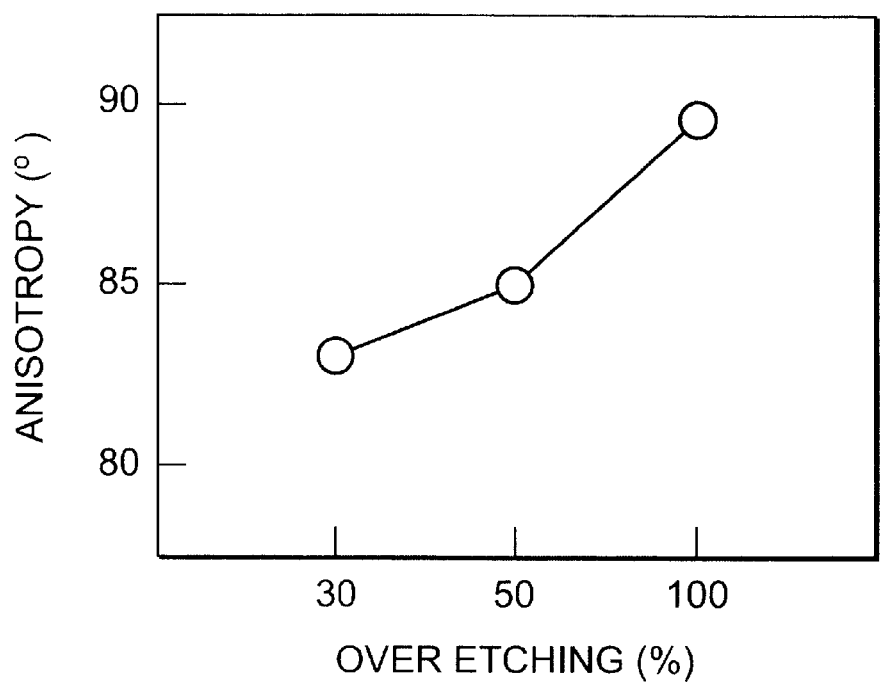
FIG. 6 is a graph illustrating the experimental results of Embodiment 1.
Figure 6B:
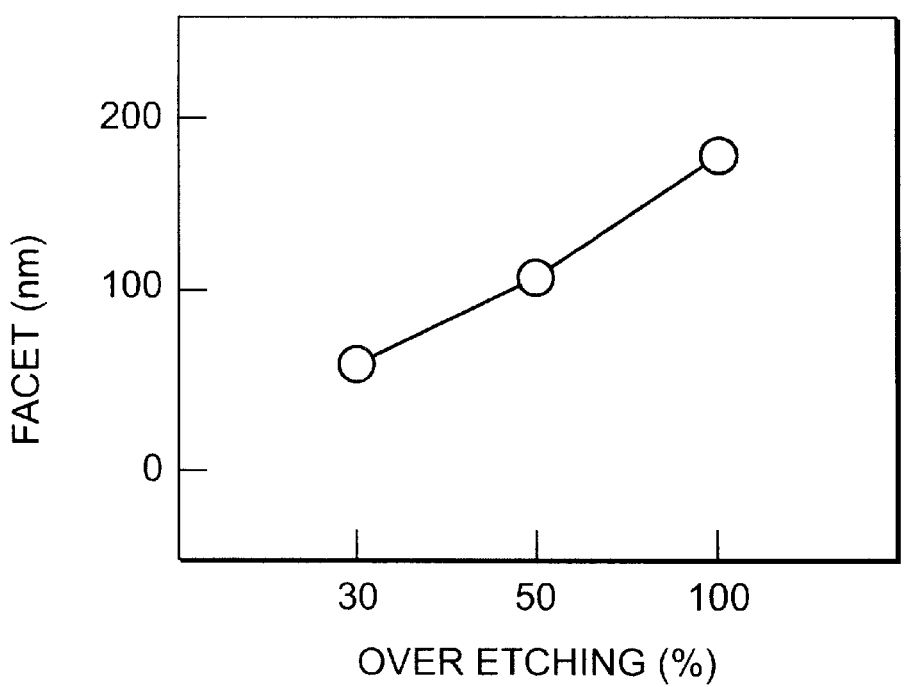

These etching characteristics are shown in FIG. 6. With an increase in the over etching, the anisotropy shows an improvement (FIG. 6(*a*)) and the facet increases (FIG. 6(*b*)). When the over etching is increased to 100% under the above-described fundamental conditions, the taper angle becomes 89 degrees and anisotropy of etching is therefore almost ideal.

The over etching of 100% means that if the over etching conditions are the same with those of the main etching, etching is carried out additionally for a time similar to that of the main etching. When the over etching is under conditions different from the main etching for continuous etching of the object film, the over etching of 100% means that if the etching rate is, for example, decreased to half, the etching is carried out additionally for twice the time of the main etching.

Figure 7:
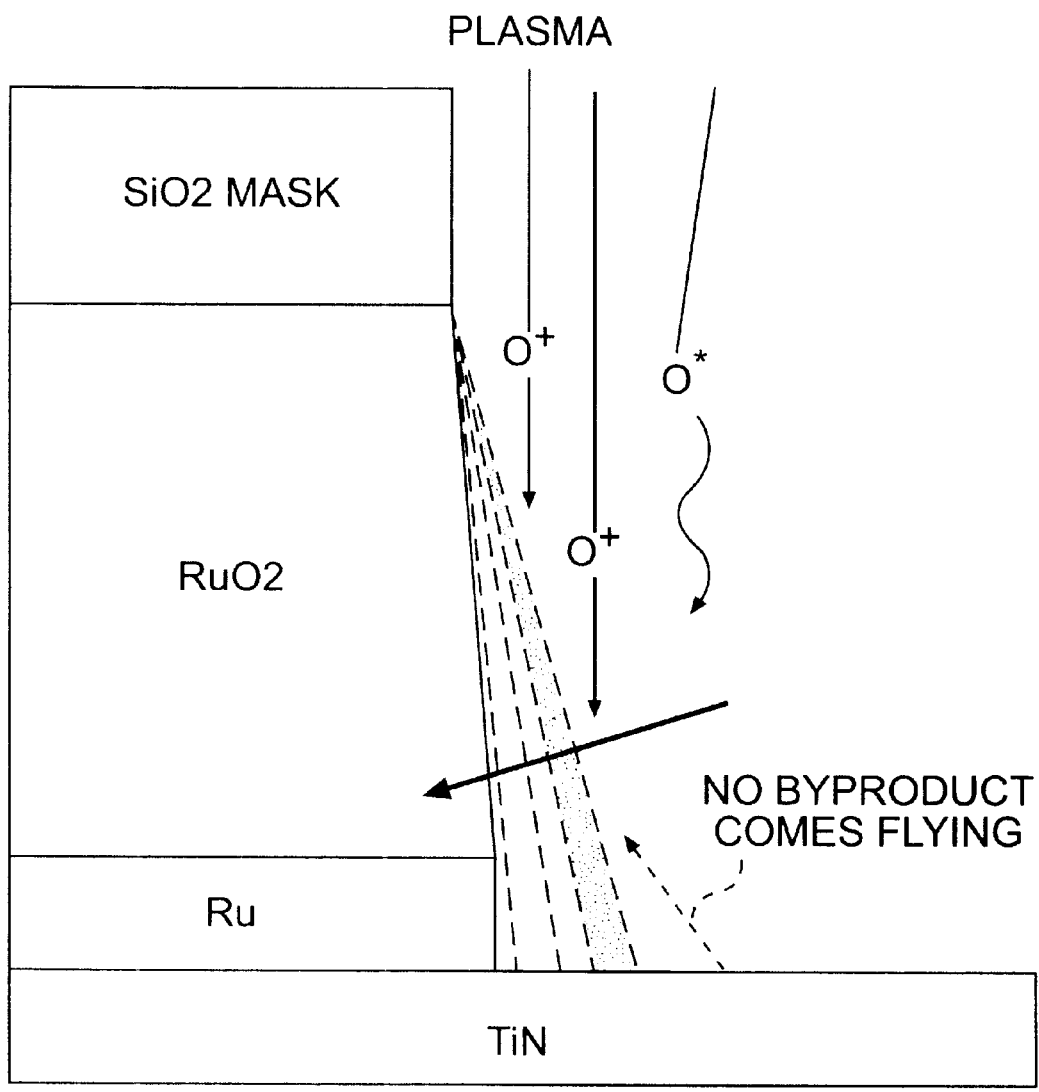
FIG. 7 is a cross-sectional view schematically illustrating the etching mechanism of ruthenium dioxide.

The reason why the anisotropy is improved by an increase in the over etching is explained with reference to FIG. 7. FIG. 7 is a schematic cross-sectional view illustrating the etching mechanism of ruthenium dioxide.

The etching of ruthenium dioxide and ruthenium films are completed at a certain taper angle. So, after over etching, the underlying titanium nitride film is exposed. This titanium nitride film is not etched by oxygen ions or oxygen radicals, therefore the byproducts neither appear from the bottom surface of etching nor fly to the sidewall. At the sidewall portion, there is competition between the etching by oxygen ions or oxygen radicals and the re-adherence of the byproducts formed at the sidewall, but etching wins because the byproducts do not come flying from the bottom as described above, which decreases the total amount of the byproducts. The sidewall fence at the time of over etching therefore shows a drastic decrease, leading to an increase in the taper angle.

As described above, by increasing the over etching from 20% to 100% under the above-described condition, (more specifically, the reaction pressure of 15 mTorr, plasma source power of 500 W, FR bias power of 200 W, and the flows of oxygen and chlorine of 715 sccm and 800 sccm; total flow rate: about 800 sccm, respectively), the etching anisotropy may be improved from 83 to 89 degrees in terms of a taper angle.

The laminates of ruthenium dioxide and ruthenium films may be etched with a high taper angle of 89 degree. This is a result of the considerably marked effects of this embodiment, in consideration that etching of a platinum group metal or oxide thereof, such as ruthenium dioxide or ruthenium, into an undercut shape is principally difficult. In other words, such a material is of an etching system that produces byproducts having low vapor pressure and therefore high sidewall-fence forming property. This also provides a technique very useful for miniaturization on the level of a 1 Gbit DRAM.

Such an etching process forms an ideal columnar pattern (including the inside-filled column and also a cylinder) with a taper angle of 89 degrees in a fine pattern, with a pattern width and space of 0.13 um (0.15 um or less) despite severe etching conditions of a pattern height of 0.45 um (aspect ratio: about 3.5, that is, a high aspect ratio of at least 3). This means that the fine processing margin for etching is large. Described specifically, this means that when the lithography widens its limit and miniaturization of a mask becomes possible, a sufficient fine processing (processing of fine patterns with a pattern width and space of 0.13 um or less) may be carried out using this technique.

As illustrated in FIG. 42, when an aspect ratio exceeding a fixed value (about 2 or 2.5) is not required and a quadrangular shape is permitted, a taper angle of about 80 degrees is sufficient. When a high aspect region is essential and a predetermined area is required on the upper surface, a taper angle of 85 degree, preferably, that of at least 87 is necessary. In the region where the verticality of the sidewall has a meaning, a taper angle of at least 87 degree, preferably at least 89 degrees is required.

According to the investigation of the present inventors, the etching mechanism differs between ruthenium dioxide and ruthenium. FIG. 8 is a table showing the difference in the etching mechanism between ruthenium and ruthenium dioxide. As a premise for the description of the etching mechanism, properties of the product generated by the reaction between ruthenium or ruthenium dioxide and oxygen will be described first. In the formula, (s) means a solid and (g) means a gas. RuO (g) is unstable and decomposes into Ru (s)+O. $RuO_2$ (g) is unstable and agglomerates into $RuO_2$ (s). $RuO_3$ (g) and $RuO_4$ (g) are stable. The above-described byproducts are presumed pumped out mainly in the state of $RuO_3$ (g) and $RuO_4$ (g). The byproducts forming a sidewall hence are presumed pumped out in the state of RuO (g) and $RuO_2$ (g)

A description will be made of an etching mechanism of ruthenium. Ruthenium has a hexagonal crystal structure and has a low density. The reaction between ruthenium and oxygen is presumed to follow two courses. The first is the reaction of Ru+O→RuO (g)→Ru (s). In this course, unstable RuO (g) formed by the reaction returns to Ru (s). The second is the reaction of Ru+O→$RuO_2$ (g)→$RuO_2$ (s). In this second course, after the formation of unstable $RuO_2$ (g), $RuO_2$ (s) in the solid form is formed on the etched bottom surface or sidewall.

It is presumed that ruthenium or ruthenium oxide is formed by the reaction between ruthenium and oxygen.

Etching does not occur only in such processes and it needs a third process, that is, the reaction of $RUO_2$ (s)+O→$RUO_3$ (g), $RUO_4$ (g). Since $RUO_3$ (g) and $RUO_4$ (g) are able to exist as stable gases, they are removed by exhaustion and $RUO_2$ (s) is consequently etched.

Moreover, physical sputtering due to oxygen ions is presumed to occur, which is represented by $Ru+O^+→Ru$ (s).

The total of the above-described reactions is considered to be the etching mechanism of ruthenium. In short, in the etching mechanism of ruthenium, 1. Ru and $RuO_2$ in the solid form appear by chemical etching and sputtering,
    2. $RUO_3$ and $RUO_4$ in the gaseous form appear owing to the reaction between oxygen and $RuO_2$ existing on the etched bottom surface, and
3. anisotropy is inhibited by Ru and $RUO_2$, flying to the etched sidewall and becoming sidewall fences.

The etching mechanism of ruthenium dioxide will be described. Ruthenium dioxide has a rutile crystal structure and has a high density. The above-described reaction: $RUO_2$ (s)+O→$RUO_3$ (g), $RuO_4$ (g) occurs by the reaction between ruthenium dioxide and oxygen. Different from the above-described case of ruthenium, Ru or $RuO_2$ in the solid form does not appear and only $RUO_3$ (g) and $RUO_4$ (g) exist as stable gases and are pumped out. In the chemical etching mechanism of ruthenium dioxide, $RUO_2$ is etched directly, which mechanism is different from that of ruthenium wherein $RuO_2$ is etched after once being formed.

In addition, physical sputtering by oxygen ions is presumed to occur, which is represented by the reaction: $RuO_2+O^+Ru$ (s), $RuO_2$ (s)

The total of these reactions is presumed to be the etching mechanism of ruthenium. In short, in the etching mechanism of ruthenium, 1: $RUO_3$ and $RUO_4$ in the gaseous form appear by the chemical etching,
2: Ru and $RuO_2$ in the solid form appear by the sputtering, and
3: Ru and $RUO_2$ come flying to the etched sidewall to become sidewall fences and inhibit the anisotropy (Ru and $RUO_2$ in this case are formed by sputtering and their amount is presumed to be very small).

When the above-described etching mechanisms of ruthenium and ruthenium dioxide are compared, in the latter case, unstable gaseous Ru and $RuO_2$ do not appear by the chemical etching and sidewall fences are formed in a small amount. This is advantageous for the improvement of the taper angle (improvement in the etching anisotropy).

A description will be made of the application of the etching process as described to the fabrication of a DRAM.

Figure 9:
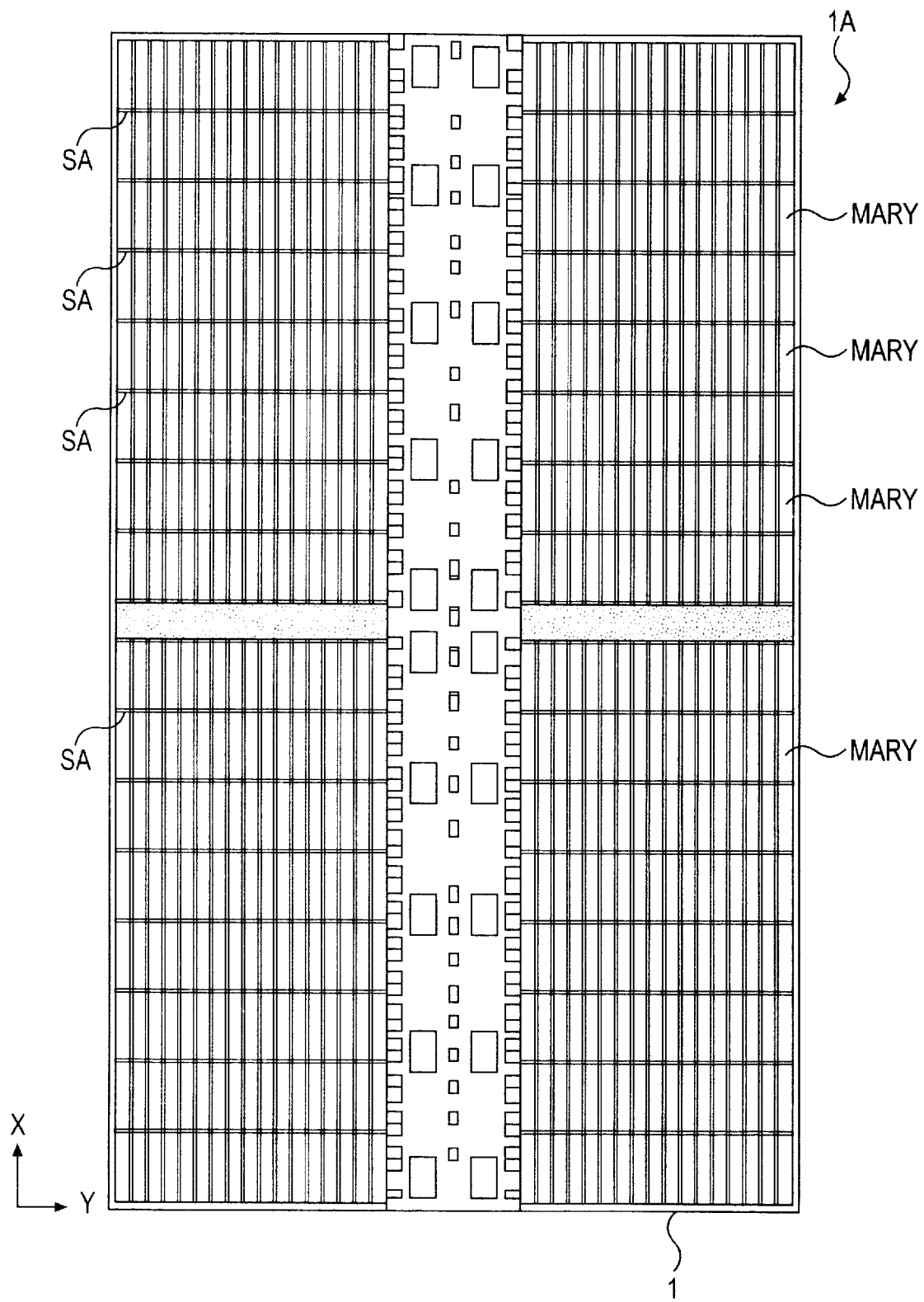
FIG. 9 is an overall plan view of a semiconductor chip having a DRAM formed thereon according to the invention.

FIG. 9 is an overall plan view illustrating a semiconductor chip on which a DRAM according to this invention has been formed. On the principal surface of a semiconductor chip 1A including a single crystal silicon, a large number of memory arrays MARYs are arranged in the matrix form along the directions of X (a longitudinal direction of semiconductor chip 1A) and Y (a lateral direction of semiconductor chip 1A). Between the memory arrays MARYs adjacent to each other in the X direction, a sense amplifier SA is disposed. At the center of the principal surface of the semiconductor chip 1A, word driver WD, control circuits such as data line selection circuit, input-output circuits and bonding pads have been arranged.

Figure 10:
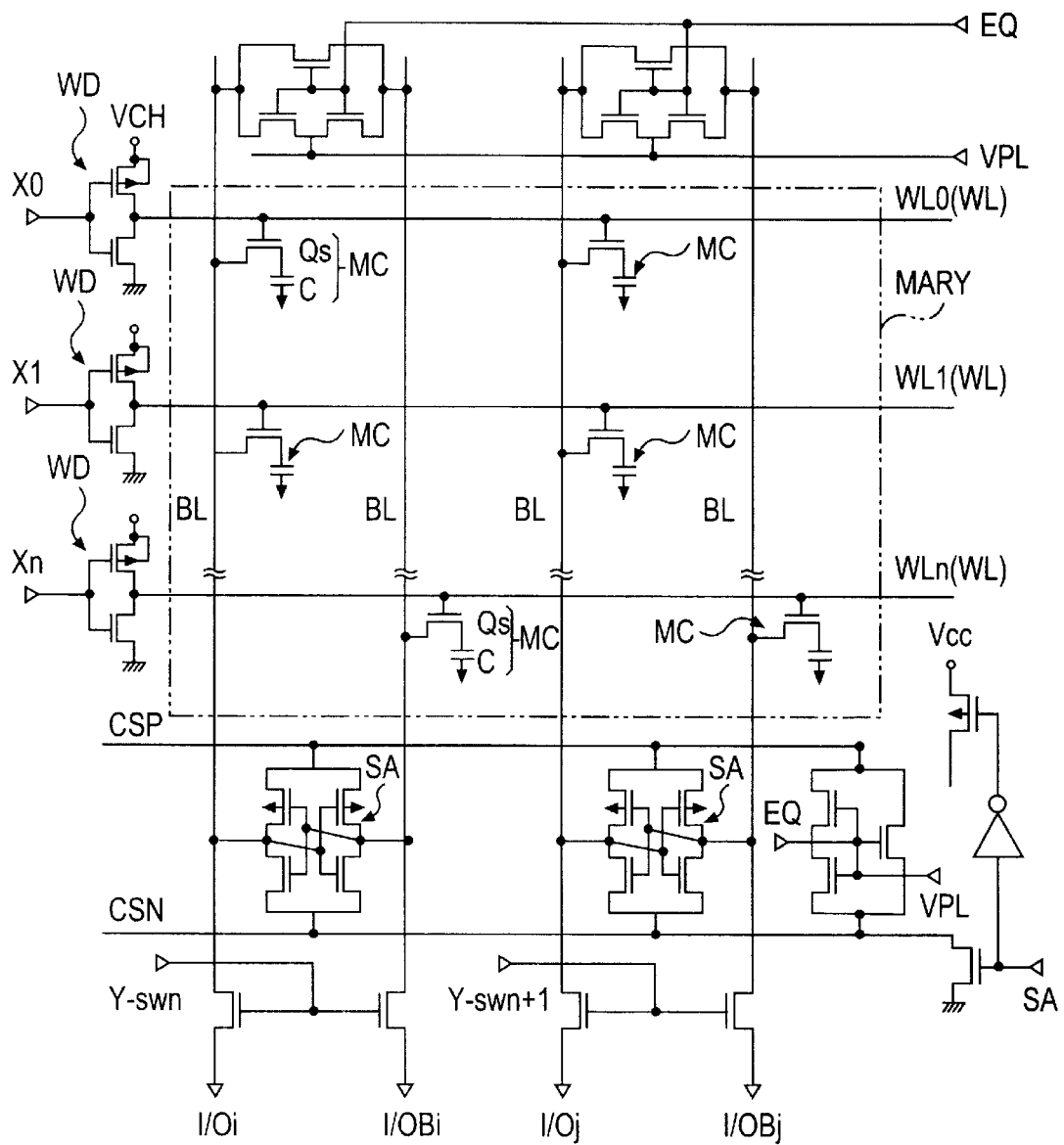
FIG. 10 illustrates an equivalent circuit of the DRAM according to FIG. 10.
Figure 11:
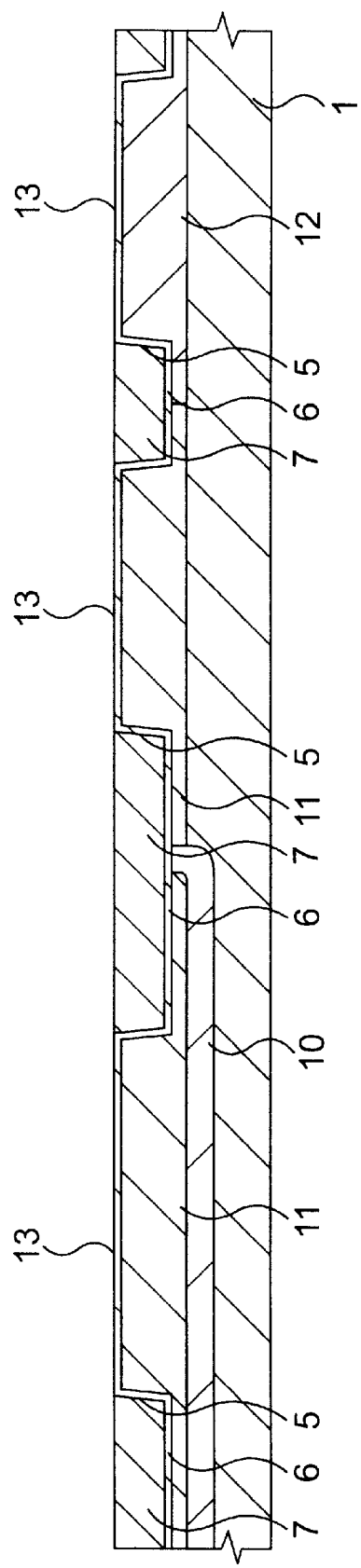
FIG. 11 is a cross-sectional view illustrating one example of the fabrication steps of the DRAM according to the order of steps.

FIG. 10 is an equivalent circuit view of the DRAM according. As illustrated in the drawing, the memory array (MARY) of this DRAM is constituted of plural word lines WL ($WL_0$, $WL_1$, $WL_n$) and plural bit lines BL arranged in a matrix form, and plural memory cells (MC) disposed at the intersections thereof. Each of the memory cells for storing 1 bit of information is formed of one capacitor C for information storage and one MISFETQs for the selection of a memory cell connected with the capacitor in series. One of the source and drain of MISFETQs for the selection of a memory cell is electrically connected with the capacitor C for the information storage and the other one is electrically connected with a bit line BL. One end of the word line WIL is connected with a word driver WD, while one end of the bit line BL is connected with a sense amplifier SA.

The fabrication process of the DRAM will be described in the order of the steps, with reference to accompanying drawings. FIG. 11 to FIG. 37 are cross-sectional views illustrating one example of the fabrication steps of the DRAM.

First, as illustrated in FIG., 11, an element isolation region and a well region having impurities introduced therein are formed.

A p type semiconductor substrate 1 has a specific resistance of about 10 Ωcm and includes a single crystal silicon, for example. Over this substrate, is deposited a silicon oxide film (not illustrated) as thin as about 10 nm by wet oxidation at about 850-C and, for example, a silicon nitride film (not illustrated) as thin as about 140 nm by the CVD (Chemical Vapor Deposition) method. Here, the semiconductor substrate 1 including a single crystal silicon is used, but an SOI (Silicon On Insulator) substrate having a single crystal silicon film on its surface or a dielectric substrate, such as glass or ceramics, having on its surface a polycrystalline silicon film may be used alternatively.

With a photoresist film (not illustrated) as a mask, portions of the silicon nitride film and the silicon oxide film are patterned. The semiconductor substrate 1 is dry etched with this silicon nitride film as a mask, whereby the groove 5 having a depth of about 300 to 400 nm is formed in the element isolation region of the semiconductor substrate 1.

After removal of the photoresist film, a thin silicon oxide film 6 (as thin as about 10 nm) may be formed by wet oxidation at about 850 to 900-C, e.g., on the inside wall of the groove 5. Formation of the film 6 removes the etching damage layer formed on the inside wall of the groove 5. This is followed by deposition of a silicon oxide film (not illustrated) to a film thickness of about 300 to 400 nm by the plasma CVD method using ozone ($O_3$) and tetraethoxysilane (TEOS) as source gases. The silicon oxide film may be sintered by dry oxidation at about 1000-C.

The resulting silicon oxide film is polished by CMP to remove a portion of the silicon oxide film in a region other than the groove 5 and leave the silicon oxide film 7 inside of the groove 5, whereby the element isolation region is formed. Prior to the, a silicon nitride film may be formed in the region of the groove 5, thereby preventing the dishing, that is, excessively deep polishing, of the silicon oxide film in the region of the groove 5.

The silicon oxide film and silicon nitride film remaining on the surface of the semiconductor substrate 1 are then removed, for example, by wet etching using hot phosphoric acid. Then, n-type impurities, for example, P (phosphorus) are ion-implanted into the region (memory array) of the semiconductor substrate 1 where a memory cell is to be formed, whereby an n-type semiconductor substrate region 10 is formed. Then, p-type impurities, for example, B (boron) are ion-implanted into the memory array and a part of a peripheral circuit (the region where an n-channel type MISFET is to be formed), whereby a p-type well 11 is formed. Into the other part of the peripheral circuit (the region where a p-channel type MISFET is to be formed), n-type impurities, for example, P (phosphorus) are ion-implanted, whereby an n-type well 12 is formed. Following the ion implantation, impurities for adjusting the threshold voltage of the MISFET, for example, BF 2 (boron fluoride) are ion-implanted into the p-type well 11 and n-type well 12. The n-type semiconductor region 10 is formed in order to prevent the invasion of a noise into the p-type well 11 of a memory array from the input-output circuit or the like through the semiconductor substrate 1.

After the surface of the semiconductor substrate 1 is washed with, for example, -an HF (hydrofluoric acid) type cleaning liquid, the semiconductor substrate 1 is subjected to wet oxidation at about-, 850-C to form a clean gate oxide film 13 of about 7 nm thick on each surface of the p-type well 11 and n-type well 12. Although there is no particular limitation, segregation of nitrogen may be caused on the interface between the gate oxide film 13 and semiconductor substrate 1 by heat treatment of the semiconductor substrate 1 in an NO (nitrogen oxide) atmosphere or $N_2O$ (dinitrogen monoxide) atmosphere after the formation of the above-described gate oxide film 13 (acid nitriding treatment). When the thickness of the gate oxide film 13 decreases to about 7 nm, a distortion appears on the interface with the semiconductor substrate 1 owing to the difference in the thermal expansion coefficient between them and this induces the generation of hot carriers. The nitrogen that is segregated on the interface with the semiconductor substrate 1 relaxes the above distortion so that the above-described acid nitriding treatment enables an improvement in the reliability of a markedly thin gate oxide film 13.

Figure 12:
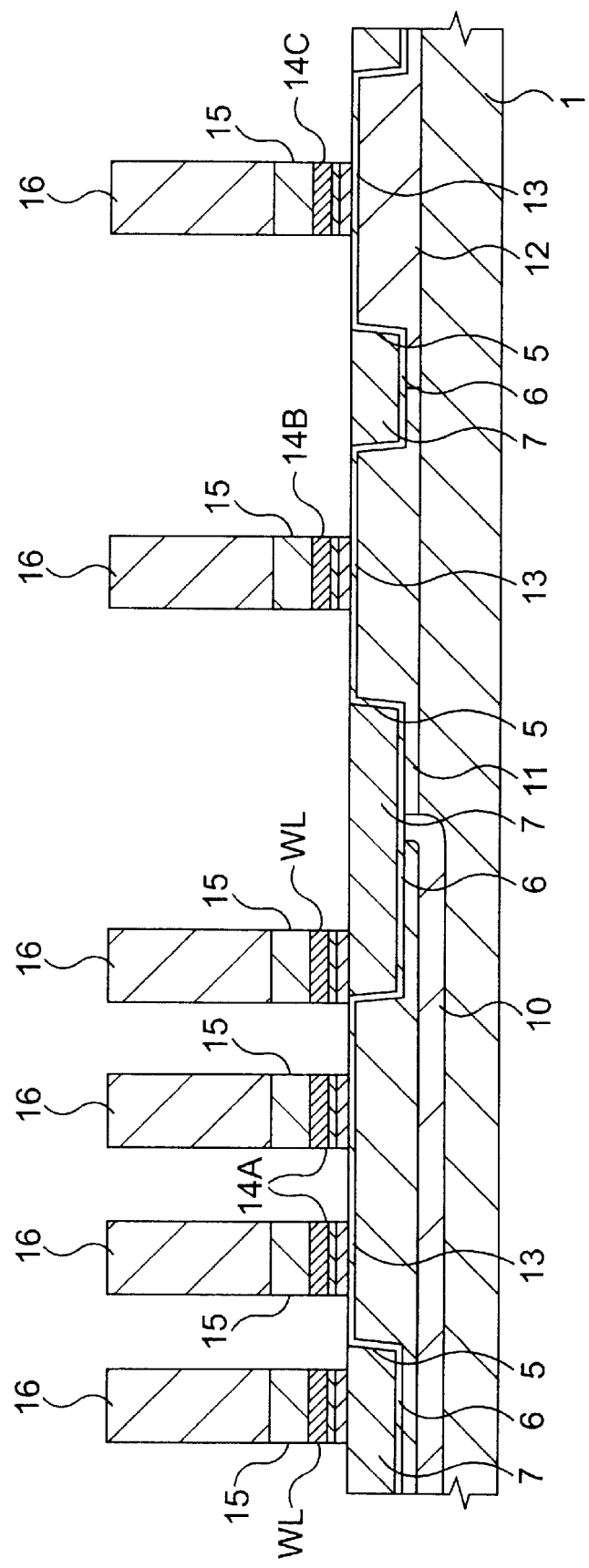
FIG. 12 is a cross-sectional view illustrating one example of the fabrication steps of the DRAM in the order of steps.

As illustrated in FIG. 12, gate electrodes 14A, 14B and 14C are formed over the gate oxide film 13. The gate electrode 14A forms a part of the MISFET for the selection of a memory cell and in regions other than an active region, it is used as a word line WL. The width of the gate electrode 14A (word line WL), that is, a gate length, is formed to a size within a permissible range that can control the short channel effect of the MISFET for the selection of a memory cell and secure the threshold voltage at a predetermined value or greater. The distance of the two adjacent gate electrodes 14A (word line WL) is determined by the resolution limit of photolithography. The gate electrode 14B and gate electrode 14C constitute a part of each of the n-channel MISFET and p-channel MISFET of the peripheral circuit.

Each of the gate electrode 14A (word line WL) and gate electrodes 14B and 14C is formed by depositing, for example, a polycrystalline silicon film of about 70 nm thick, which has n-type impurities such as P (phosphorus) doped therein, on the semiconductor substrate 1 by the CVD method, depositing thereover a WN (tungsten nitride) film of about 50 nm thick and a W film of about 100 nm thick by the sputtering method, depositing thereover a silicon nitride film 15 of about 150 nm thick by the CVD method and then patterning these films with a photoresist film 16 as a mask. The WN film functions as a barrier layer to prevent the W film and the polycrystalline silicon film from reacting at the time of high-temperature heat treatment, thereby forming a highly resistant silicide film on the interface therebetween. As the barrier layer, TiN (titanium nitride) film can be used instead of the WN film.

When the gate electrode 14A (word line WL) is partially constituted from a low resistant metal (W), its sheet resistance is decreased to about 2 to 2.5Ω/and word line delay can therefore be reduced. Moreover, the word line delay is reduced without backing the gate electrode 14 (word line WL) with Al interconnection or the like so that the number of interconnection layers formed above the memory cell is decreased by one.

After the removal of the photoresist film 16, dry etching residue, photoresist residue and the like remaining on the surface of the semiconductor substrate 1 are removed using an etchant such as hydrofluoric acid. By this wet etching, the gate oxide film 13 in a region other than the lower parts of the gate electrode 14A (word line WL) and gate electrodes 14B and 14C is etched. At the same time, a portion of the gate oxide film 13 under the sidewall of the gate is isotropically etched and an undercut is formed, which inevitably reduces the pressure resistance of the gate oxide film 13. The film quality of the undesirably etched gate oxide film 13 is therefore improved by wet oxidation of the semiconductor substrate 1 at about 900-C.

Figure 13:
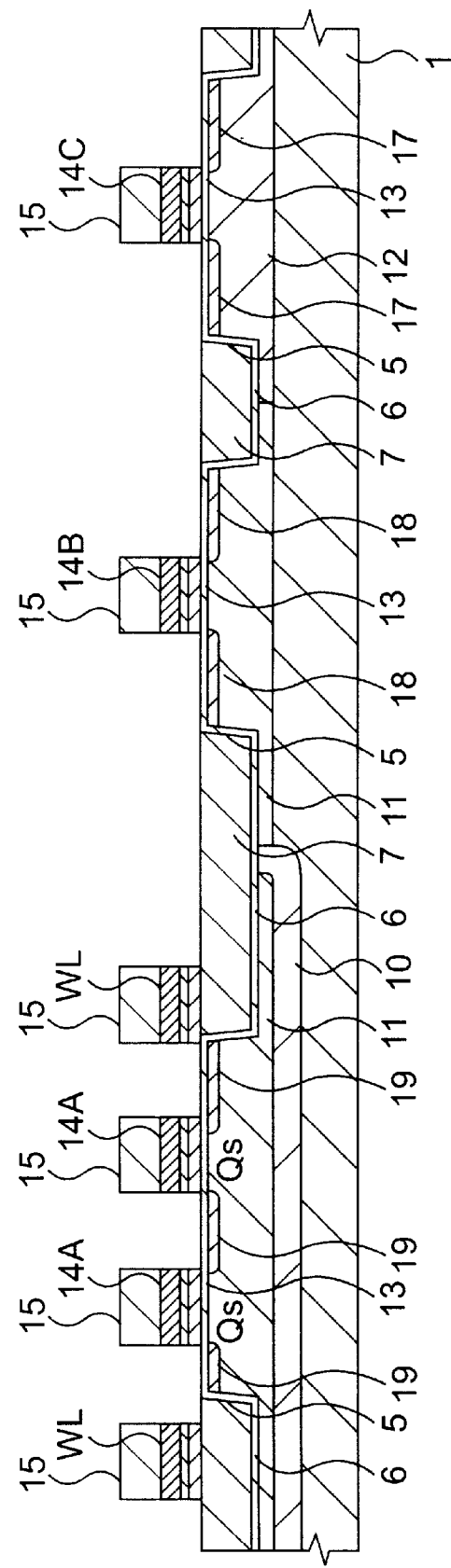
FIG. 13 is a cross-sectional view illustrating one example of fabrication steps of the DRAM according to Embodiment 2 in the order of its steps.

As illustrated in FIG. 13, p-type impurities, for example, B (boron) are ion-implanted into the n-type well 12, whereby p-type semiconductor regions 17 are formed in the n-type well 12 on both sides of the gate electrode 14C. n-type impurities, for example, P (phosphorus) are ion-implanted into the p-type well 11, whereby n-type semiconductor regions 18 are formed in the p-type well 11 on both sides of the gate electrode 14B and n-type semiconductor regions 19 are formed in the p-type wells 11 on both sides of the gate electrode 14A. In this manner, MISFETQs for the selection of a memory cell are formed in the memory array.

Figure 14:
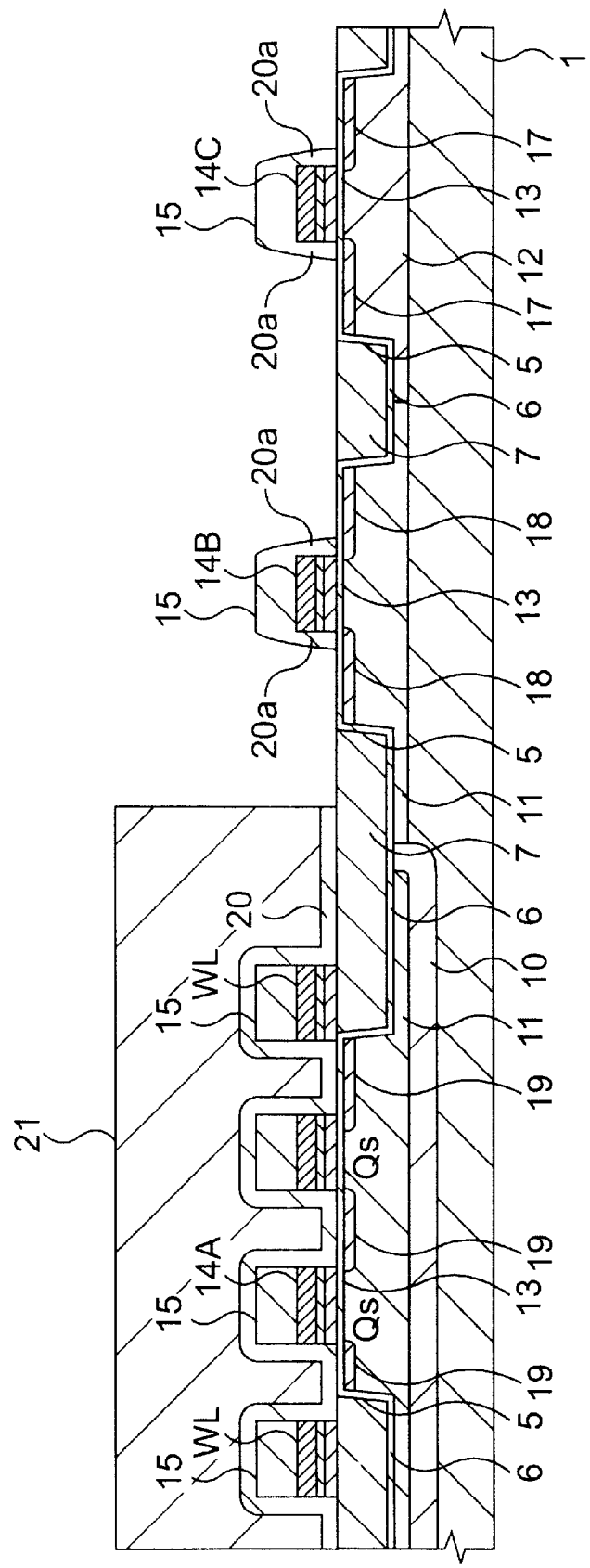
FIG. 14 is a cross-sectional view illustrating one example of the fabrication of the DRAM in the order of steps.

As illustrated in FIG. 14, after a silicon nitride film 20 of about 50 to 100 nm thick is deposited over the semiconductor substrate 1 by CVD, the silicon nitride film 20 of the memory array is covered with a photoresist film 21. The silicon nitride film 20 of the peripheral circuit is subjected to anisotropic etching, whereby sidewall spacers 20a are formed on the sidewalls of the gate electrodes 14B and 14C. With a view to minimizing the etching amount of the silicon oxide film 7 embedded in the gate oxide film 13 or element isolation groove 5, this anisotropic etching is carried out using an etching gas to make the etching rate of the silicon nitride film 20 larger than that of the silicon oxide film. With a view to minimizing the etching amount of the silicon nitride film 15 on the gate electrodes 14B and 14C, the over etching amount is adjusted to the necessary but minimum amount.

Figure 15:
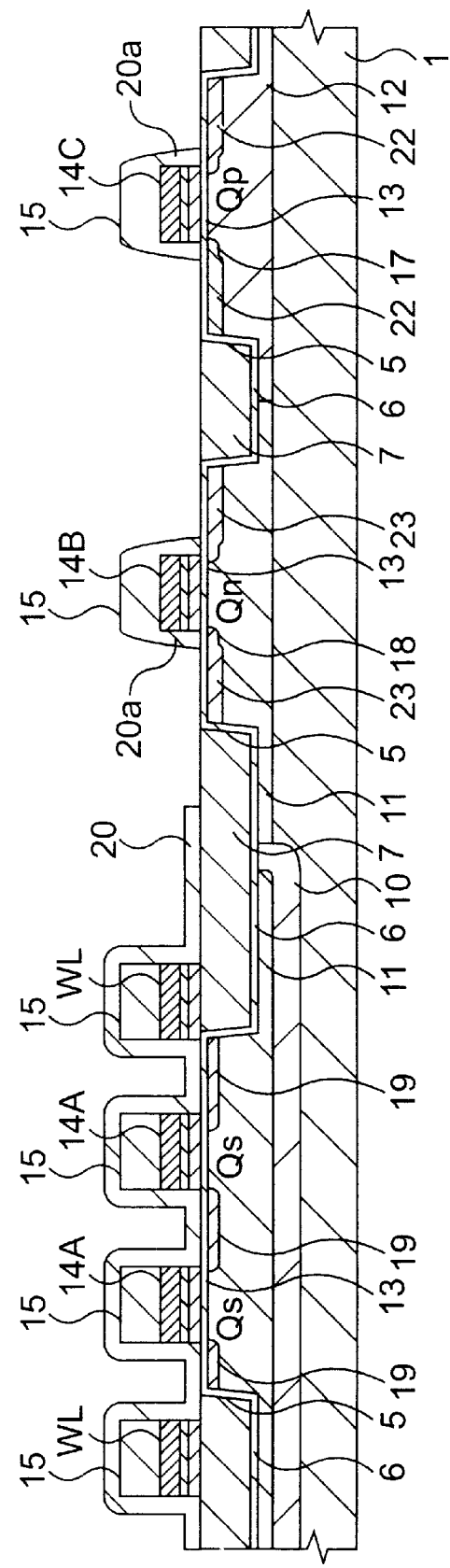
FIG. 15 is a cross-sectional view illustrating one example of the fabrication of the DRAM in the order of steps.

After the removal of the photoresist film 21, as illustrated in FIG. 15, p type impurities, for example, B (boron) are ion-implanted into the n type well 12 in a region of the peripheral circuit. Thereby the p-type semiconductor regions 22 (source, drain) of a p-channel type MISFET are formed. n-type impurities, for example As (arsenic), are ion-implanted into the p-type well 11 in a region of the peripheral circuit, whereby the n-type semiconductor regions 23 (source, drain) of an n-channel type MISFET are formed. In this manner, a p-channel type MISFETQp and n-channel type MISFETQn equipped with an LDD (Lightly Doped Drain) structure are formed in the region of the peripheral circuit.

Figure 16:
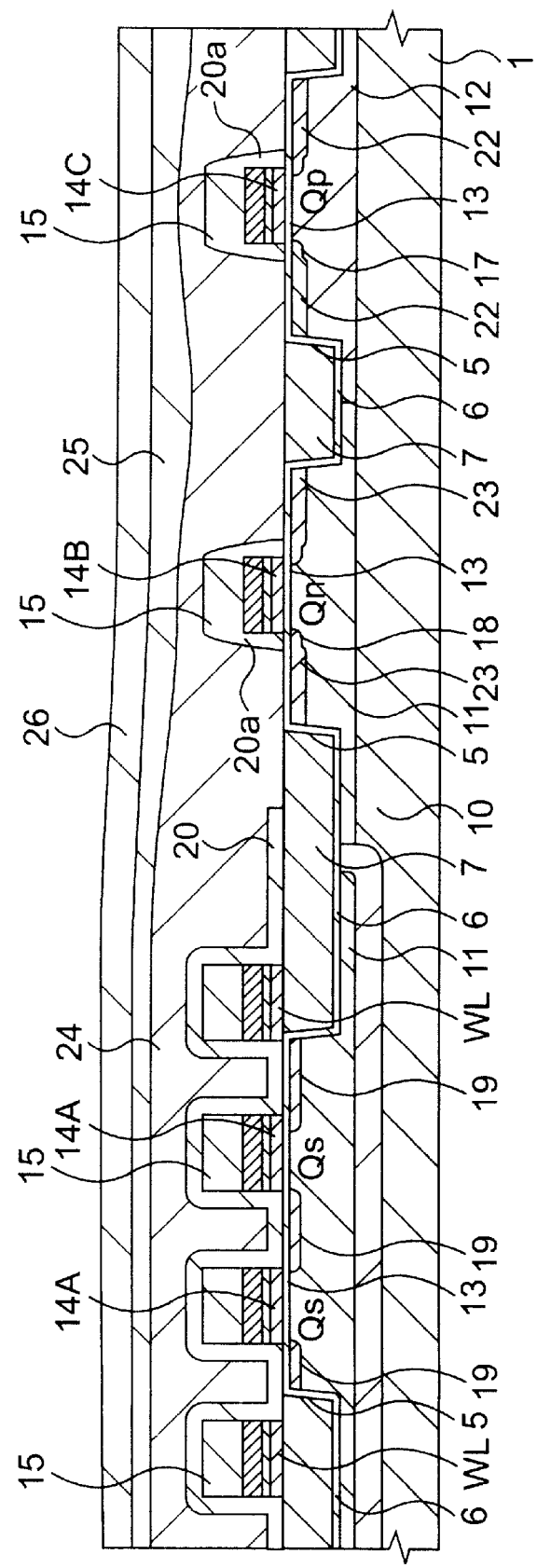
FIG. 16 is a cross-sectional view illustrating one example of the fabrication of the DRAM in the order of steps.

As illustrated in FIG. 16, an SOG (Spin On Glass) film 24 of about 300 nm thick is spin-coated over the semiconductor substrate 1, followed by heat treatment of the semiconductor substrate 1 at 800-C for about one minute, whereby the SOG film 24 is sintered. After a silicon oxide film 25 of about 600 nm thick is deposited over the SOG film 24, the silicon oxide film 25 is polished by the CMP method to flatten its surface. Over the silicon oxide film 25, a silicon oxide film 26 of about 100 nm thick is deposited. This silicon oxide film 26 is deposited for repairing minute scars formed on the surface of the silicon oxide film 25 at the time of polishing by CMP.

The silicon oxide films 25 and 26 are deposited, for example, by plasma CVD using ozone ($O_3$) and tetraethoxysilane (TEOS) as source gases. A PSG (Phospho Silicate Glass) film or the like may be deposited instead of the silicon oxide film 26.

The SOG film 24 having high reflow properties is applied over the gate electrode 14 (word line) and gate electrodes 14B and 14C. The silicon oxide film 25 deposited thereover is flattened by CMP, which improves the gap filling properties in minute gaps between the adjacent gate electrodes 14A (word line WL) and at the same time to flatten the insulation film over the gate electrode 14A (word line) and gate electrodes 14B and 14C.

Figure 17:
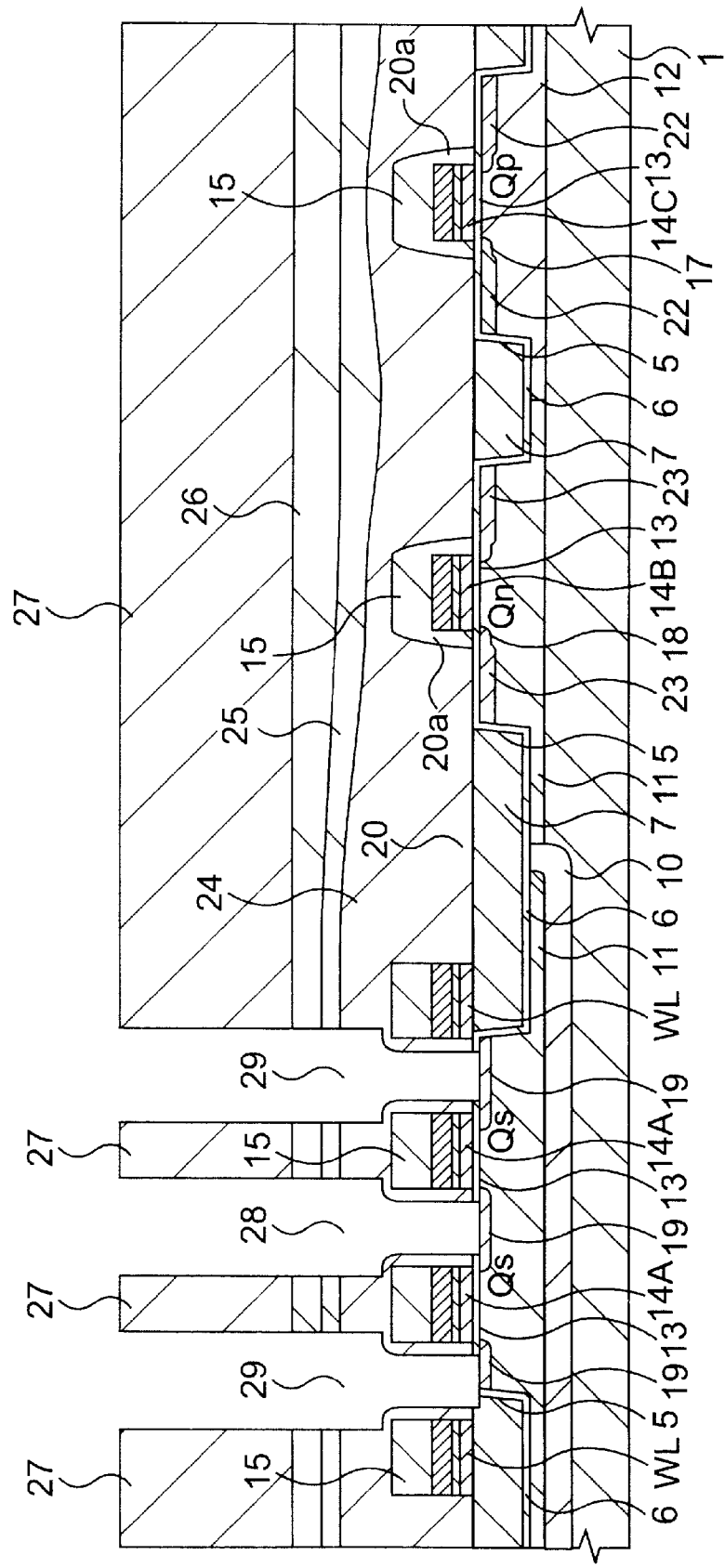
FIG. 17 is a cross-sectional view illustrating one example of the fabrication of the DRAM in the order of steps.

As illustrated in FIG. 17, the portions of the silicon oxide films 26, 25 and SOG film 24 above the n-type semiconductor regions 19 (source, drain) of the MISFETQs for the selection of a memory cell are removed by dry etching with a photoresist film 27 as a mask. This etching is carried out under the conditions to make the etching rate of the silicon oxide films 26, 25 and SOG film 24 larger than that of the silicon nitride film 20, whereby complete removal of the silicon nitride film 20 covering the upper parts of the n-type semiconductor region 19 and element isolation groove 5 is prevented. Then, the portions of the silicon nitride film 20 and gate oxide film 13 above the n type semiconductor regions 19 (source, drain) of the MISFETQs for the selection of a memory cell are removed by dry etching with the above-described photoresist film 27 as a mask, whereby a contact hole 28 is formed above one of the n-type semiconductor regions 19 (source, drain) and a contact hole 29 is formed above the other one. This dry etching is carried out under conditions to make the etching rate of the silicon nitride film 15 larger than that of the silicon oxide films (gate oxide film 13 and silicon oxide film 7 in the element isolation groove 5), whereby deep etching of the n-type semiconductor region 19 or the element isolation grove 5 is prevented. Moreover, this etching is carried out under the conditions so as to etch the silicon nitride film 20 anisotropically, thereby leaving the silicon nitride film 20 on the sidewalls of the gate electrode 14A (word line WL). In this manner, the contact holes 28 and 29 having a diameter smaller than the resolution limit of photolithography are formed in self alignment with the gate electrode 14A (word line WL). For the formation of the contact holes 28 and 29 in self alignment with the gate electrode 14A (word line WL), it is also possible to subject the silicon nitride film 20 to anisotropic etching in advance, thereby forming sidewall spacers on the sidewalls of the gate electrode 14A (word line WL).

The photoresist film 27 is removed and then, the dry etching residue, photoresist residue or the like on the substrate surface appearing at the bottom of the contact holes 28 and 29 are removed using an etchant such as a liquid mixture of hydrofluoric acid and ammonium fluoride. At this time, the SOG film 24 which has appeared on the sidewall of the contact hole 28 or 29 is exposed to the etchant, but this wet etching treatment does not form a large undercut on the sidewall of the contact hole 28 or 29, because the etching rate of the SOG film 24 by the hydrofluoric acid type etchant is decreased by the above-described sintering at about 800-C. This prevents a short between plugs to be embedded inside of the contact holes 28 and 29 in the subsequent step.

Figure 18:
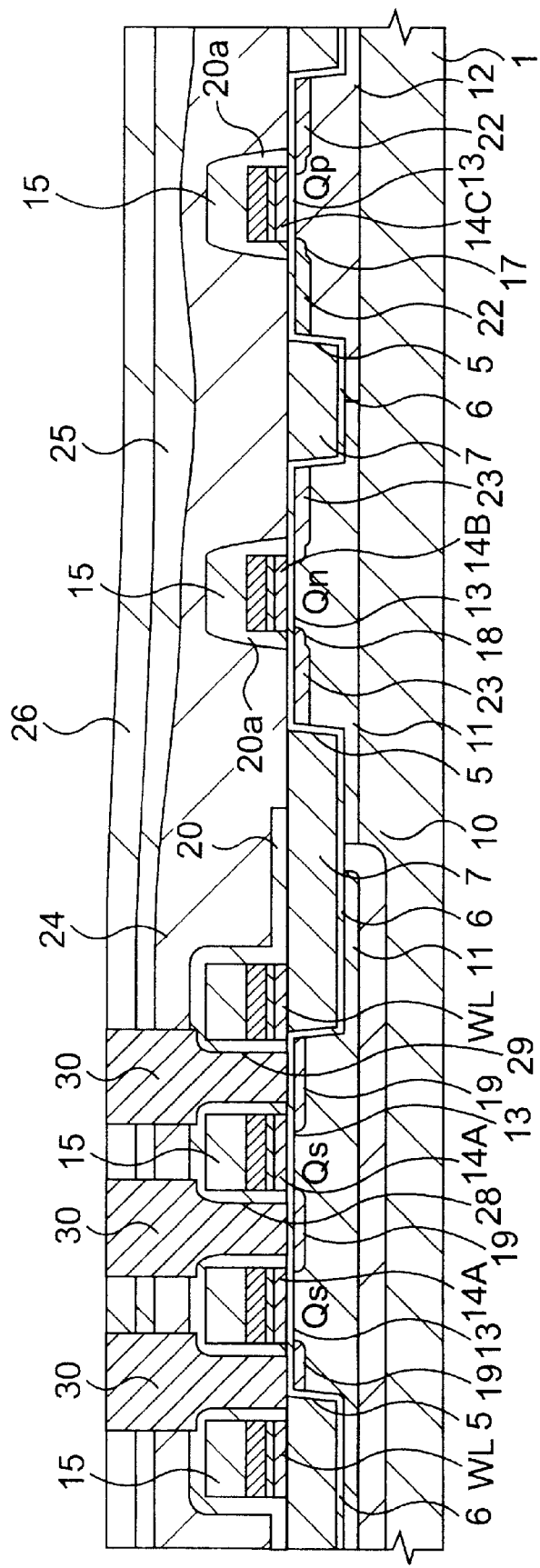
FIG. 18 is a cross-sectional view illustrating one example of the fabrication of the DRAM in the order of steps.

As illustrated in FIG. 18, plugs 30 are formed inside of the contact holes 28 and 29. These plugs 30 are formed by depositing over the silicon oxide film 26 a polycrystalline silicon film, which has n-type impurities (for example, P (phosphorus)) doped therein, by CVD and then polishing this polycrystalline silicon film by CMP to leave it inside of the contact holes 28 and 29.

Figure 19:
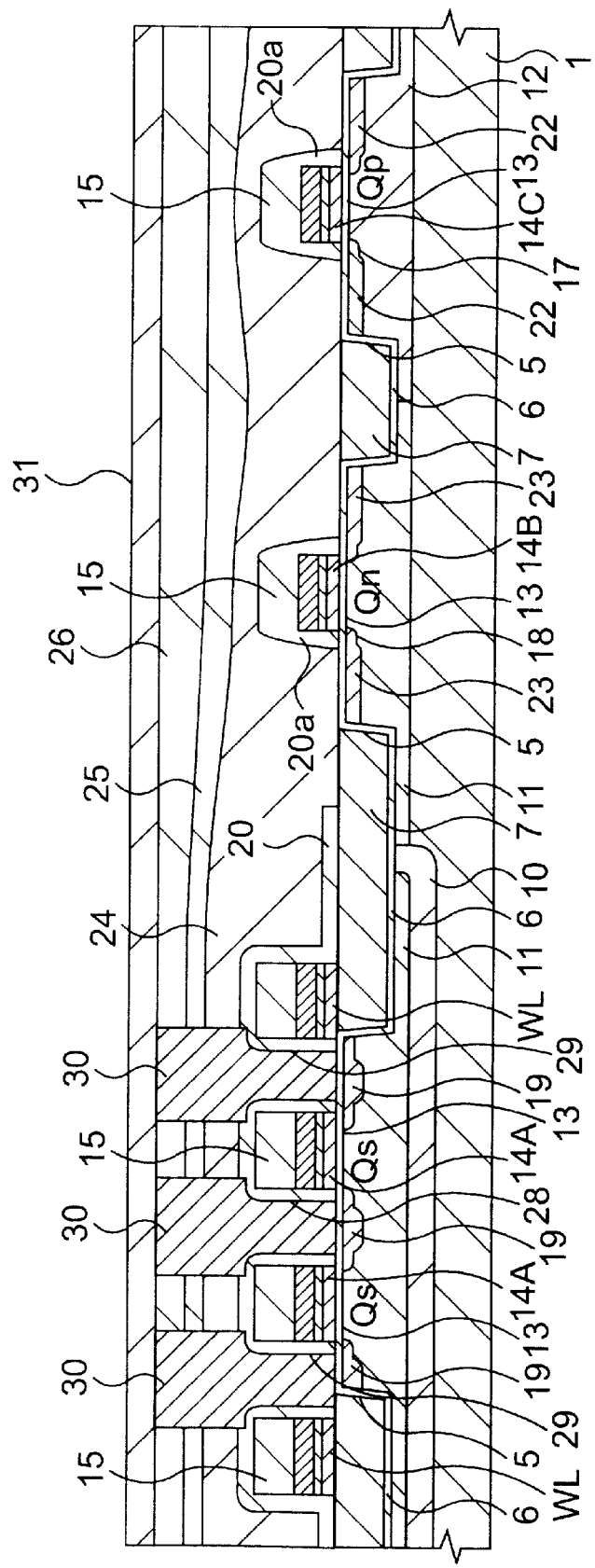
FIG. 19 is a cross-sectional view illustrating one example of the fabrication of the DRAM in the order of steps.

As illustrated in FIG. 19, after a silicon oxide film 31 of about 200 nm thick is deposited over the silicon oxide film 26, the semiconductor substrate 1 is heat treated at about 800-C. The deposition of the silicon oxide film 31 is carried out, for example, by plasma CVD using ozone ($O_3$) and tetraethoxysilane (TEOS) as source gases. By heat treatment, n-type impurities in the polycrystalline silicon film constituting the plug 30 are diffused from the bottom of the contact holes 28, 29 to the n-type semiconductor regions 19 (source, drain) of the MISFETQs for the selection of a memory cell, whereby the resistance of the n-type semiconductor region 19 is lowered.

Figure 20:
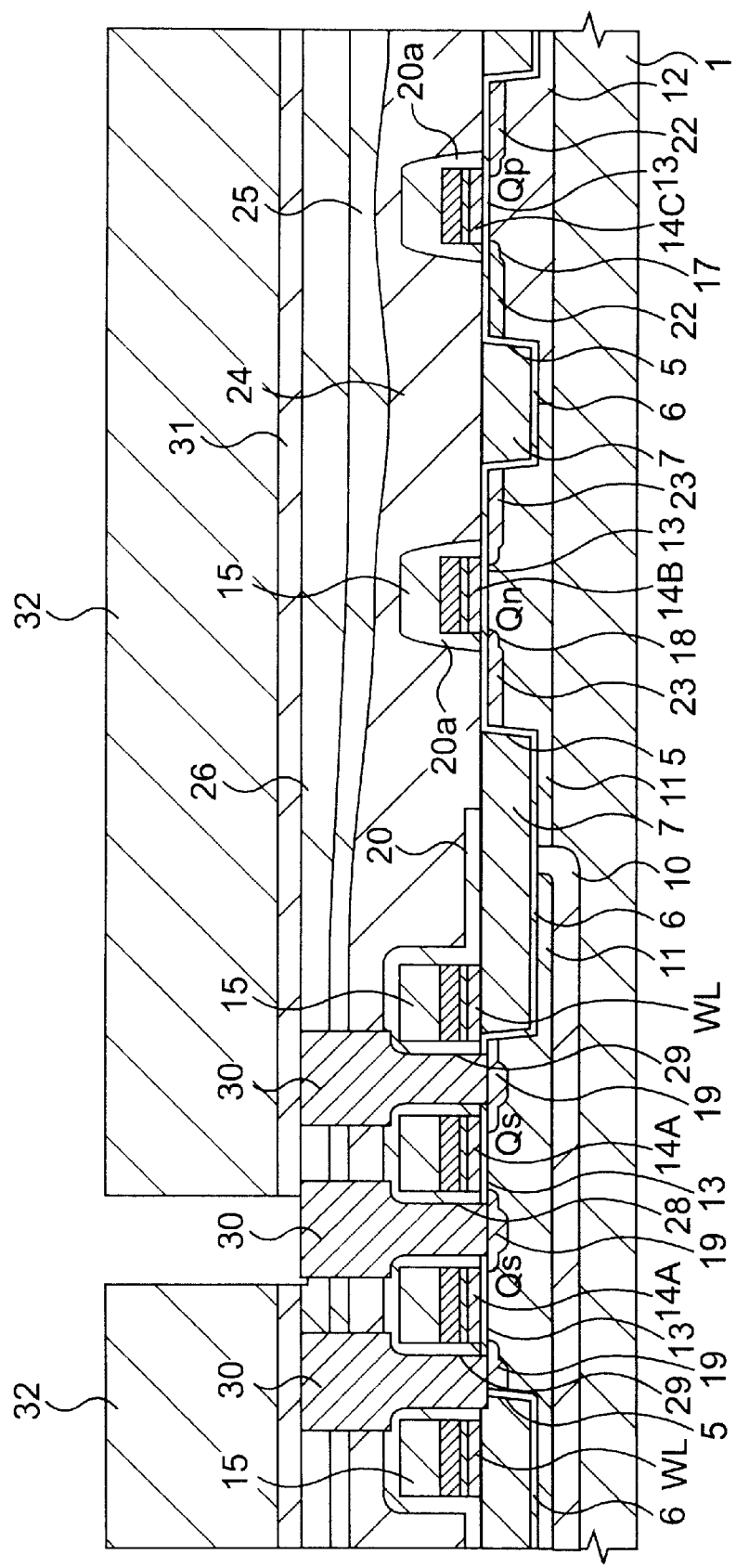
FIG. 20 is a cross-sectional view illustrating one example of the fabrication of the DRAM in the order of steps.
Figure 21:
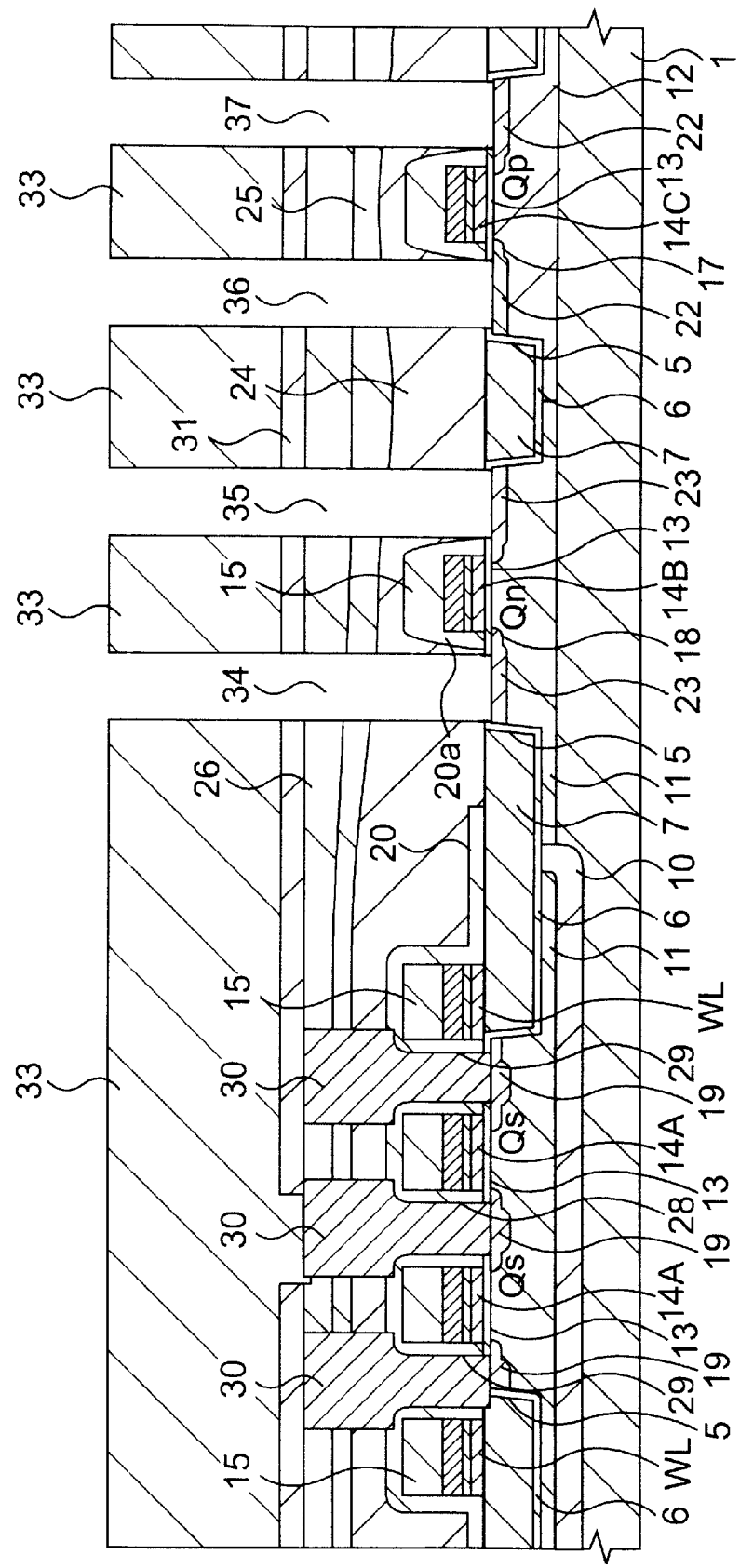
FIG. 21 is a cross-sectional view illustrating one example of the fabrication of the DRAM in the order of steps.

As illustrated in FIG. 20, by the dry etching with a photoresist film 32 as a mask, the silicon oxide film 31 on the contact hole 28 is removed, whereby the surface of the plug 30 is exposed. After removing the photoresist film 32, the silicon oxide films 31, 26,25, SOG film 24 and gate oxide film 13 in the region of the peripheral circuit are removed, as illustrated in FIG. 21, by dry etching with the photoresist film 33 as a mask, whereby contact holes 34, 35 are formed over the n-type semiconductor regions 23 (source, drain) of the n-channel type MISFETQn and contact holes 36 and 37 are formed over the p-type semiconductor regions 22 (source, drain) of the p-channel type MISFETQp.

Figure 22:
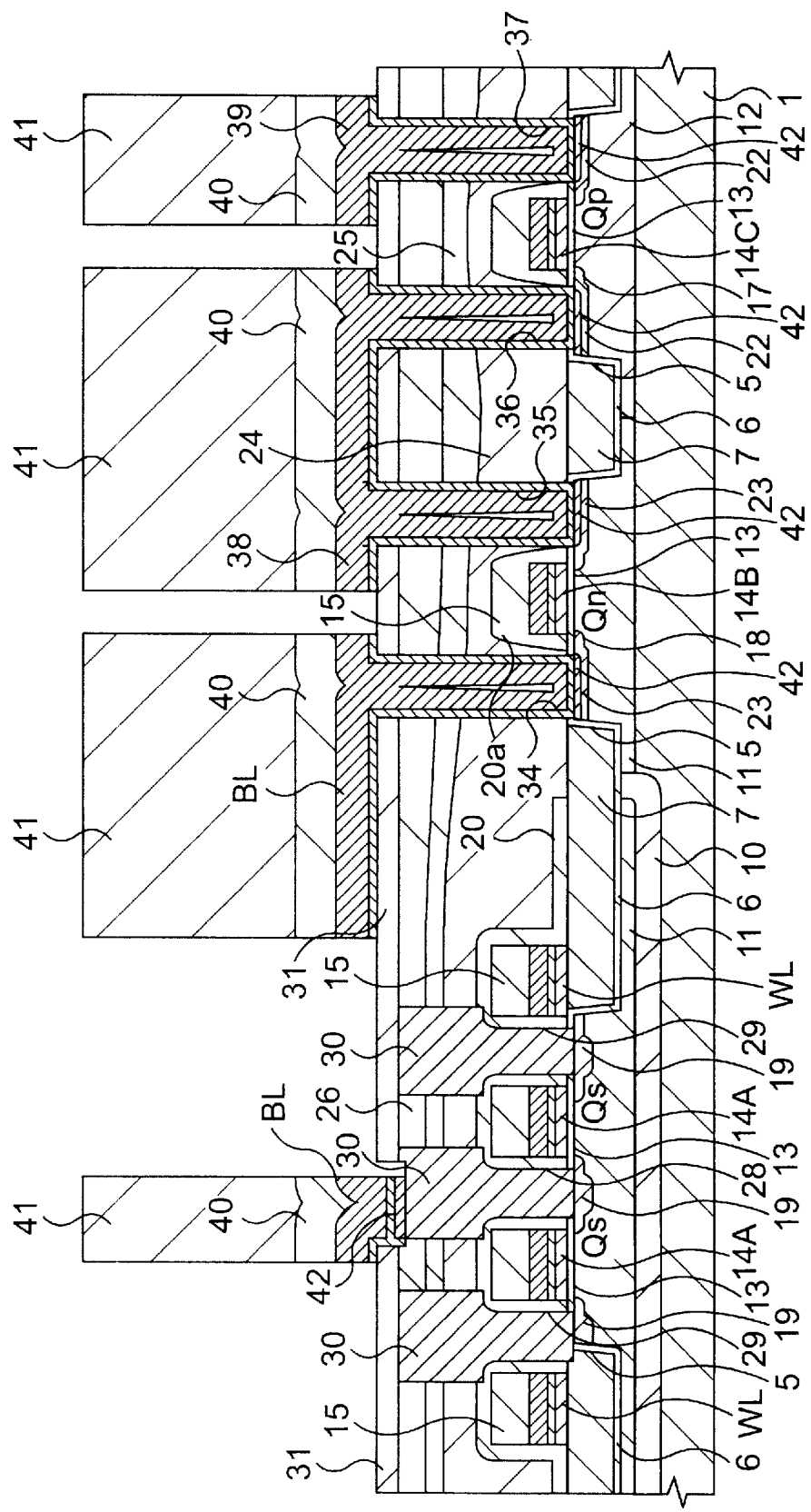
FIG. 22 is a cross-sectional view illustrating one example of the fabrication of the DRAM in the order of steps.

After removal of the photoresist film 33, a bit line BL and first interconnections 38, 39 of the peripheral circuit are formed, as illustrated in FIG. 22, above the silicon oxide film 31. For the formation of the bit line BL and first interconnections 38, 39, a Ti film of about 50 nm thick is deposited over the silicon oxide film 31 by sputtering, followed by heat treatment of the semiconductor substrate 1 at about 800-C. Then, a TiN film of about 50 nm thick is deposited over the Ti film by sputtering, followed by the deposition of a W film of about 150 nm thick and a silicon nitride film 40 of about 200 nm thick over the TiN film by CVD. Then, these films are patterned with a photoresist film 41 as a mask.

By the heat treatment of the semiconductor substrate 1 at about 800-C after the deposition of the Ti film over the silicon oxide film 31, the reaction between the Ti film and underlying Si film occurs, whereby $TiSi_2$ (titanium silicide) film 42 having a low resistance is formed on the surfaces of the n-type semiconductor regions 23 (source and drain) of the n-channel type MISFETQn, the surfaces of the p-type semiconductor regions 22 (source and drain) of the p-channel type MISFETQp and the surfaces of the plugs 30. This film makes reduces contact resistance of the interconnections (bit line BL, first interconnections 38, 39) to be connected with the n-type semiconductor regions 23, p-type semiconductor regions 22 and plug 30. By constituting the bit line BL from W film/TiN film/Ti film, its sheet resistance can be reduced to 2Ω/or less, to improve readout speed and write speed of information and to form the bit line BL and first interconnections 38, 39 of the peripheral circuit in one step simultaneously, whereby the fabrication process of a DRAM can be shortened. When the first interconnections (38, 39) of the peripheral circuit and the bit line BL are formed in one interconnection, the aspect ratio of each of the contact holes (34 to 37) which connect the MISFETs (n-channel type MISFETQn, p-channel type MISFETQp) of the peripheral circuit with the first interconnection are decreased compared with the case where the first interconnection is formed from an AL interconnection above the memory cell, resulting in an improvement of the connection reliability of the first interconnection.

The bit lines BL are formed to make the distance therebetween larger than their width in order to reduce the parasitic capacity formed between two adjacent bit lines BL, thereby improving the readout speed and write speed of the information.

There is a possibility that deterioration of the $TiSi_2$ film 42 occurs by the heat treatment. As the heat treatment which is a cause for the deterioration, a formation step of a capacitor insulating film of the capacitor for information storage, which will be described later, can be considered. As will be described later, however, the formation step of the capacitor insulating film is conducted at a low temperature in this embodiment so that the inconvenience of $TiSi_2$ film 42 such as an increase in the connection resistance due to the deterioration by the heat treatment does not occur.

Figure 23:
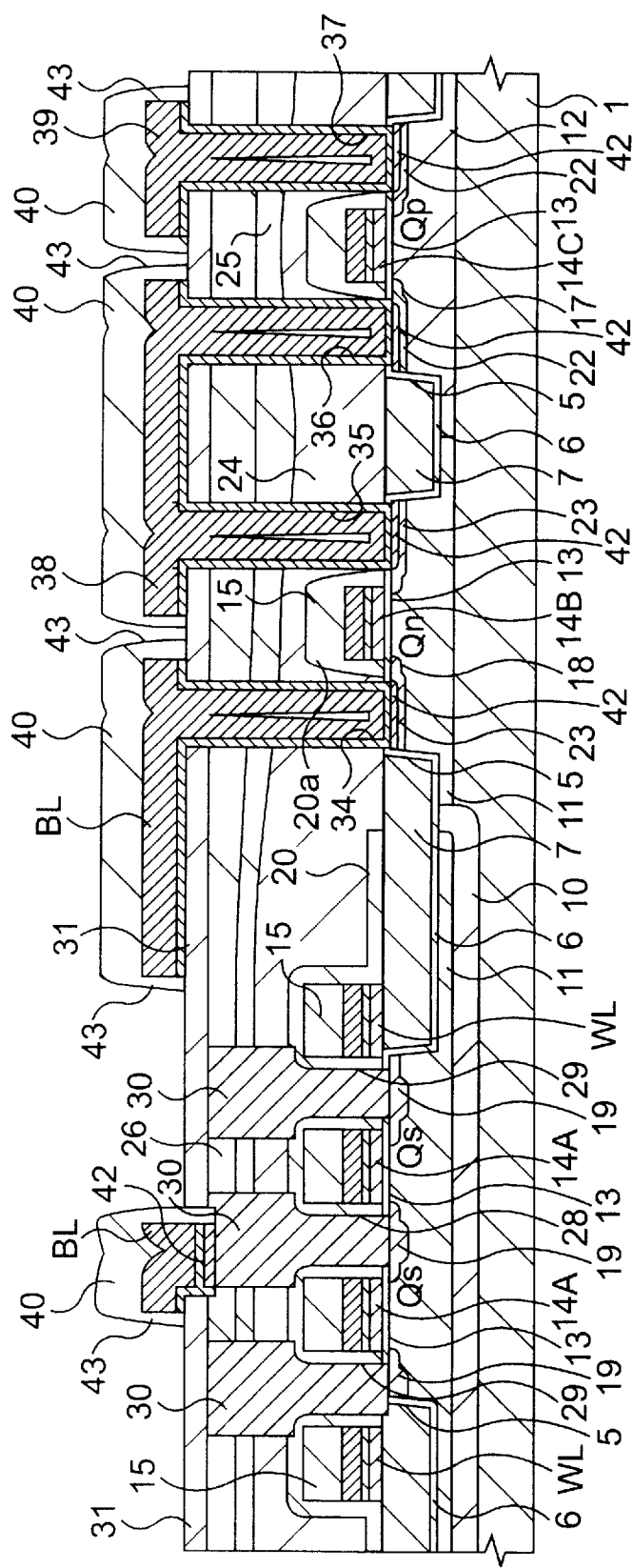
FIG. 23 is a cross-sectional view illustrating one example of the fabrication of the DRAM in the order of steps.

After the removal of the photoresist film 41, a sidewall spacer 43 is formed, as illustrated in FIG. 23, on each of the sidewalls of the bit line BL and the first interconnections 38, 39. This sidewall spacer 43 is formed by depositing a silicon nitride film on the bit line BL and first interconnections 38, 39 by CVD and then subjecting this silicon nitride film to anisotropic etching.

Figure 24:
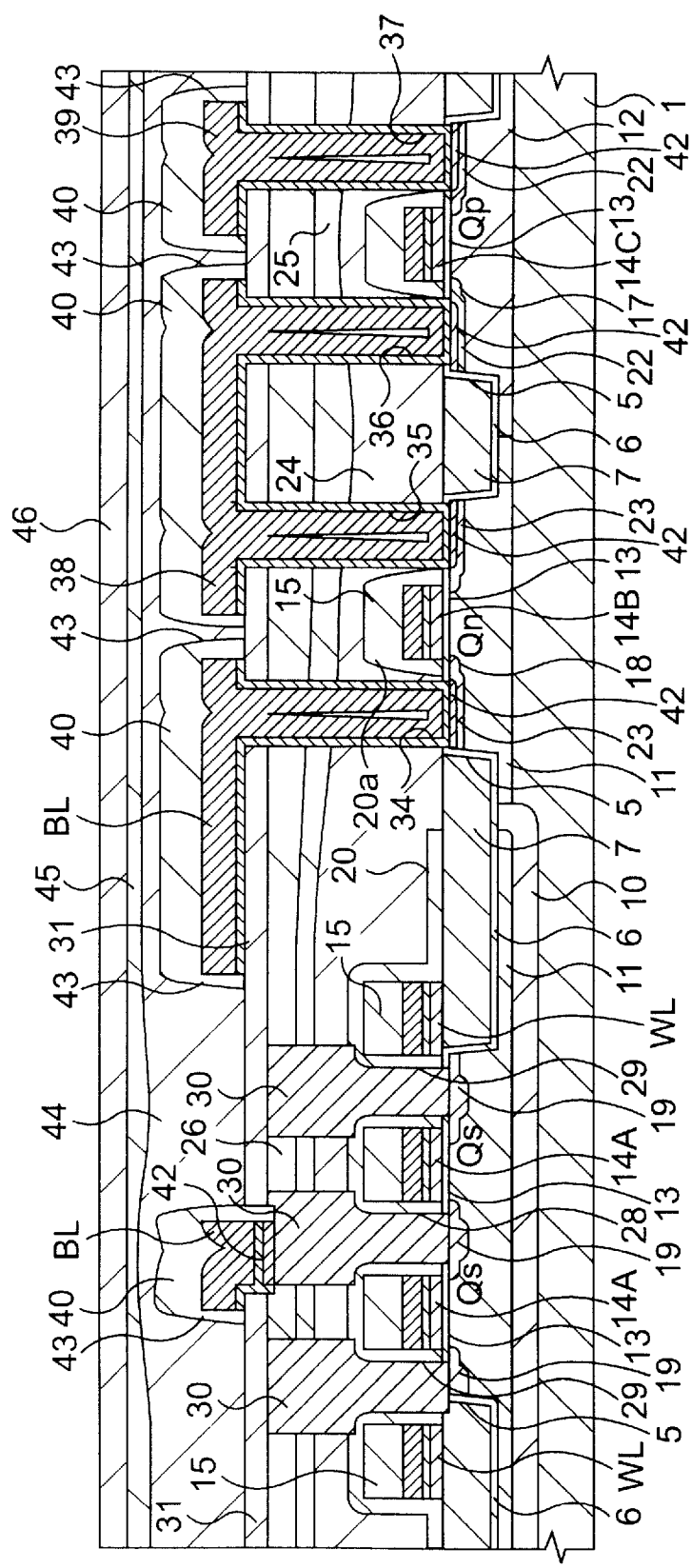
FIG. 24 is a cross-sectional view illustrating one example of the fabrication of the DRAM in the order of steps.

As illustrated in FIG. 24, a SOG film 44 of about 300 nm thick is spin coated above the bit line BL and interconnections 38, 39, followed by heat treatment of the semiconductor substrate 1 at 800-C for about 1 minute for sintering the SOG film 44. The SOG film 44 has high reflow properties and excellent gap filling properties between minute interconnections compared with a BPSG film so that with the film, gaps between the adjacent bit lines BL which are miniaturized even to the extent of resolution limit of photolithography can be embedded well. In addition, reflow properties of the SOG film 44 are available without a heat treatment at high temperatures for long hours, which however is necessary in the case of the BPSG film, so that thermal diffusion of impurities contained in the source and drain of the MISFETQs for the selection of a memory cell which are formed below the bit line BL, or in the source and drain of the MISFET (n-channel type MISFETQn, p-channel type MISFETQP) of the peripheral circuit can be prevented and shallow junction can therefore be attained. Moreover, the SOG film suppresses the deterioration of the metal (W film) which constitutes each of the gate electrode 14A (word line WL) and gate electrodes 14B, 14C, leading to performance heightening of MISFETs which constitute the memory cell and peripheral circuit of the DRAM. Furthermore, the film also suppresses the deterioration of each of the Ti film, TiN film and W film which constitute the bit line BL and first interconnections 38, 39, thereby attaining a reduction in the interconnection resistance.

After the deposition of a silicon oxide film 45 of about 600 nm thick over the SOG film 44, this silicon oxide film 45 is polished by CMP to flatten its surface. This silicon oxide film 45 is deposited, for example, by plasma CVD using ozone ($O_3$) and tetraethoxysilane (TEOS) as source gases.

In this embodiment, as described above, the SOG film 44 has good flattening properties even right after the film formation is applied above the bit line BL and first interconnections 38, 39. The silicon oxide film 45 formed over the SOG film is flattened by CMP, whereby the gap filling properties in a minute gap between the adjacent bit lines BL show improvement and at the same time, the insulation film above the bit line BL and first interconnection layers 38, 39 are flattened. In addition, a heat treatment at high temperatures for long hours is not carried out so that not only the performance can be heightened by preventing the deterioration of the properties of a MISFET which constitutes the memory cell and peripheral circuit, but also resistance of each of the bit line BL and first interconnections 38, 39 is reduced.

Over the silicon oxide film 45, a silicon oxide film 46 of about 100 nm thick is then deposited. This silicon oxide film 46 is deposited to repair minute scars on the surface of the silicon oxide film 45 formed when polished by CMP. The silicon oxide film 46 is deposited, for example, by plasma CVD using ozone ($O_3$) and tetraethoxysilane (TEOS) as source gases.

Figure 25:
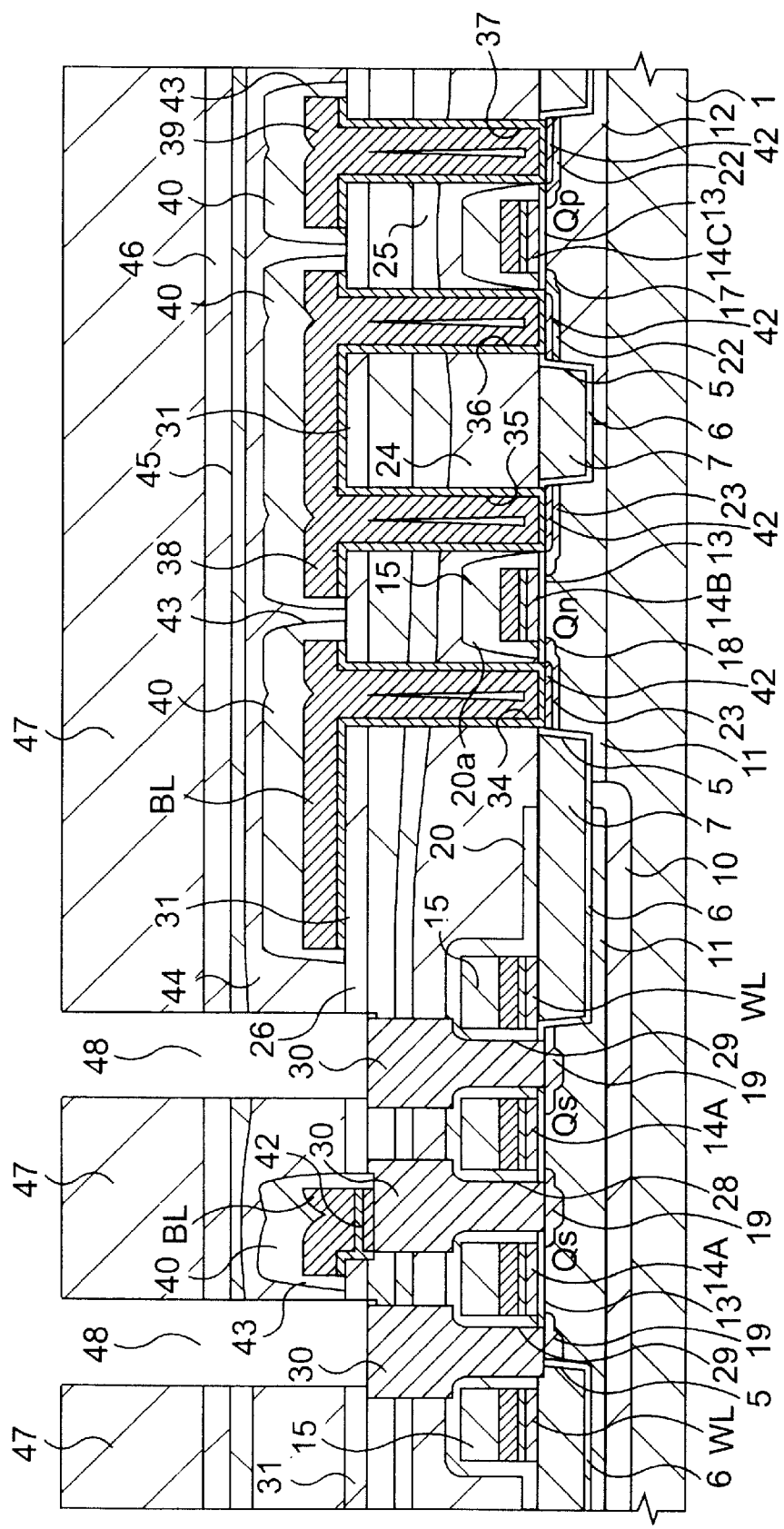
FIG. 25 is a cross-sectional view illustrating one example of the fabrication of the DRAM in the order of steps.

As illustrated in FIG. 25, a through hole 48 which reaches the surface of the plug 30 is formed by removing the silicon oxide films 46, 45, SOG film 44 and silicon oxide film 31 above the contact hole 29 through dry etching with a photoresist film 47 as a mask. This etching is carried out under the condition that the etching rate of the silicon nitride film becomes smaller than that of the silicon oxide films 46, 45, 31 and SOG film 44 to prevent deep etching of the silicon nitride film 40 or sidewall spacer 43 above the bit line BL even if misalignment between the through hole 48 and bit line BL appears. In this manner, the through hole 48 is formed in self alignment with the bit line BL.

After removal of the photoresist film 47, dry etching residue, photo resist residue and the like on the surface of the plug 30 exposed on the bottom of the through hole 48 are removed using an etchant such as hydrofluoric acid\ammonium fluoride mixture. At this time, the SOG film 44 appearing on the sidewall of the through hole 48 is exposed to the etchant, but a large undercut is not formed on the sidewall of the through hole 48 by this wet etching treatment because the etching rate of the SOG film 44 by a hydrofluoric type etchant is decreased by the above-described sintering at about 800-C. A short between the plug to be embedded inside of the through hole 48 in the subsequent step and the bit line BL is prevented without failure. In addition, the plug and bit line BlL are spaced sufficiently, whereby an increase in the parasitic capacitance of the bit line BL is controlled.

Figure 26:
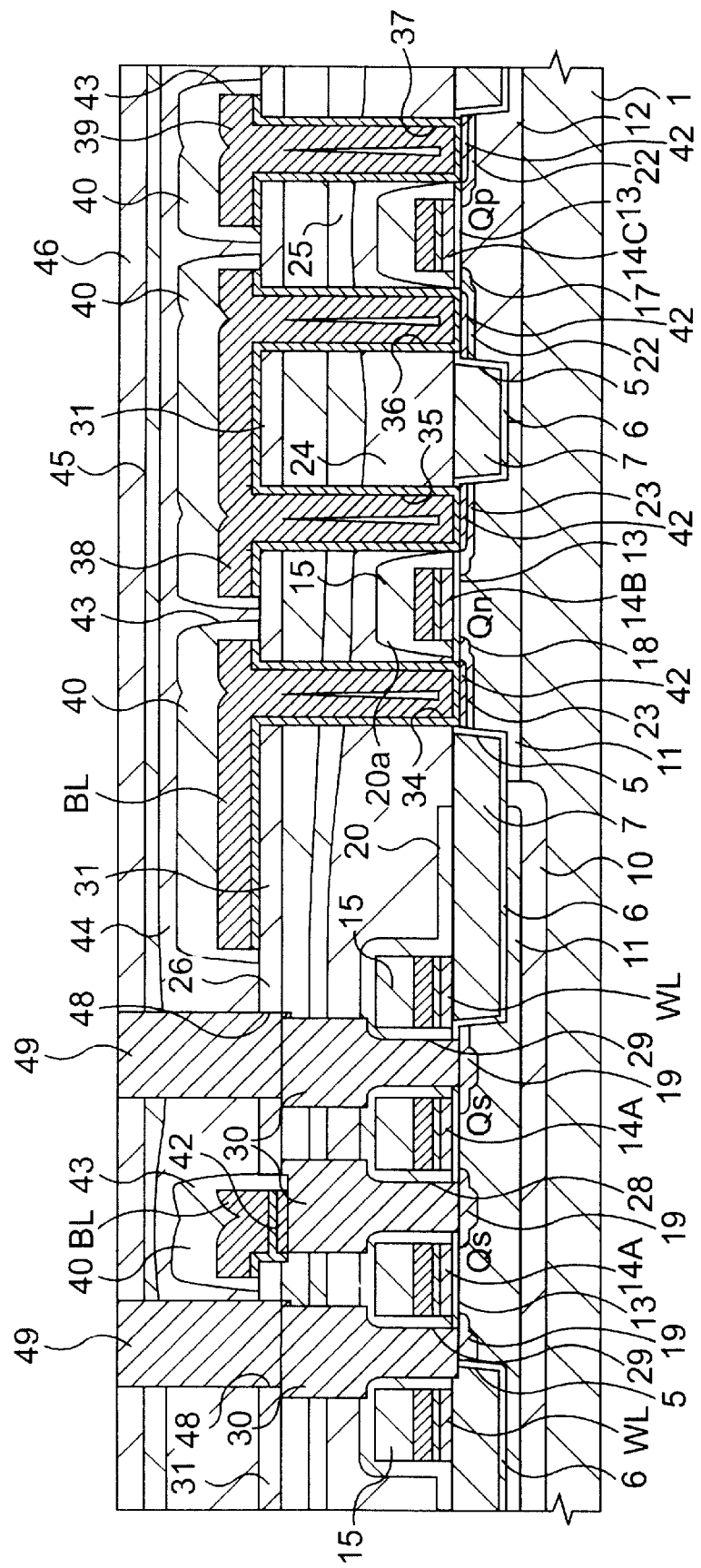
FIG. 26 is a-cross-sectional view illustrating one example of the fabrication of the DRAM in the order of steps.

As illustrated in FIG. 26, a plug 49 is formed inside of the through hole 48. There is no particular limitation imposed on the material of the plug 49 insofar as it is a conductive member. Examples include polycrystalline silicon and metallic compounds, such as titanium nitride film.

Figure 27:
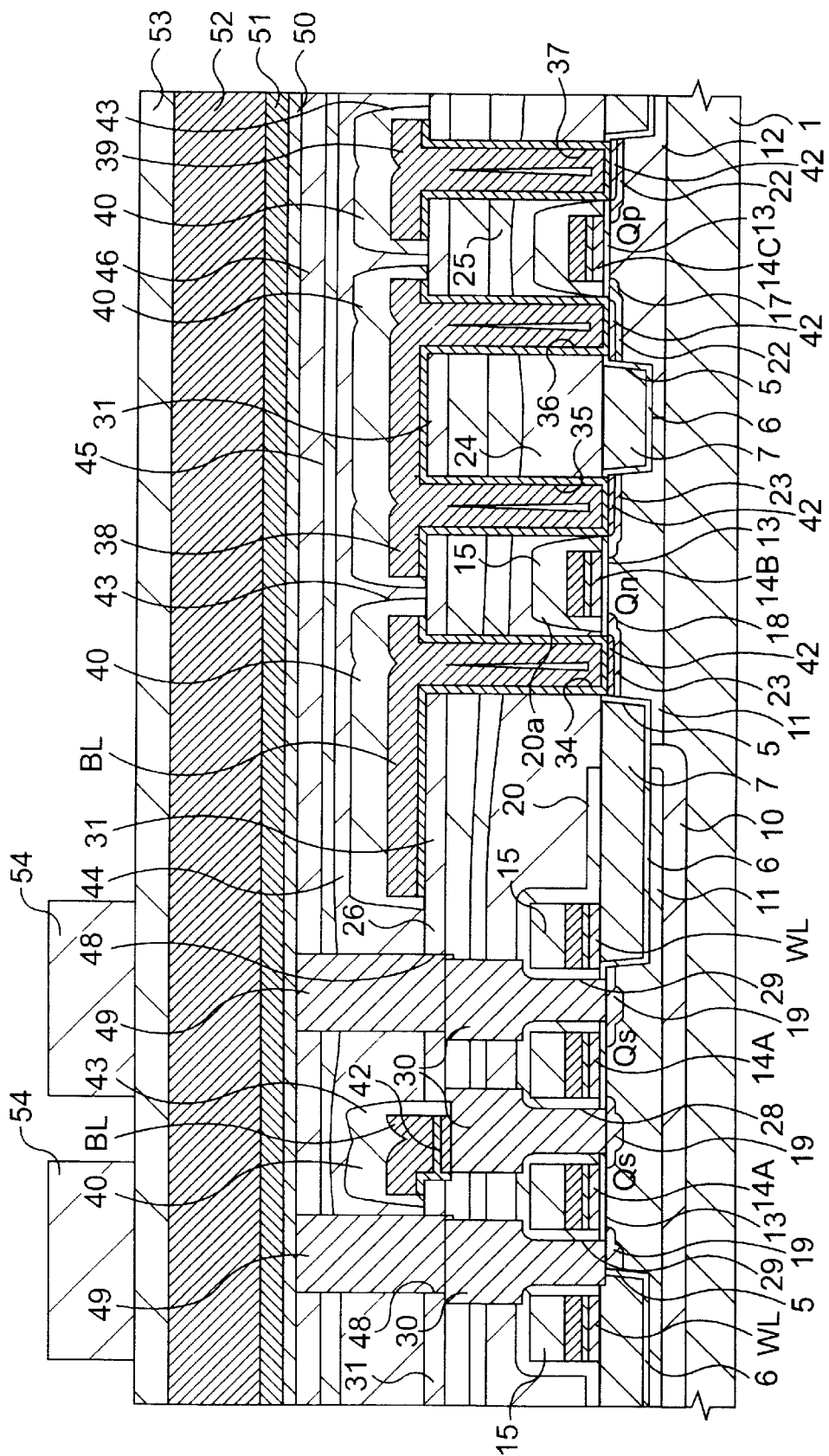
FIG. 27 is a cross-sectional view illustrating one example of the fabrication of the DRAM in the order of steps.

As illustrated in FIG. 27, above the plug 49 and silicon oxide film 46, a titanium nitride film 50, ruthenium film 51, ruthenium dioxide film 52 and silicon oxide film 53 are stacked successively. The total film thickness of the ruthenium film 51 and ruthenium dioxide film 52 is 0.45 um. The titanium nitride film 50, ruthenium film 51, ruthenium dioxide film 52 and silicon oxide film 53 are deposited, for example, by CVD or sputtering. Although the ruthenium film 51 and ruthenium dioxide film 52 will become lower electrodes of the capacitor by the processing described later, the ruthenium dioxide film 52 has such a function mainly. The titanium nitride film 50 is formed as a layer for the adhesion of the silicon oxide film 46 and ruthenium film 51 and it acts as an etching stopper upon the etching of the ruthenium film 51 and the ruthenium dioxide, film 52, which will be described later. The ruthenium film 51 serves as a layer for the adhesion of the titanium nitride film 50 and the ruthenium dioxide film 52. The silicon oxide film 53 will become, as will be described later, an etching mask upon etching of the ruthenium film 51 and the ruthenium dioxide film 52.

Over the silicon oxide film 53, resist films 54 are formed. These resist films 54 are formed in a region where the patterns of the ruthenium film 51 and the ruthenium dioxide film 52, which will become lower electrodes later, remain. These resist films 54 are formed so that the pattern (lower electrode pattern) of the ruthenium film 51 and ruthenium dioxide film 52, which will be described later, will be 0.13 um×0.39 um and the distance between the adjacent patterns will be 0.13 um.

Figure 33:
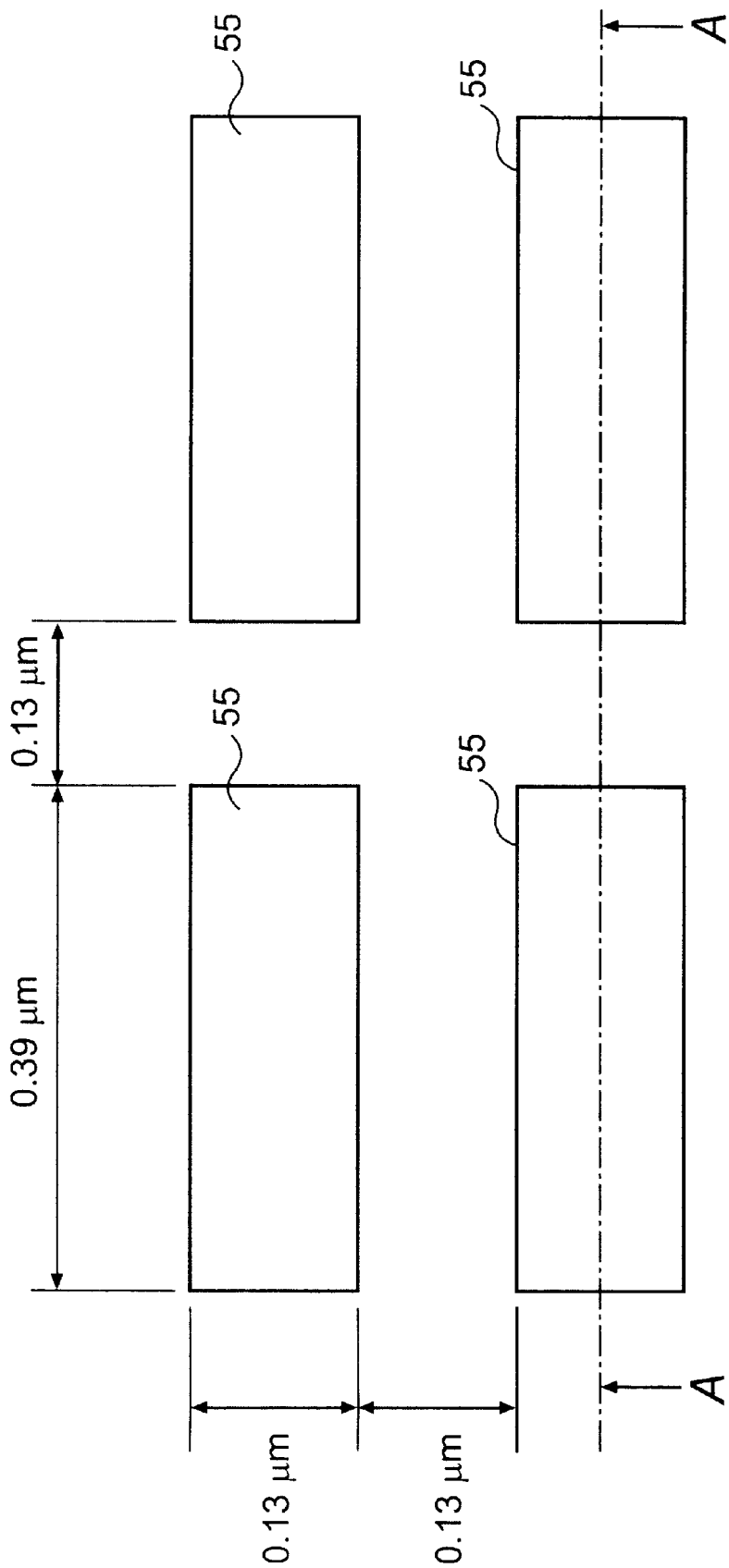
FIG. 33 is a cross-sectional view illustrating one example of the fabrication of the DRAM in the order of steps.

In FIG. 27 and drawings thereafter, the cross section of each of the resist film 54 and the lower electrode (ruthenium film 51 and ruthenium dioxide film 52) formed through the resist film 54 in the direction of a long side (cross-section along line A—A in FIG. 33). The line portion of each of the resist film 54 and the lower electrode pattern is illustrated wider than the space portion. In the cross section (cross section in the direction vertical to the line A—A in FIG. 33) in the direction of a short side, the width of each of the line portion and the space portion is 0.13 um. Thus they are formed by an equal line and space pattern. The line and space in this drawing is illustrated at a ratio different from the practical ratio for convenience sake. The aspect ratio (ratio of the height of the lower electrode to the space width) of the lower electrode is also illustrated at a ratio different from the practical ratio for convenience sake.

Figure 28:
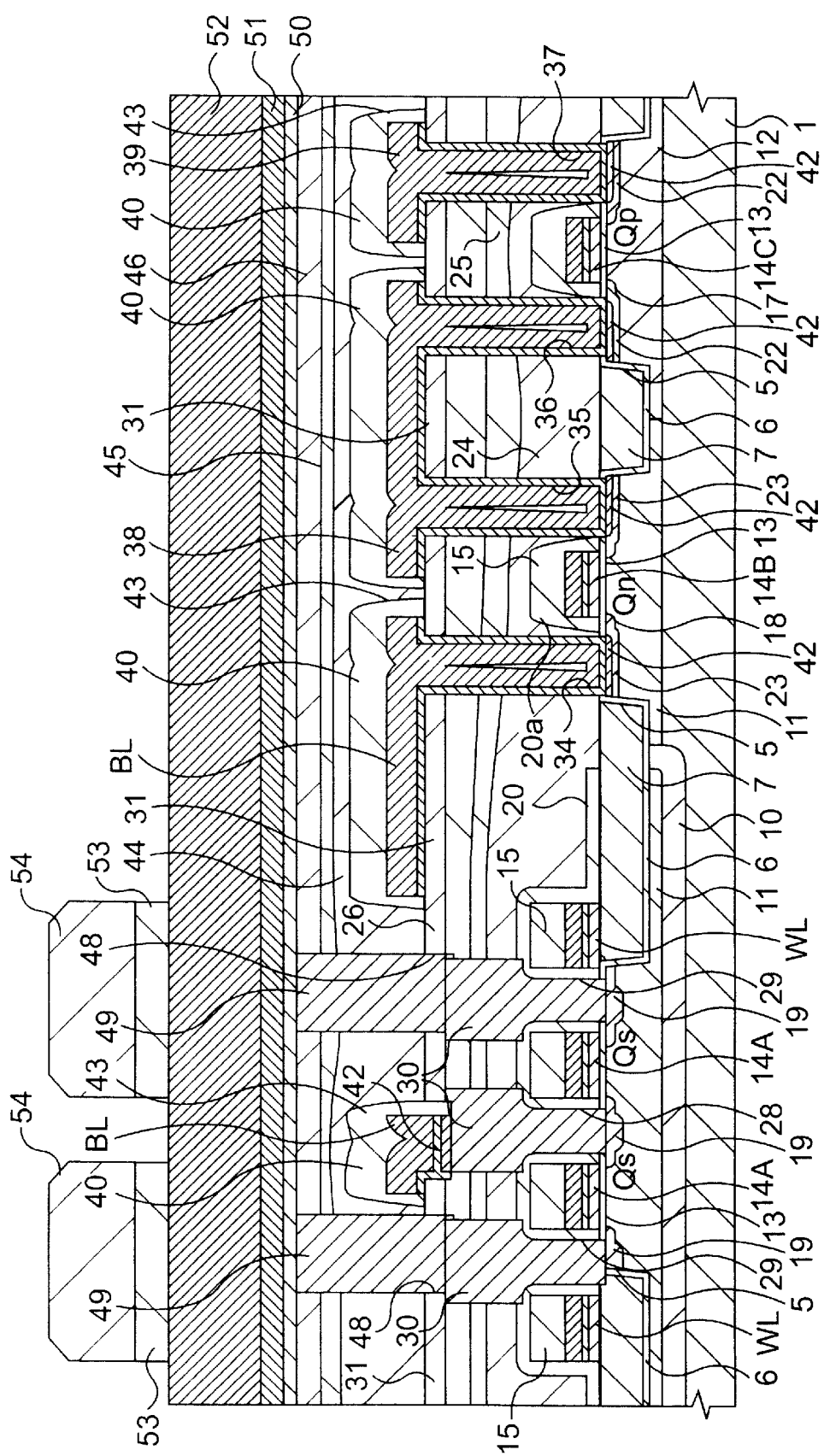
FIG. 28 is a cross-sectional view illustrating one example of the fabrication of the DRAM in the order of steps.

As illustrated in FIG. 28, the silicon oxide film 53 is etched with the resist film 54 as a mask. The previously described etching can be used, but not only this device but also another etching device can be used. The previously described etching may be employed, but the invention is not particularly limited thereto. The film may be etched by ordinarily employed RIE, which uses a fluorine gas. Etching of this silicon oxide film 53 forms a facet in the resist film 54.

Figure 29:
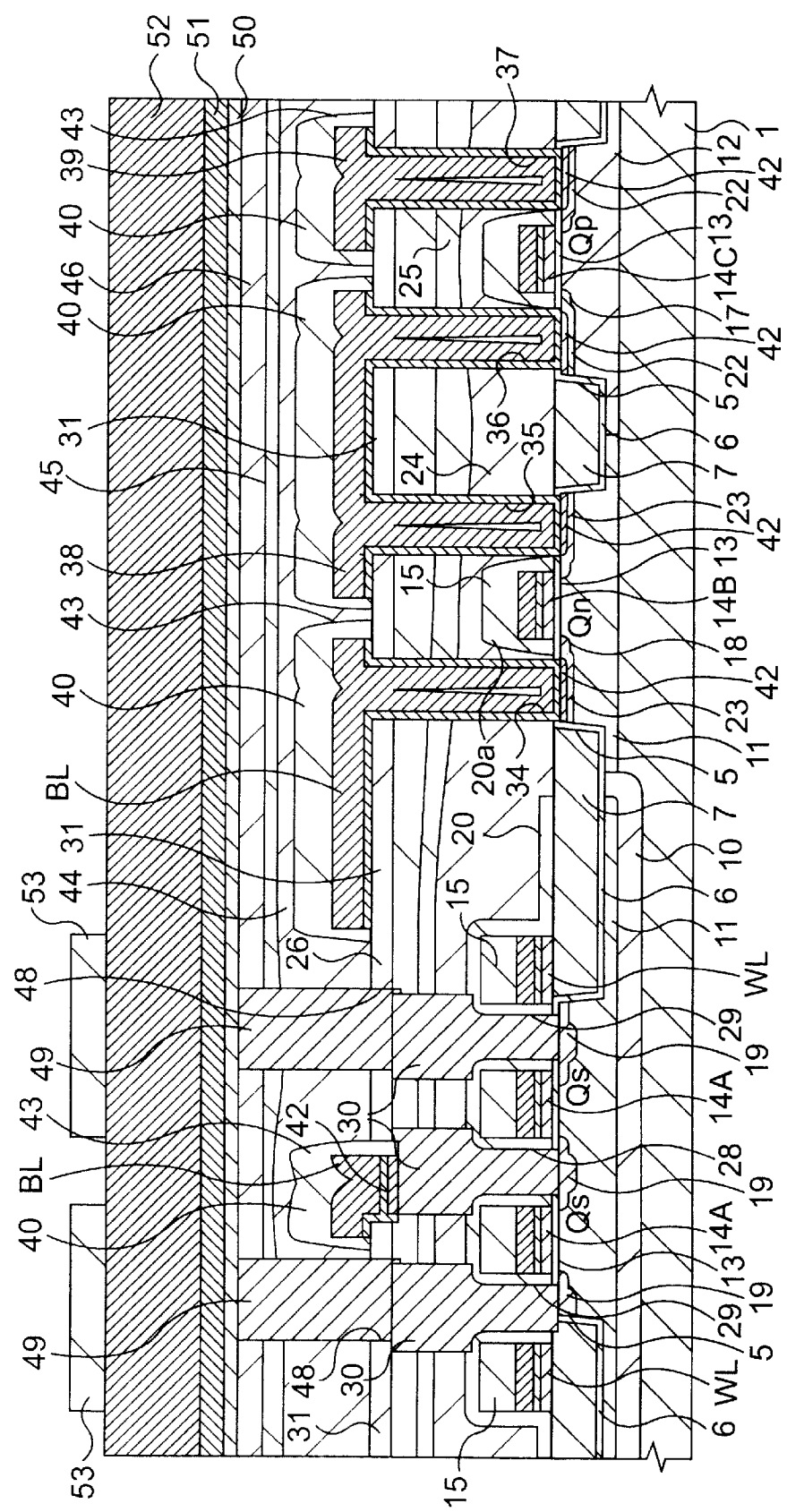
FIG. 29 is a cross-sectional view illustrating one example of the fabrication of the DRAM in the order of steps.

As illustrated in FIG. 29, the resist film 54 is then removed. The removal of this resist film 54 can be carried out, for example, by ashing with oxygen plasma. Also in this case, the previously described etching device can be employed, but not only this device but also an ordinarily employed asher can be used. By the removal, the patterned silicon oxide film 53 is formed and it is usable as an etching mask upon etching of the ruthenium film 51 and ruthenium dioxide film 52 in the subsequent step. As will be described later, an oxygen gas is used as an etching gas of the ruthenium film 51 and ruthenium dioxide film 52, so that an oxidation-resistant mask is necessary. A mask including the silicon oxide film 53 satisfies this requirement.

Figure 30:
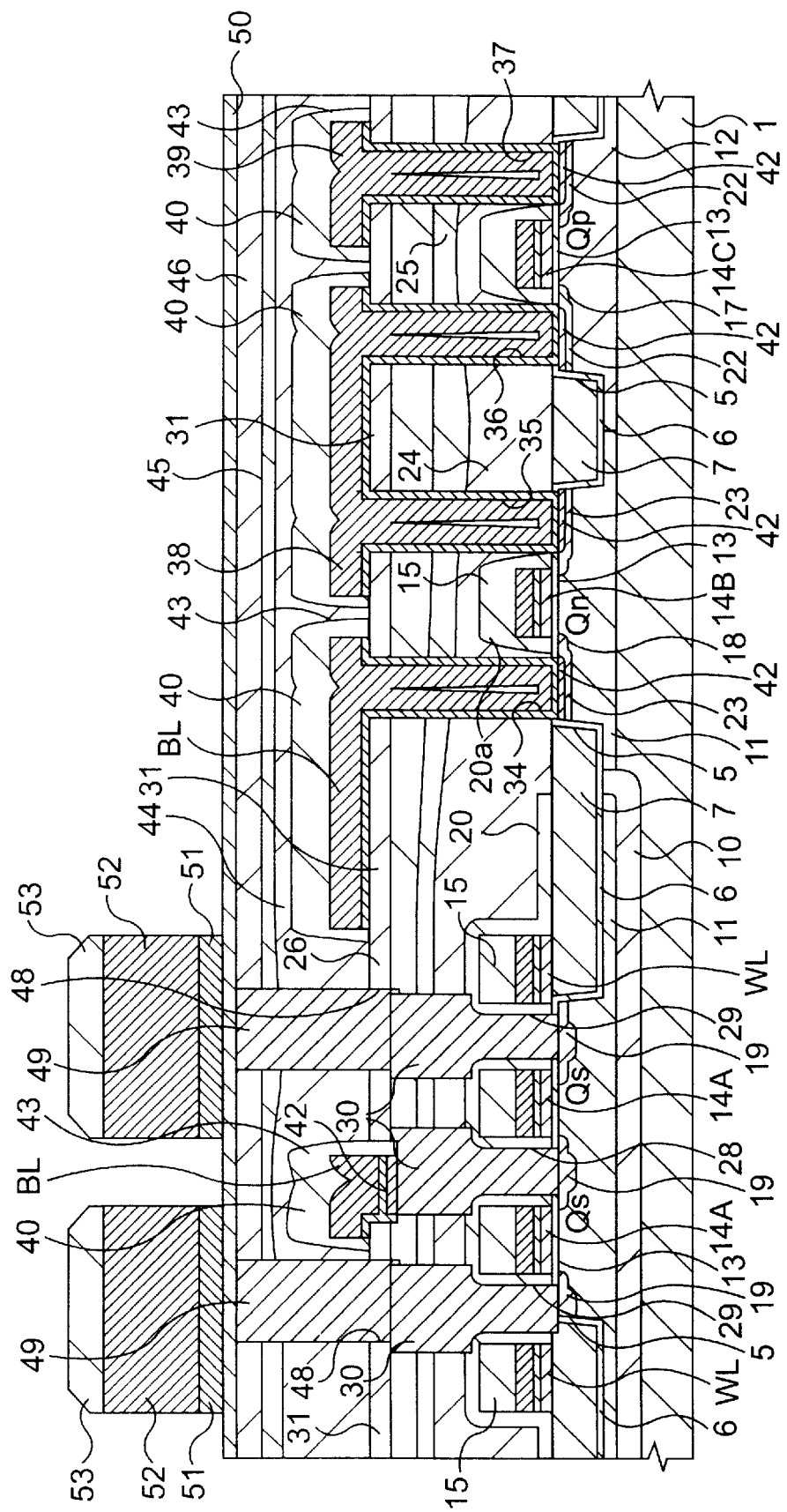
FIG. 30 is a cross-sectional view illustrating one example of the fabrication of the DRAM in the order of steps.

As illustrated in FIG. 30, the ruthenium dioxide film 52 and the ruthenium film 51 are etched. Etching is carried out in a similar manner to that. Specifically, etching is carried using an etching device as previously described and with: pressure of 15 mTorr, plasma source power of 500 W, RF bias power of 200 W, oxygen flow of 715 sccm and chlorine flow of 80 sccm, total flow of about 800 sccm, gas residence time of 49.3 msec and over etching of 100%. As described, anisotropy of etching attained under the above-described conditions is 89 degrees in terms of a taper angle. In other words, the ruthenium dioxlide film 52 and ruthenium film 51 are etched almost vertically and therefore ideally. Incidentally, the etching speed at this time is 112 nm/min, which is a value usable for mass production. By this etching, a facet is formed on the corneal part of the silicon oxide film 53 but it does not adversely affect the etching characteristics as above.

Figure 31:
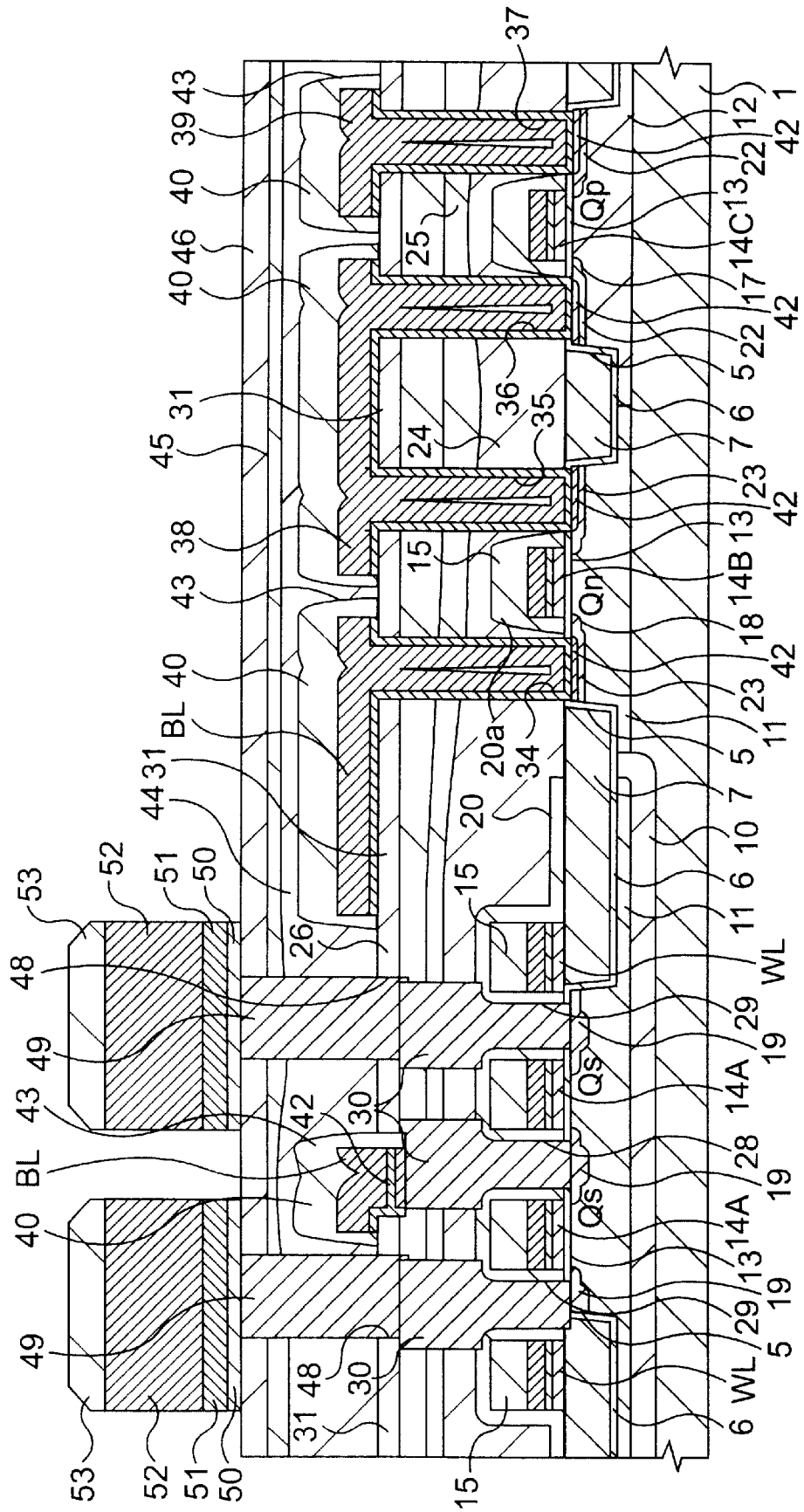
FIG. 31 is a cross-sectional view illustrating one example of the fabrication of the DRAM in the order of steps.
Figure 32:
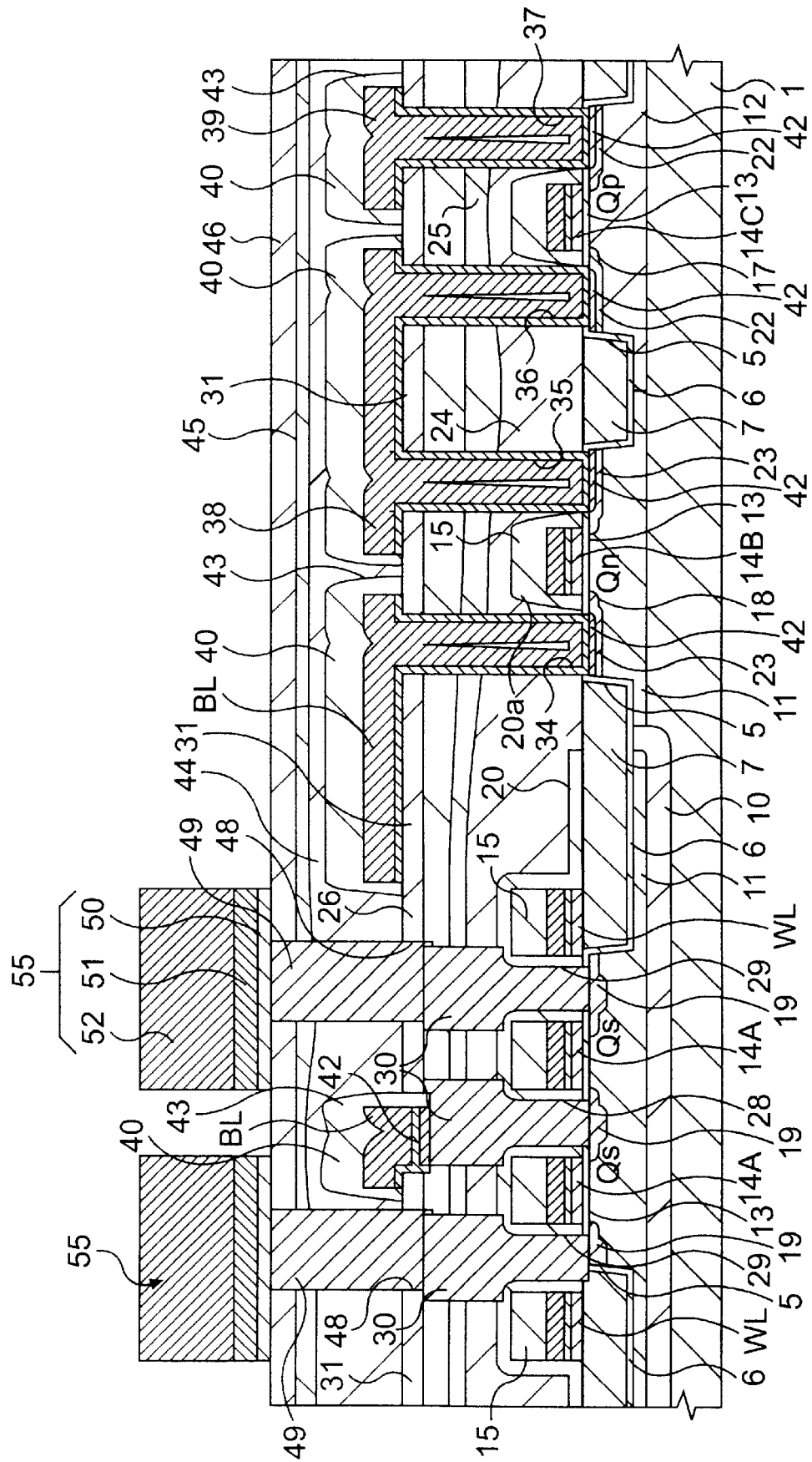
FIG. 32 is a cross-sectional view illustrating one example of the fabrication of the DRAM in the order of steps.

As illustrated in FIG. 31, the titanium nitride film 50 is etched after changing the etching gas to a fluorine gas. Then, as illustrated in FIG. 32, the silicon oxide film 53 is removed using a fluorine gas. In this manner, a lower electrode 55 is formed of the patterned titanium nitride film 50, ruthenium film 51 and ruthenium dioxide film 52. A part of the plane pattern of the lower electrode 55 thus formed is shown in FIG. 33. As illustrated in the drawing, the lower electrode 55 has a rectangular pattern of 0.13 um×0.39 um and the distance between adjacent patterns is as minute as 0.13 um. The practical pattern shape of the lower electrode is not exactly rectangular but it has somewhat roundness at the corneal parts or is an oblong shape. Here, for simplification, the lower electrode is illustrated as that having a rectangular shape. Concerning the cross-sectional shape, the taper angle is about 89 degrees and exactly speaking, not 90 degree, as described above. For simplification, it is illustrated as right angle (90 degree) in the cross sectional view. The cross-sectional view of the memory cell region in this example shows the cross-section along line A—A in FIG. 33, that is, the cross section of the lower electrode 55 in the direction of a long side. When the taper angle, aspect ratio and pattern width are described without a particular specification to the direction, they are in the direction of the cross section wherein the pattern width is narrow. Unless otherwise particularly specified, in FIG. 33, reference is made on the direction parallel to the direction of a short side of the lower electrode 55.

Figure 34:
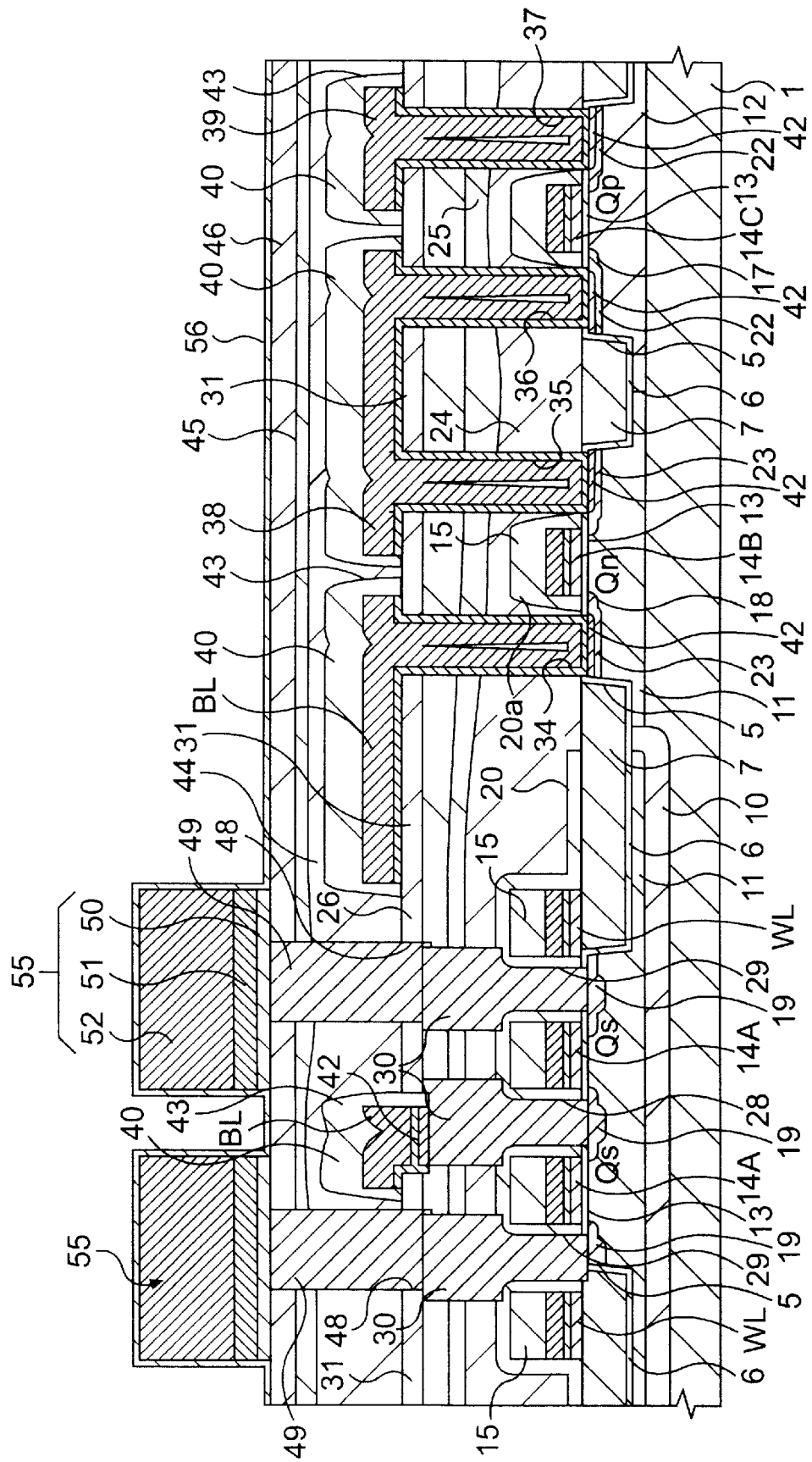
FIG. 34 is a cross-sectional view illustrating one example of the fabrication of the DRAM in the order of steps.

As illustrated in FIG. 34, a BST film 56 is deposited as a capacitor insulating film. After deposited by CVD, this BST film 56 is heat treated in an oxygen atmosphere and modified to remove oxygen defects. The interface between the BST film 56 and the lower electrode 55 is exposed to an oxidizing atmosphere upon the deposition or modification of the BST film 56, but there is no potential danger of it being oxidized further, because ruthenium dioxide is employed. The BST film 56 is formed by CVD so that even on the lower electrode 55, which has been miniaturized and has a high aspect ratio as in this embodiment, a uniform film is formed. Instead of the BST film 56, another high dielectric film such as tantalum oxide film, PZT or PLZT may be used.

Figure 35:
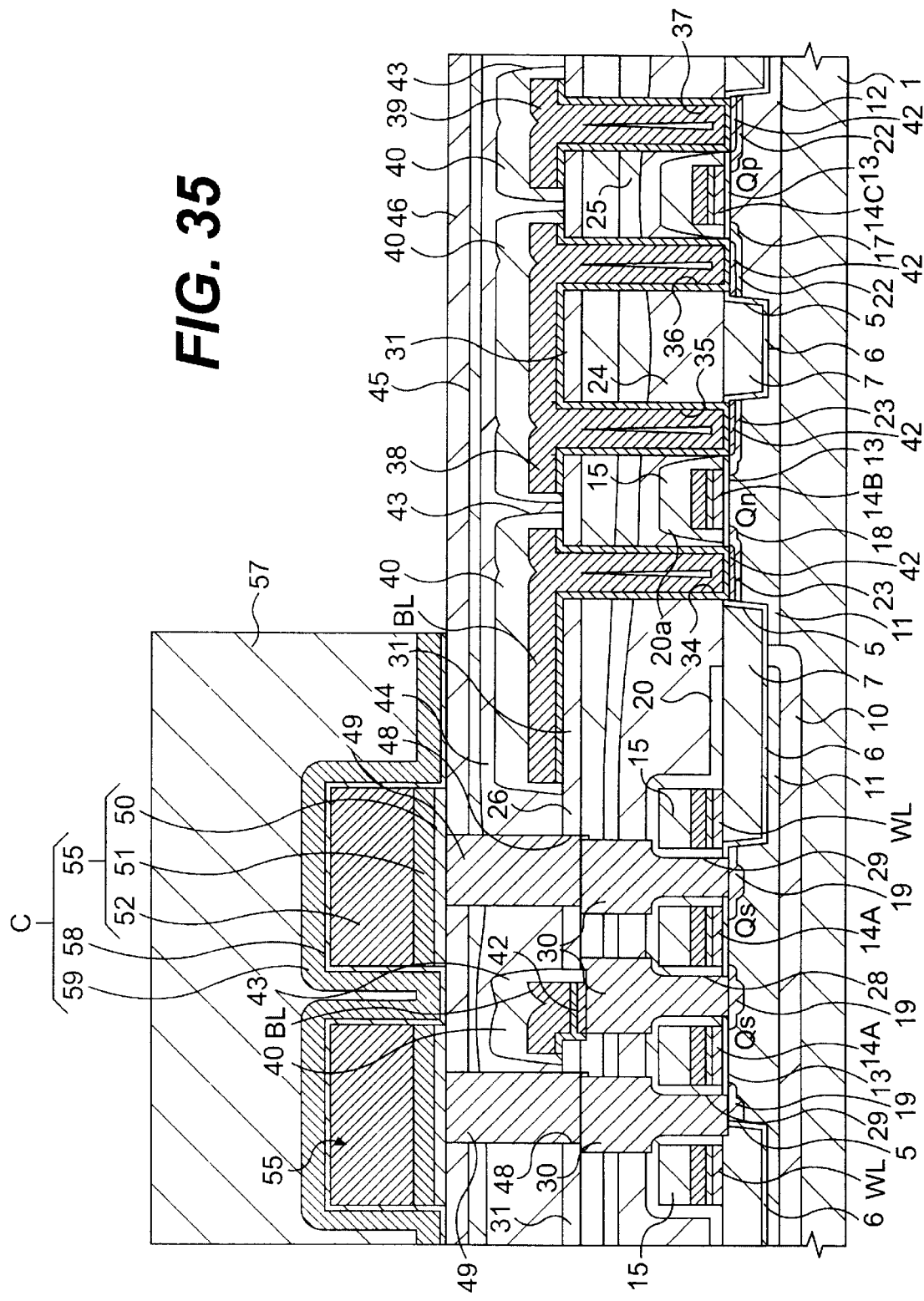
FIG. 35 is a cross-sectional view illustrating one example of the fabrication of the DRAM in the order of steps.

Over the BST film 56, a ruthenium dioxide film is deposited. Then, as illustrated in FIG. 35, a photoresist film 57 is formed on the titanium nitride film and with this photoresist film 57 as a mask, the ruthenium dioxide film and BST film 56 are etched, whereby a capacitor insulating film 58 and upper electrode 59 are formed. The ruthenium dioxide film is deposited, for example, by sputtering. In this manner, a capacitor C for the information storage comprising the lower electrode 55 formed of ruthenium and ruthenium dioxide, the capacitor insulating film 58 formed of the BST film and the upper electrode 59 formed of ruthenium dioxide are formed, whereby a memory cell of a DRAM comprising MISFETQs for the selection of a memory cell and the capacitor C for the information storage connected in series therewith is completed.

On the upper electrode 59, a proper barrier metal may be formed. As a material constituting the upper electrode 59, a titanium nitride film, ruthenium film or tungsten film may be used instead of the ruthenium dioxide film.

Figure 36:
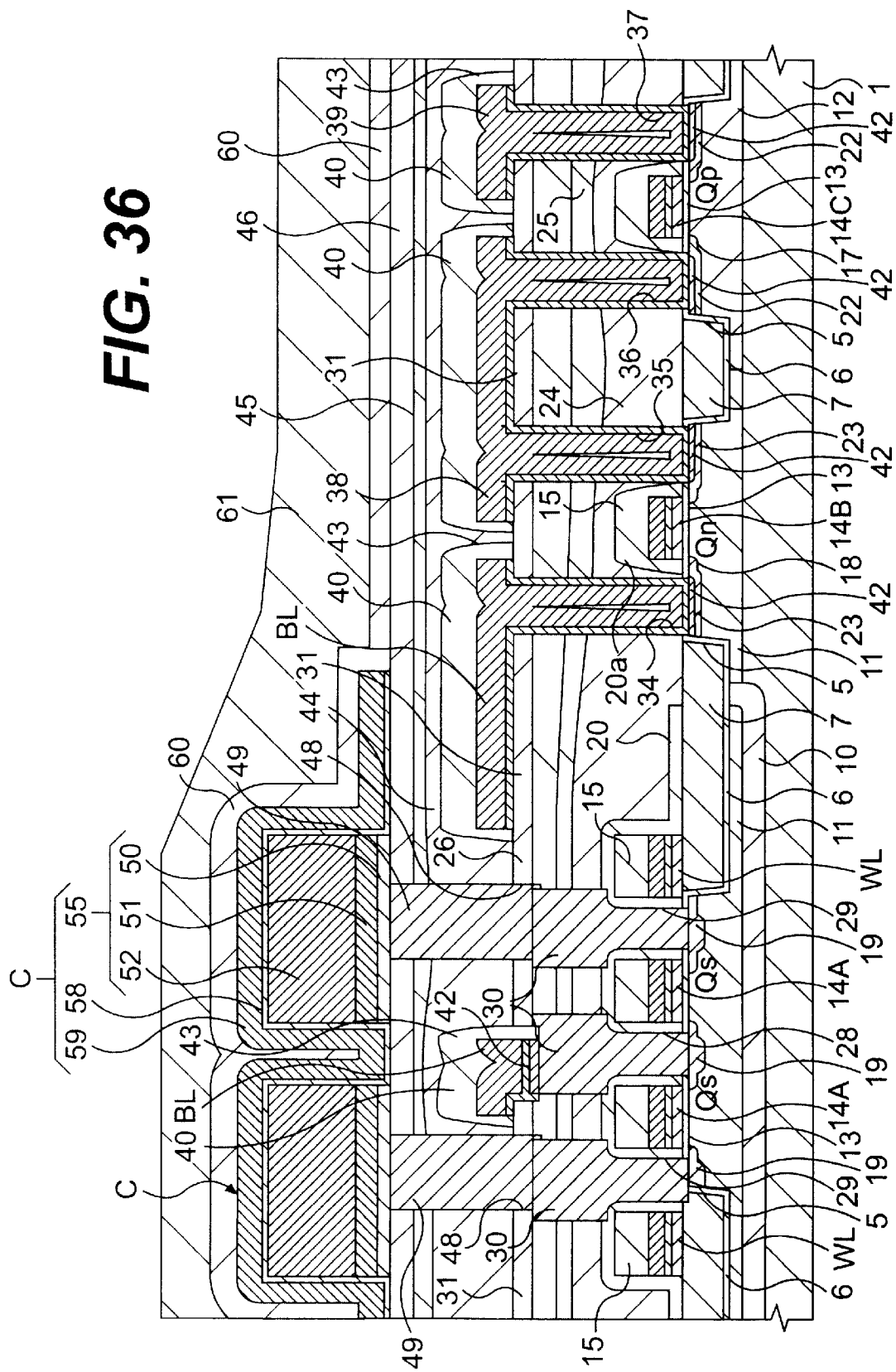
FIG. 36 is a cross-sectional view illustrating one example of the fabrication of the DRAM in the order of steps.

After the removal of the photoresist film 57, as illustrated in FIG. 36, a silicon oxide film 60 of about 40 nm thick is deposited on the capacitor C for the information storage. This silicon oxide film 60 is deposited, for example, by plasma CVD using ozone ($O_3$) and tetraethoxysilane (TEOS) as source gases. A SOG film 61 is then applied to the silicon oxide film, whereby the region having the memory cell formed therein is flattened and at the same time, the step difference with the peripheral circuit region is relaxed. In the DRAM, it is not necessary to form the lower electrode 55 to have a particularly height, because a BST film of a high dielectric constant is used as the capacitor insulating film 58. The step difference between the memory cell region and the peripheral circuit region can therefore be relaxed only by the use of SOG film 61. As a result, a complex procedure for removing such step difference is not adopted and the process can be simplified.

Figure 37:
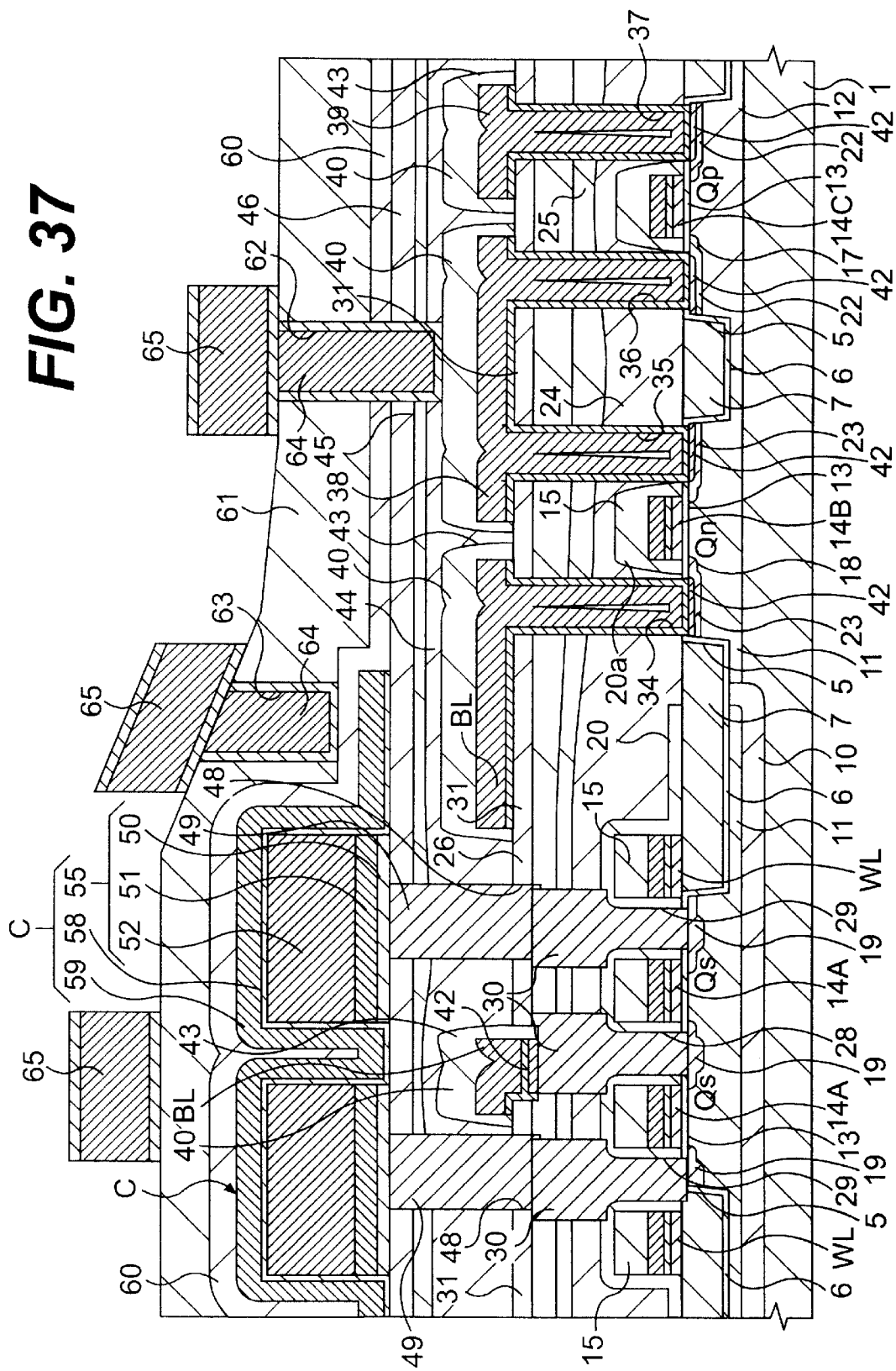
FIG. 37 is a cross-sectional view illustrating one example of the fabrication of the DRAM in the order of steps.

As illustrated in FIG. 37, a through hole 62 is formed by removing the SOG film 61, silicon oxide films 60, 53, silicon oxide film 46, silicon oxide film 45, SOG film 44 and silicon nitride film 40 above the first interconnection 38 of the peripheral circuit by dry etching with a photoresist film as a mask. Similarly, a through hole 63 is formed by removing the film 61 and silicon oxide film 60 above the upper electrode 59. Inside of the through holes 62, 63, plugs 64 are formed, followed by the formation of a second interconnection 65 over the SOG film 61. This plug 64 is formed by depositing a TIN film of about 100 nm thick over the SOG film 61 by sputtering, depositing a W film of about 500 nm thick thereover by CVD and leaving these films inside of the through holes 62, 63 by etch back. The second interconnection 65 is formed by depositing a TiN film of about 50 nm thick, Al (aluminum) film of about 500 nm thick and Ti film of about 50 nm thick on the SOG film 61 by sputtering and then patterning these films by dry etching with a photoresist film as a mask.

A third interconnection layer is then formed through an intrastratum insulation film, followed by depositing thereover a passivation film formed of a silicon oxide film and a silicon nitride film, which is not illustrated. Thus the DRAM is substantially completed.

The third interconnection and a plug to be connected therewith is formed similarly to the case of the second interconnection layer, while the intrastratum insulation film may be formed, for example, of a silicon oxide film of about 300 nm thick, an SOG film of about 400 nm thick and a silicon oxide film of about 300 nm thick. The silicon oxide film may be deposited, for example, by plasma CVD using ozone ($O_3$) and tetraethoxysilane (TEOS) as source gases.

A laminate film of ruthenium and ruthenium dioxide, which has good affinity with a ferro-electric capacitor insulating film such as BST, is used as a material for the lower electrode 55. This laminate is etched under the conditions of a total gas flow of oxygen and chlorine mixed gas as high as 800 sccm and over etching in an amount of 100%, anisotropy of etching is 89 degrees (taper angle) and therefore a steep processing is obtained after etching. A minute pattern with a pattern width and space of 0.13 um may be formed at a high aspect ratio with a pattern height of 0.45 um. This makes it possible to form the pattern of the lower electrode 55 into that required for 1 Gbit DRAM, whereby the 1 Gbit DRAM can be fabricated.

Figure 38:
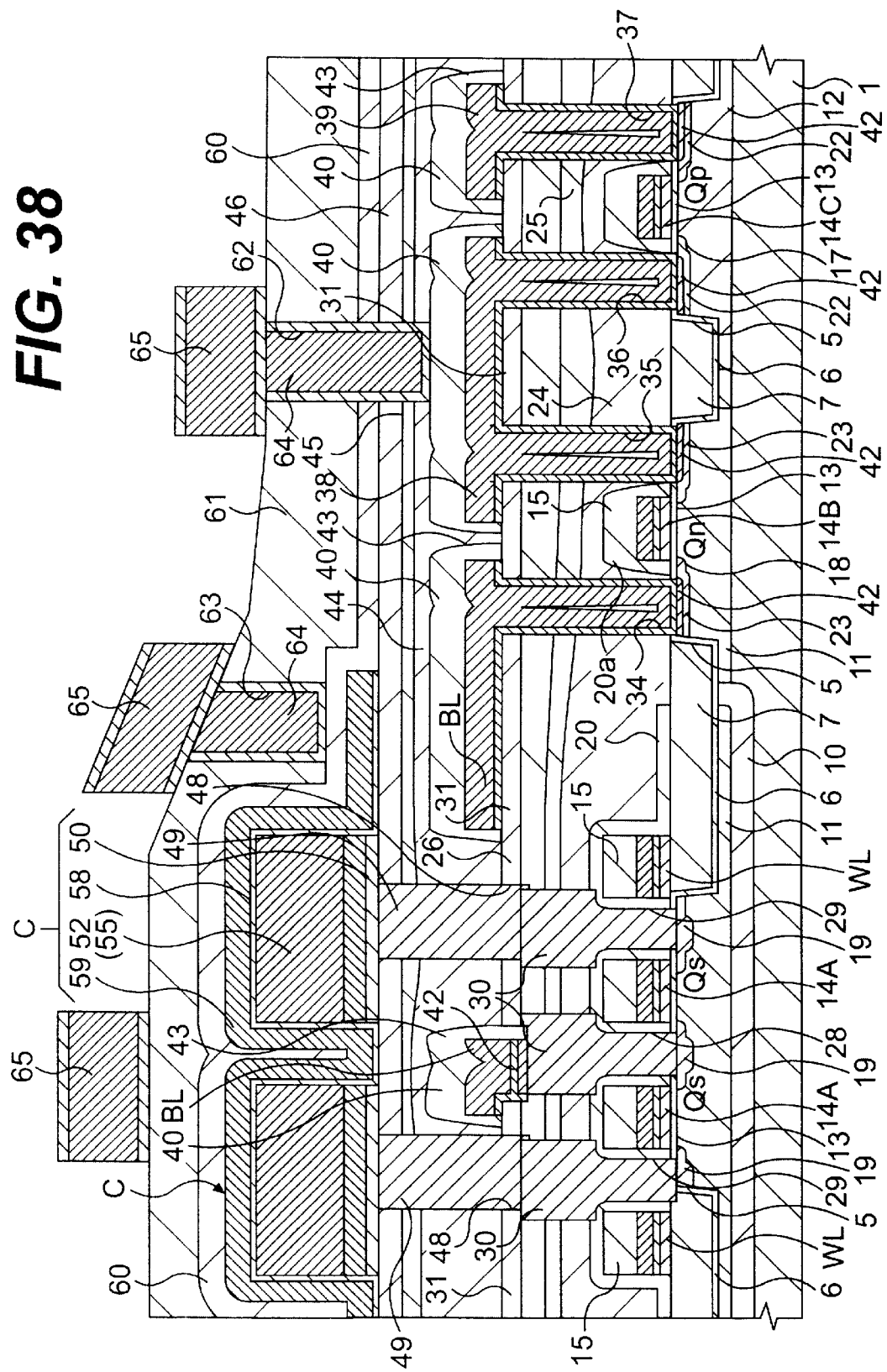
FIG. 38 is a cross-sectional view illustrating another example of the DRAM.
Figure 39:
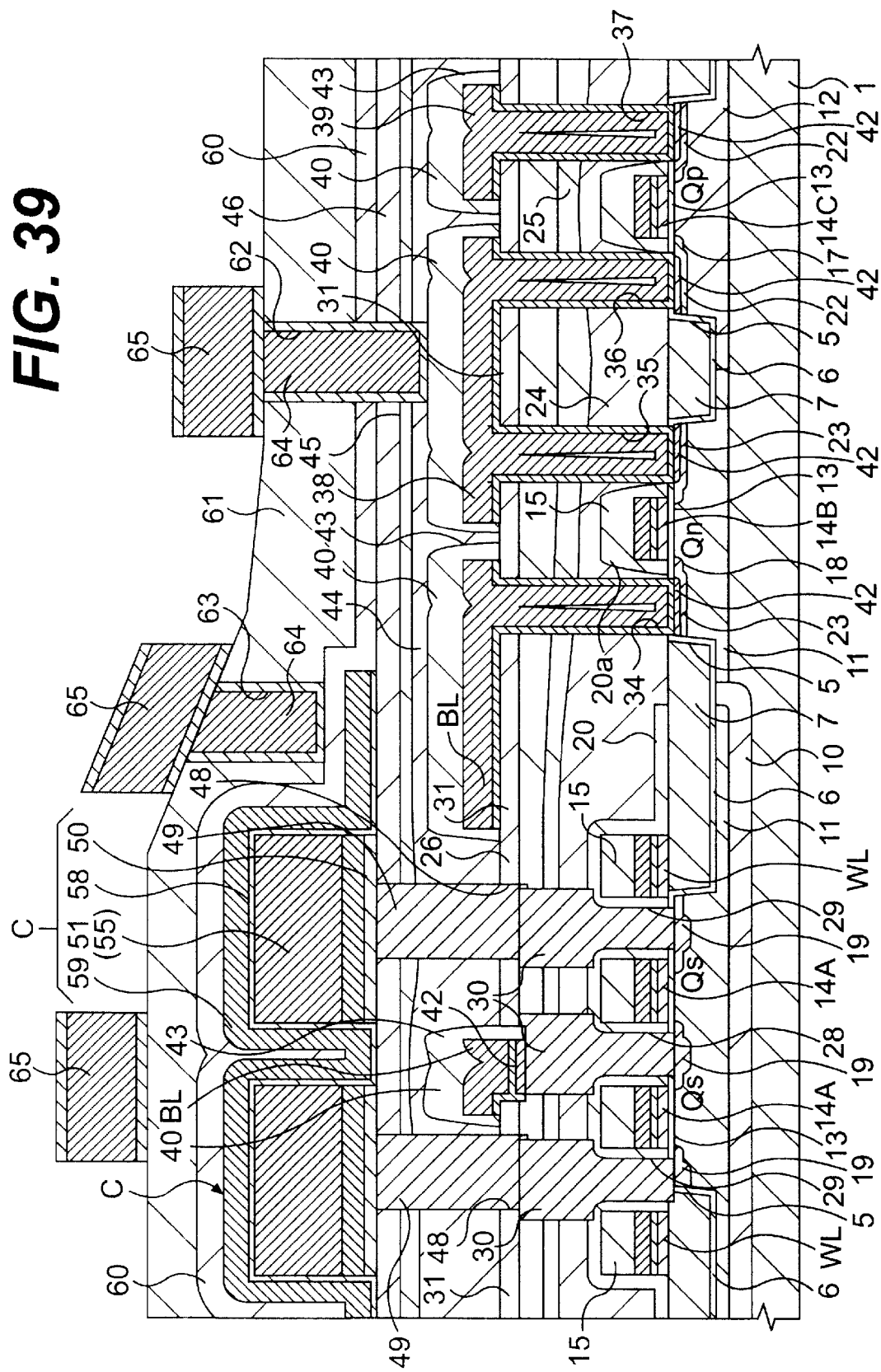
FIG. 39 is a cross-sectional view illustrating another example of the DRAM.

The lower electrode 55 as a laminate film of ruthenium and ruthenium dioxide was described, but as illustrated, in FIG. 38, the lower electrode 55 may be formed solely of the ruthenium dioxide film 52 or may be formed solely of the ruthenium film 51 as illustrated in FIG. 39.

Figure 40:
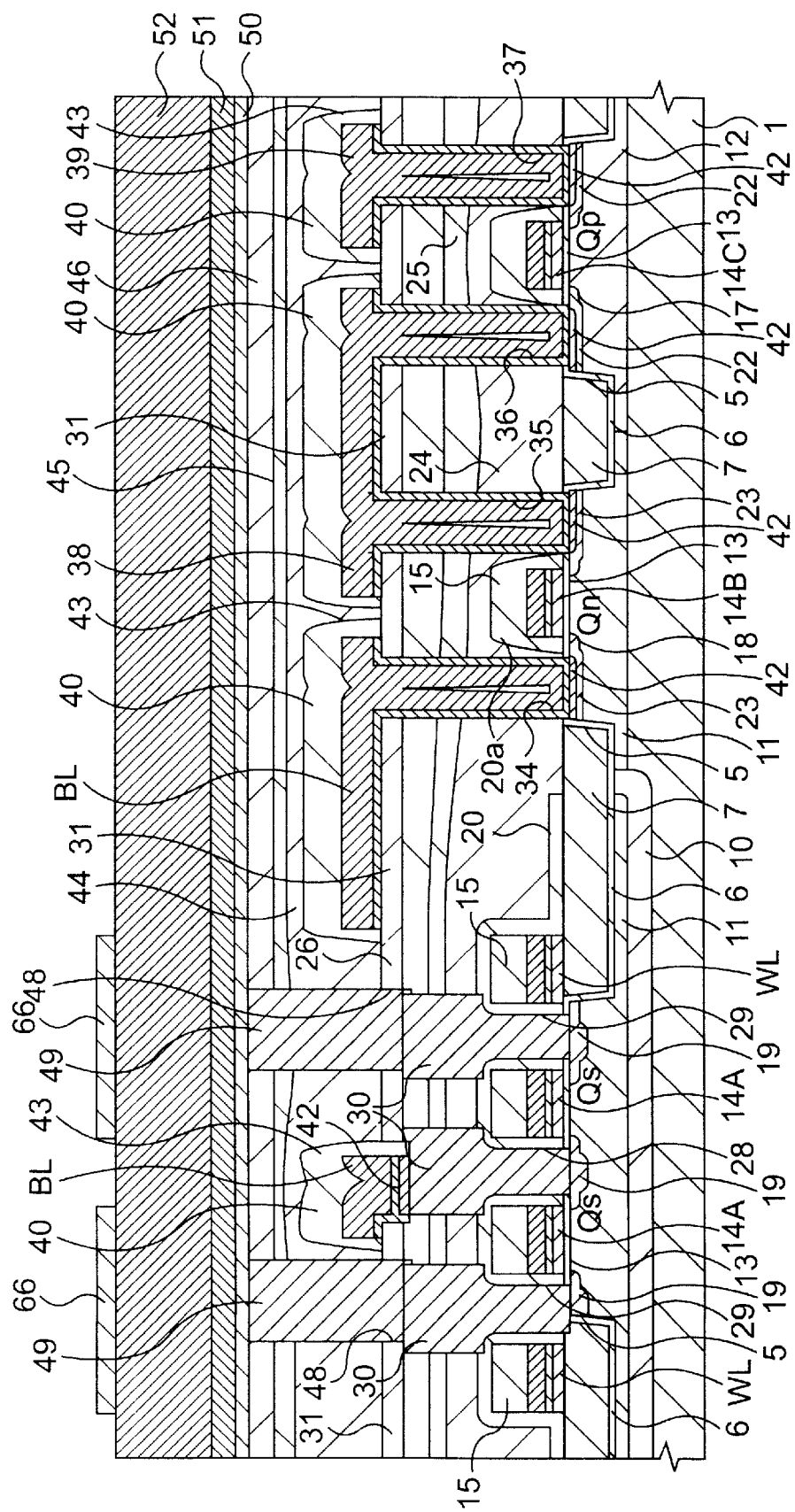
FIG. 40 is a cross-sectional view illustrating one example of the fabrication of the DRAM.
Figure 41:
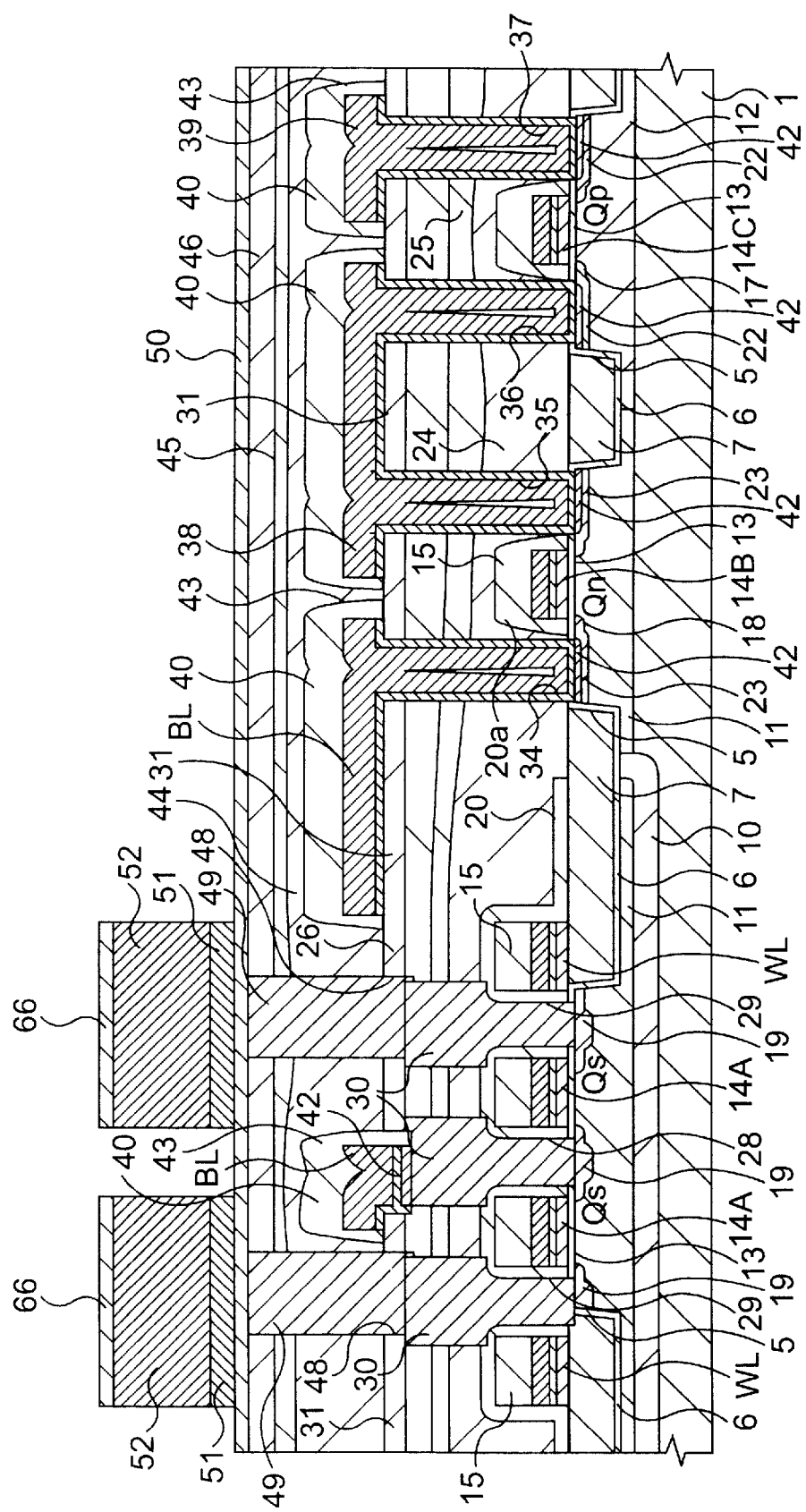
FIG. 41 is a cross-sectional view illustrating one example of the fabrication of the DRAM.
Figure 42F:
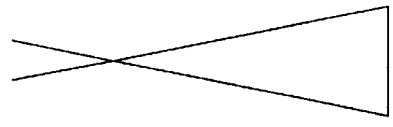
FIG. 42 is a cross-sectional view schematically illustrating the relation between a taper angle and a minute pattern shape.
Figure 42E:
Figure 42D:
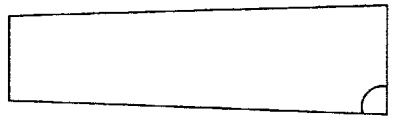
Figure 42C:
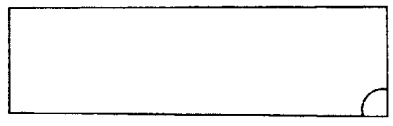
Figure 42B:
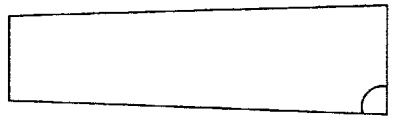
Figure 42A:
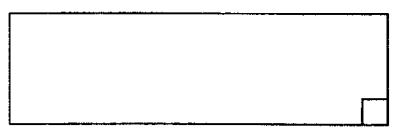

FIG. 40 and FIG. 41 are cross-sectional views, each illustrating one example of a fabrication process of a semiconductor integrated circuit device.

The fabrication process is similar to described up to the description of FIG. 29. In this embodiment, however, as illustrated in FIG. 40, a titanium nitride film 66 is formed instead of the silicon oxide film 53 of Embodiment 2 as an etching mask. Titanium nitride is hardly etched by an oxygen radical so that by the formation of such titanium nitride film. 66 as an etching mask, the thickness of the titanium nitride film 66 can be reduced and the patterning shape of it can be made precise. The titanium nitride film can be deposited by CVD or sputtering and can be patterned as described previously.

Then, with the titanium nitride film 66 as a mask, the ruthenium dioxide film 52 and ruthenium film 51 are etched. This etching is carried out as in Embodiment 2. The titanium nitride film 66 is hardly etched by an oxygen radical but is etched a little by the sputtering or by the action of chlorine or the like during the etching of the. ruthenium dioxide film 52 and ruthenium film 51. The thickness of the titanium nitride film 66 before the etching step may be selected so that the thickness of the titanium nitride film 66 after the etching of the ruthenium dioxide film 52 and ruthenium film 51 will be the same with that of the titanium nitride film 50. When the thickness of the titanium nitride film 50 is 40 nm and that of the titanium nitride film 66 is 50 nm, since the titanium nitride film 66 serving as a mask is etched by about 10 nm in the etching step of the ruthenium dioxide film 52 and ruthenium film 51, the thickness of the titanium nitride film 66 becomes 40 nm, the same with that of the titanium nitride film 50, when etching is completed.

In the etching step of the titanium nitride film 50 that is similar to the step as illustrated in FIG. 31, the titanium nitride film 66 can be removed simultaneously, and a mask removing step (the removing step of the silicon oxide film 53 described above) can therefore be omitted, whereby the step can be simplified.

The invention has been described specifically. It is apparent that the present invention is not limited by this and various changes or modifications can be made without departing from the subject matter.

Application of the etching method to the lower electrode 55 of a DRAM was described, but it can also be applied to the fabrication process of another device, for example, FeRAM.

Etching of ruthenium and ruthenium dioxide was described, however, it is possible to carry out etching of another platinum group member such as iridium (Ir) or iridium oxide ($IrO_2$) in a plasma including mainly oxygen through a hard mask (inorganic mask) of a silicon oxide film.

The titanium nitride films 106, 50 were exemplified as an etching stopper film of ruthenium and ruthenium dioxide. Instead, it is possible to use silicon nitride, a refractory metal (high melting point metal) or nitride thereof or an intermetallic compound of the refractory metal, more specifically, Ti, SiN, W, WN, TiW, Ta, TaN or the like.

The titanium nitride film 66 was exemplified as an etching mask of ruthenium and ruthenium dioxide. Instead, it is possible to use silicon nitride, a refractory metal (high melting point metal) or nitride thereof or an intermetallic compound of the refractory metal, more specifically, Ti, SiN, W, WN, TiW, Ta, TaN or the like.

Among the inventions disclosed by this application, effects available from the representative ones will next be described simply.

(1) Minute etching processing of ruthenium or ruthenium dioxide suited for a ferro-electric and high dielectric film such as BST.

(2) Etching anisotropy of ruthenium or ruthenium oxide is improved and excellent etching anisotropy of even 89 degrees in terms of a taper angle.

(3) A minute lower electrode formed of ruthenium or ruthenium dioxide has the minimum width of 0.13 um and height of 0.45 um and a ferro-electric high dielectric film such as BST is used as a capacitor insulating film, to form a large scaled integrated circuit as large as about 1 Gbit DRAM.

(4) In the DRAM or nonvolatile RAM that uses a Perovskite type high dielectric film or ferro-electric film as a capacitor insulating film, platinum is excellent in the crystallographic alignment with PZT when used as a lower electrode, ruthenium or oxide thereof is excellent in the alignment with BST and iridium is excellent in hydrogen. permeation inhibiting capacity when used as an upper electrode. Thus, they are useful as materials for such memory devices. The etching method of the present invention is therefore particularly suited for this application.

While a preferred embodiment of the present invention has been described in detail, with variations and modifications, further embodiments, variations and modifications are contemplated within the broader aspects of the present invention, in addition to the advantageous details, in accordance with the spirit and scope of the following claims.

What is claimed is:

1. A process for fabrication of a semiconductor integrated circuit device, comprising:
    forming a first film over a principal surface of a semiconductor wafer;
    forming a second film whose byproducts are more adherent to a sidewall upon etching than the first film and includes a platinum group member or an oxide containing a member of the platinum group;
    forming a third film over the second film;
    patterning the third film;
    etching the second film in a presence of the patterned third film, until appearance of the first film, the etching being in a presence of a gas having oxygen ions or oxygen radicals and under a condition of a gas residence time of 10 msec or less; and
    in a gas atmosphere, over etching the second film in an amount of at least 50%;
    wherein the oxygen ions or oxygen radicals are generated by plasma excitation of a mixed gas including a molecular gas containing an oxygen member and an additional gas, in a reduced-pressure atmosphere of from 100 mTorr to 0.1 mTorr.

2. A process of claim 1, wherein the molecular gas is a single molecular gas selected from oxygen (O2), water vapor (H2O), nitrogen monoxide (NO), dinitrogen oxide (N2O), nitrogen dioxide (NO2), ozone (O3), carbon monoxide (CO) or carbon dioxide (CO2), or a mixture thereof.

3. A process of claim 1, wherein the additional gas is a single molecular gas selected from cholorine (Cl$_2$), nitrogen (N$_2$) or carbon tetrafluoride (CF$_4$), or a mixture thereof.

4. A process for fabrication of a semiconductor integrated circuit device, comprising:
    forming a first film over a principal surface of a semiconductor wafer;
    forming a second film whose byproducts are more adherent to a sidewall upon etching than the first film and includes a platinum group member or an oxide containing a member of the platinum group;
    forming a third film over the second film;
    patterning the third film;
    etching the second film in a presence of the patterned third film, until appearance of the first film, the etching being in a presence of a gas having oxygen ions or oxygen radicals and under a condition of a gas residence time of 10 msec or less; and
    in a gas atmosphere, over etching the second film in an amount of at least 50%;
    wherein the second film is a Pt, Ru, RuO2, Ir or IrO2 film or a composite film containing the film as a main component.

5. A process for fabrication of a semiconductor integrated circuit device, comprising:
    forming a first film over a principal surface of a semiconductor wafer;
    forming a second film whose byproducts are more adherent to a sidewall upon etching than the first film and includes a platinum group member or an oxide containing a member of the platinum group;
    forming a third film over the second film;
    patterning the third film;
    etching the second film in a presence of the patterned third film, until appearance of the first film, the etching being in a presence of a gas having oxygen ions or oxygen radicals and under a condition of a gas residence time of 10 msec or less; and
    in a gas atmosphere, over etching the second film in an amount of at least 50%;
    wherein the first film and the third film include substantially the same material.

6. A process for fabrication of a semiconductor integrated circuit device, comprising:
    forming a first film over a principal surface of a semiconductor wafer;
    forming a second film whose byproducts are more adherent to a sidewall upon etching than the first film and includes a platinum group member or an oxide containing a member of the platinum group;
    forming a third film over the second film;
    patterning the third film;
    etching the second film in a presence of the patterned third film, until appearance of the first film, the etching being in a presence of a gas having oxygen ions or oxygen radicals and under a condition of a gas residence time of 10 msec or less; and
    in a gas atmosphere, over etching the second film in an amount of at least 50%;
    wherein the first film serves as an etching stopper.

7. A process for fabrication of a semiconductor integrated circuit device, comprising:
    forming a first film over a principal surface of a semiconductor wafer;
    forming a second film whose byproducts are more adherent to a sidewall upon etching than the first film and includes a platinum group member or an oxide containing a member of the platinum group;
    forming a third film over the second film;
    patterning the third film;
    etching the second film in a presence of the patterned third film, until appearance of the first film, the etching being in a presence of a gas having oxygen ions or oxygen radicals and under a condition of a gas residence time of 10 msec or less; and
    in a gas atmosphere, over etching the second film in an amount of at least 50%;
    wherein the first film and the third film have substantially the same thickness after the over etching.

8. A process for fabrication of a semiconductor integrated circuit device, comprising:
    forming a first film over a principal surface of a semiconductor wafer;
    forming a second film whose byproducts are more adherent to a sidewall upon etching than the first film and includes a platinum group member or an oxide containing a member of the platinum group;
    forming a third film over the second film;
    patterning the third film;
    etching the second film in a presence of the patterned third film, until appearance of the first film, the etching being in a presence of a gas having oxygen ions or oxygen radicals and under a condition of a gas residence time of 10 msec or less; and in a gas atmosphere, over etching the second film in an amount of at least 50%;

including removing the first film and the third film after the over etching.

9. A process for fabrication of a semiconductor integrated circuit device, comprising:

forming a first film over a principal surface of a semiconductor wafer;

forming a second film whose byproducts are more adherent to a sidewall upon etching than the first film and includes a platinum group member or an oxide containing a member of the platinum group;

forming a third film over the second film;

patterning the third film;

etching the second film in a presence of the patterned third film, until appearance of the first film, the etching being in a presence of a gas having oxygen ions or oxygen radicals and under a condition of a gas residence time of 10 msec or less; and in a gas atmosphere, over etching the second film in an amount of at least 50%;

wherein the first film includes TiN, Ti, SiN, W, WN, TiW, Ta or TaN.

10. A process for fabrication of a semiconductor integrated circuit device, comprising:

forming a first film over a principal surface of a semiconductor wafer;

forming a second film whose byproducts are more adherent to a sidewall upon etching than the first film and includes a platinum group member or an oxide containing a member of the platinum group, forming a third film over the second film;

patterning the third film;

etching the second film in a presence of the patterned third film, until appearance of the first film, the etching being in a presence of a gas having oxygen ions or oxygen radicals and under a condition of a gas residence time of 10 msec or less; and in a gas atmosphere, over etching the second film in an amount of at least 80%.

11. A process for fabrication of a semiconductor integrated circuit device, comprising:

forming a first film over a principal surface of a semiconductor wafer;

forming a second film whose byproducts are more adherent to a sidewall upon etching than the first film and that includes a member having a higher etching rate than the first film;

forming a third film over the second film;

patterning the third film;

etching the second film in a presence of the patterned third film until appearance of the first film, the etching being in a presence of a gas having oxygen ions or oxygen radicals, under a condition of a gas residence time of 10 msec or less; and in a gas atmosphere, over etching the second film in an amount of at least 50%;

wherein the oxygen ions or oxygen radicals are generated by plasma excitation of a mixed gas including a molecular gas containing an oxygen member and an additional gas, in a reduced-pressure atmosphere of from 100 mTorr to 0.1 mTorr.

12. A process of claim 11, wherein the molecular gas is a single molecular gas selected from oxygen ($O_2$), water vapor ($H_2O$), nitrogen monoxide (NO), dinitrogen oxide ($N_2O$)), nitrogen dioxide ($NO_2$), ozone ($O_3$), carbon monoxide (CO) or carbon dioxide ($CO_2$), or a mixture thereof.

13. A process of claim 11, wherein the additional gas is a single molecular gas selected from cholorine ($Cl_2$), nitrogen ($N_2$) or carbon tetrafluoride ($CF_4$), or a mixture thereof.

14. A process for fabrication of a semiconductor integrated circuit device, comprising:

forming a first film over a principal surface of a semiconductor wafer;

forming a second film whose byproducts are more adherent to a sidewall upon etching than the first film and that includes a member having a higher etching rate than the first film;

forming a third film over the second film;

patterning the third film;

etching the second film in a presence of the patterned third film until appearance of the first film, the etching being in a presence of a gas having oxygen ions or oxygen radicals, under a condition of a gas residence time of 10 msec or less; and in a gas atmosphere, over etching the second film in an amount of at least 50%;

wherein the second film is a Pt, Ru, $RuO_2$, Tr or $IrO_2$ film or a composite film containing the film as a main component.

15. A process for fabrication of a semiconductor integrated circuit device, comprising;

forming a first film over a principal surface of a semiconductor wafer;

forming a second film whose byproducts are more adherent to a sidewall upon etching than the first film and that includes a member having a higher etching rate than the first film;

forming a third film over the second film;

patterning the third film;

etching the second film in a presence of the patterned third film until appearance of the first film, the etching being in a presence of a gas having oxygen ions or oxygen radicals, under a condition of a gas residence time of 10 msec or less; and in a gas atmosphere, over etching the second film in an amount of at least 50%;

wherein the first film and the third film include substantially the same material.

16. A process for fabrication of a semiconductor integrated circuit device, comprising:

forming a first film over a principal surface of a semiconductor wafer;

forming a second film whose byproducts are more adherent to a sidewall upon etching than the first film and that includes a member having a higher etching rate than the first film;

forming a third film over the second film;

patterning the third film;

etching the second film in a presence of the patterned third film until appearance of the first film, the etching being in a presence of a gas having oxygen ions or oxygen radicals, under a condition of a gas residence time of 10 msec or less; and in a gas atmosphere, over etching the second film in an amount of at least 50%;

wherein the first film serves as an etching stopper.

17. A process for fabrication of a semiconductor integrated circuit device, comprising;

forming a first film over a principal surface of a semiconductor wafer;

forming a second film whose byproducts are more adherent to a sidewall upon etching than the first film and that includes a member having a higher etching rate than the first film;

forming a third film over the second film;

patterning the third film;

etching the second film in a presence of the patterned third film until appearance of the first film, the etching being in a presence of a gas having oxygen ions or oxygen radicals, under a condition of a gas residence time of 10 msec or less; and in a gas atmosphere, over etching the second film in an amount of at least 50%;

wherein the first film and the third film have substantially the same thickness after the over etching.

18. A process for fabrication of a semiconductor integrated circuit device, comprising:

forming a first film over a principal surface of a semiconductor wafer;

forming a second film whose byproducts are more adherent to a sidewall upon etching than the first film and that includes a member having a higher etching rate than the first film;

forming a third film over the second film;

patterning the third film;

etching the second film in a presence of the patterned third film until appearance of the first film, the etching being in a presence of a gas having oxygen ions or oxygen radicals, under a condition of a gas residence time of 10 msec or less;

in a gas atmosphere, over etching the second film in an amount of at least 50%; and removing the first film and the third film after the over etching.

19. A process for fabrication of a semiconductor integrated circuit device, comprising:

forming a first film over a principal surface of a semiconductor wafer;

forming a second film whose byproducts are more adherent to a sidewall upon etching than the first film and that includes a member having a higher etching rate than the first film;

forming a third film over the second film;

patterning the third film;

etching the second film in a presence of the patterned third film until appearance of the first film, the etching being in a presence of a gas having oxygen ions or oxygen radicals, under a condition of a gas residence time of 10 msec or less; and in a gas atmosphere over etching the second film in an amount of at least 50%;

wherein the first film includes TiN, Ti, SiN, W, WN, TiW, Ta or TaN.

20. A process for fabrication of a semiconductor integrated circuit device, comprising:

forming a first film over a principal surface of a semiconductor wafer;

forming a second film whose byproducts are more adherent to a sidewall upon etching than the first film and that includes a member having a higher etching rate than the first film;

forming a third film over the second film;

patterning the third film;

etching the second film in a presence of the patterned third film until appearance of the first film, the etching being in a presence of a gas having oxygen ions or oxygen radicals, under a condition of a gas residence time of 10 msec or less; and in a gas atmosphere, over etching the second film in an amount of at least 80%.

* * * * *